(12) United States Patent
Hasegawa et al.

(10) Patent No.: US 12,133,399 B2
(45) Date of Patent: Oct. 29, 2024

(54) IMAGING ELEMENT AND IMAGING DEVICE

(71) Applicants: Sony Group Corporation, Tokyo (JP); Sony Semiconductor Solutions Corporation, Kanagawa (JP)

(72) Inventors: Yuta Hasegawa, Tokyo (JP); Yosuke Saito, Tokyo (JP); Yuki Negishi, Tokyo (JP)

(73) Assignees: SONY GROUP CORPORATION, Tokyo (JP); SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 6 days.

(21) Appl. No.: 17/631,119

(22) PCT Filed: Jul. 21, 2020

(86) PCT No.: PCT/JP2020/028320
§ 371 (c)(1),
(2) Date: Jan. 28, 2022

(87) PCT Pub. No.: WO2021/020246
PCT Pub. Date: Feb. 4, 2021

(65) Prior Publication Data
US 2022/0285443 A1    Sep. 8, 2022

(30) Foreign Application Priority Data
Jul. 30, 2019   (JP) .................... 2019-139917

(51) Int. Cl.
*H10K 85/30*     (2023.01)
*H10K 30/00*     (2023.01)
*H10K 39/32*     (2023.01)

(52) U.S. Cl.
CPC ............ *H10K 39/32* (2023.02); *H10K 30/00* (2023.02); *H10K 85/322* (2023.02); *H10K 85/381* (2023.02)

(58) Field of Classification Search
CPC ...... H10K 39/32; H10K 30/00; H10K 85/322; H10K 85/381
(Continued)

(56) References Cited

U.S. PATENT DOCUMENTS 7,129,466 B2   10/2006   Iwasaki
7,863,605 B2    1/2011   Hayashi
(Continued)

FOREIGN PATENT DOCUMENTS

CN    102712651 A    10/2012
CN    104425534 A     3/2015
(Continued)

OTHER PUBLICATIONS

Gomez-Infante et al., "Synthesis, properties and functionalization of Nonsymmetric 8-MethylthioBODIPYs", Eur. J. Org. Chem, 2016, pp. 5009-5023 (Year: 2016).*

(Continued)

*Primary Examiner* — Ruiyun Zhang
(74) *Attorney, Agent, or Firm* — K&L Gates LLP

(57) ABSTRACT

An imaging element according to an embodiment of the present disclosure includes: a first electrode; a second electrode that is disposed to be opposed to the first electrode; and an organic layer that is provided between the first electrode and the second electrode. The organic layer includes a compound represented by a general formula (1).

17 Claims, 24 Drawing Sheets

(58) Field of Classification Search
USPC .......................................... 428/1.6, 690, 917
See application file for complete search history.

(56) References Cited

U.S. PATENT DOCUMENTS

| | | | |
|---|---|---|---|
| 9,017,826 B2 | 4/2015 | Forrest et al. | |
| 9,113,535 B2 | 8/2015 | Thompson et al. | |
| 9,819,887 B2 | 11/2017 | Fukuhara | |
| 9,842,884 B2 | 12/2017 | Umehara et al. | |
| 10,855,941 B2 | 12/2020 | Kawai | |
| 2015/0303378 A1* | 10/2015 | Han | H10K 39/32 548/405 |
| 2016/0351810 A1* | 12/2016 | Umehara | H10K 30/88 |
| 2018/0111952 A1 | 4/2018 | Han | |

FOREIGN PATENT DOCUMENTS

| | | |
|---|---|---|
| CN | 105960714 A | 9/2016 |
| CN | 109417085 A | 3/2019 |
| JP | 2003332551 A | 11/2003 |
| JP | 2009049278 A | 3/2009 |
| JP | 2013503181 A | 1/2013 |
| JP | 2013532168 A | 8/2013 |
| JP | 2015050446 A | 3/2015 |
| TW | 201829427 A | 8/2018 |
| WO | 2015119039 A1 | 8/2015 |
| WO | 2018105334 A1 | 6/2018 |
| WO | WO-2021149510 A1 * | 7/2021 |

OTHER PUBLICATIONS

International Search Report mailed Oct. 6, 2020 in connection with PCT/JP2020/028320.

Gao, Hu et al.; "A near-infrared benzoquinone-coupled BODIPY: Synthesis, spectroscopic and electrochemical properties"; Journal of Porphyrins and Phthalocyanines; Jan. 9, 2019, vol. 23, pp. 76-83; Scheme I., Fig.3.

Mane, Sandeep B. et al.; "Oxasmaragdyrins as New and Efficient Hole-Transporting Materials for High-Performance Perovskite Solar Cells"; Applied Materials & Interfaces; Aug. 29, 2017, vol. 9, pp. 31950-31958; Scheme I., Figure 1.

* cited by examiner

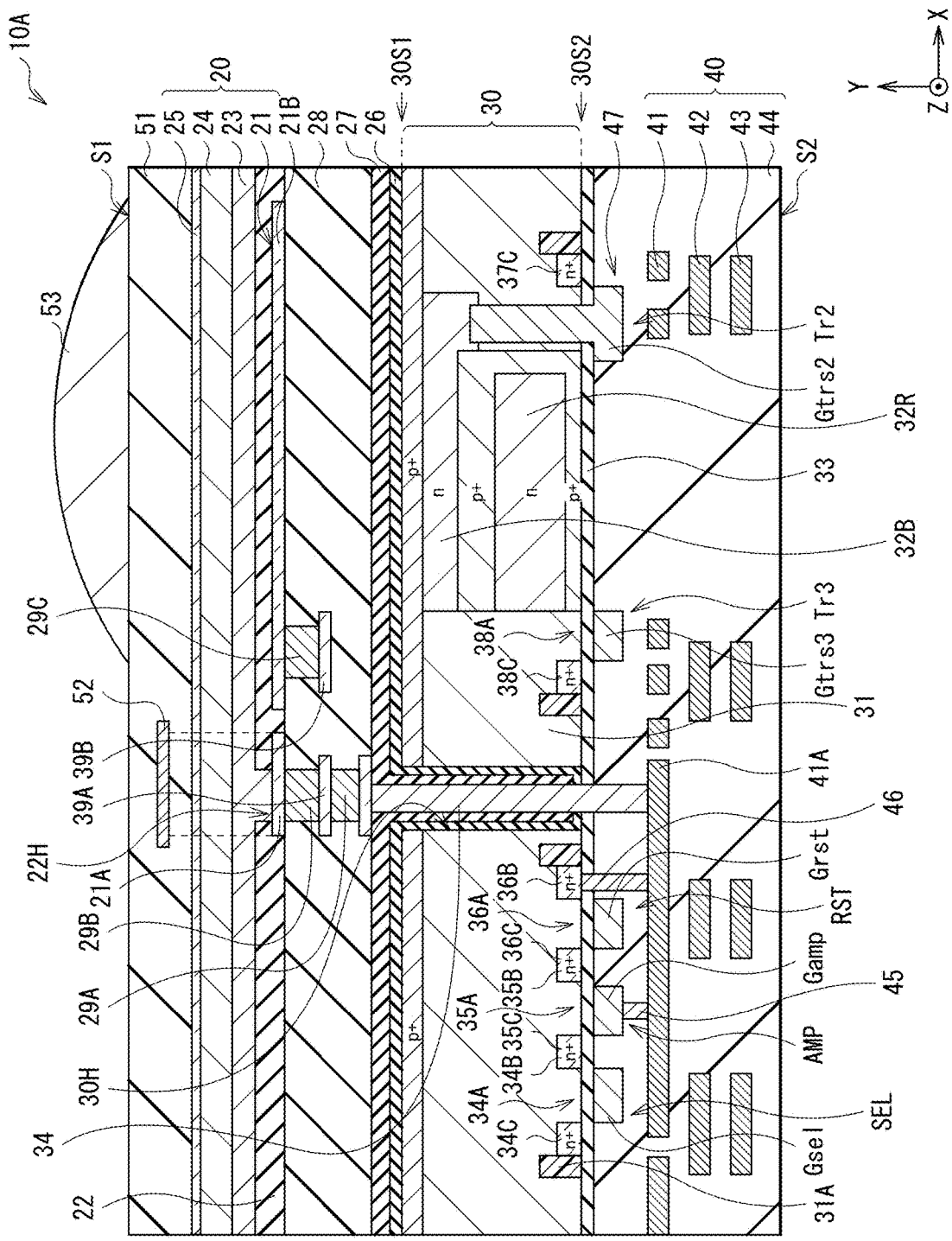

[ FIG. 2 ]
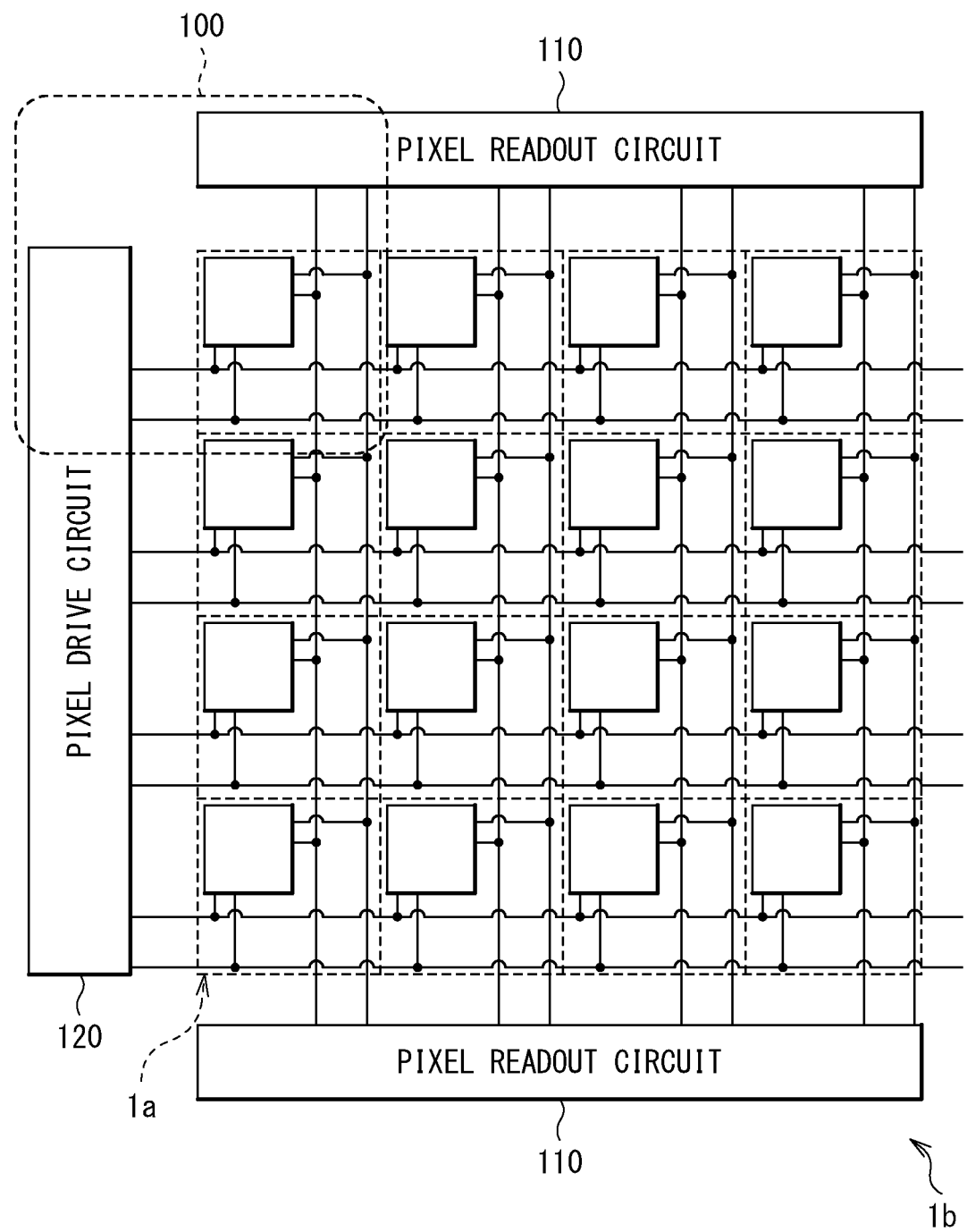

[FIG. 3]
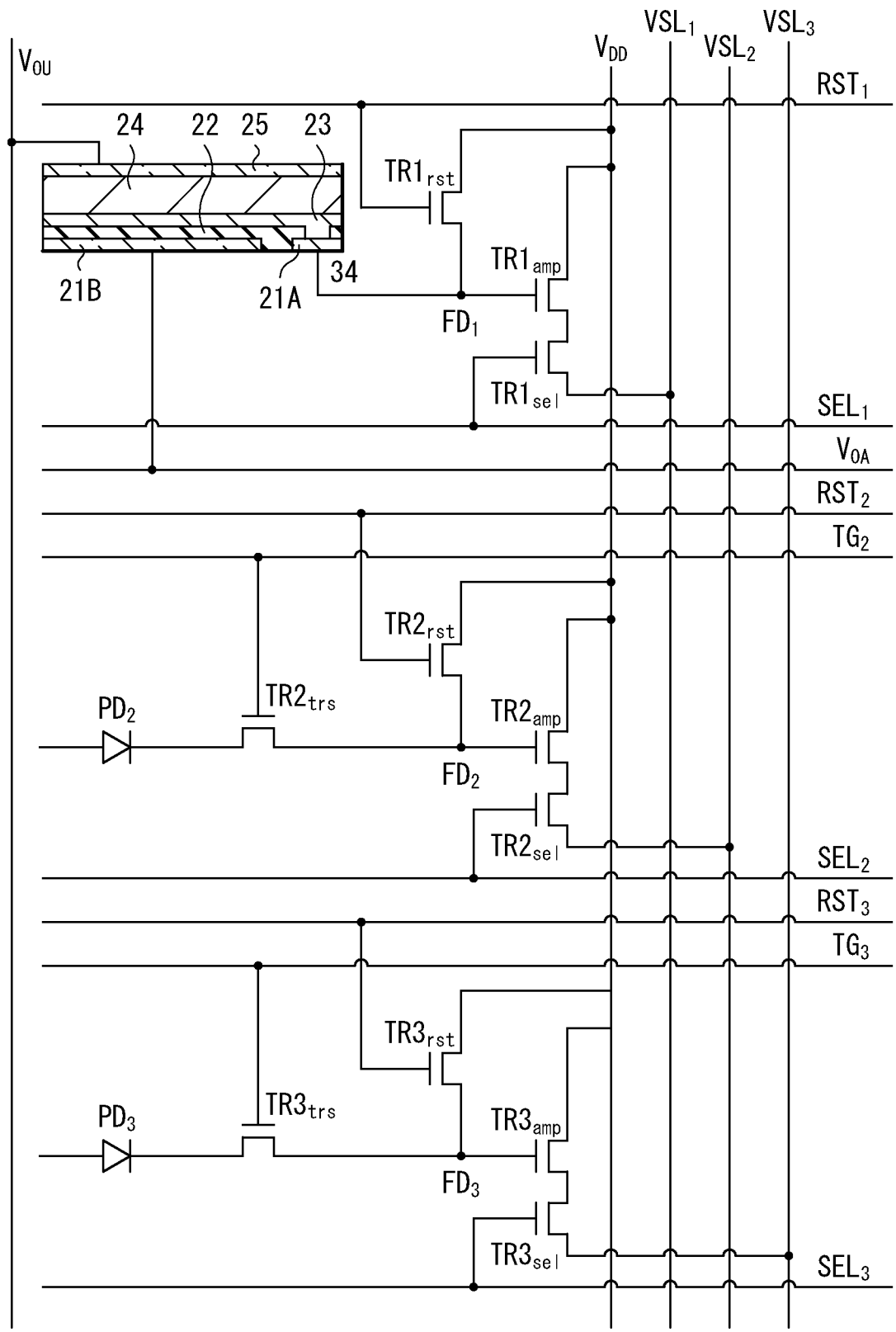

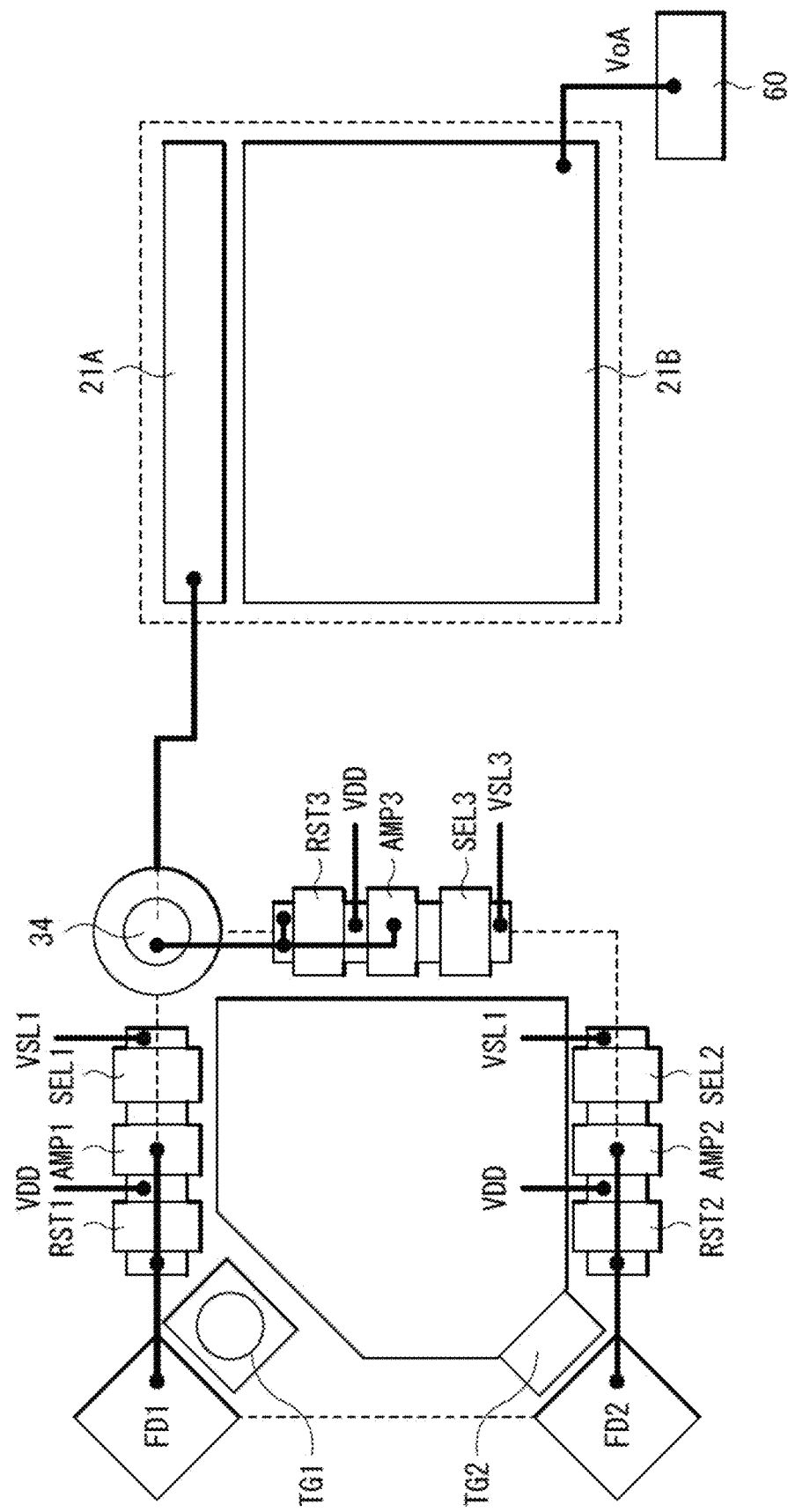

[FIG. 5]
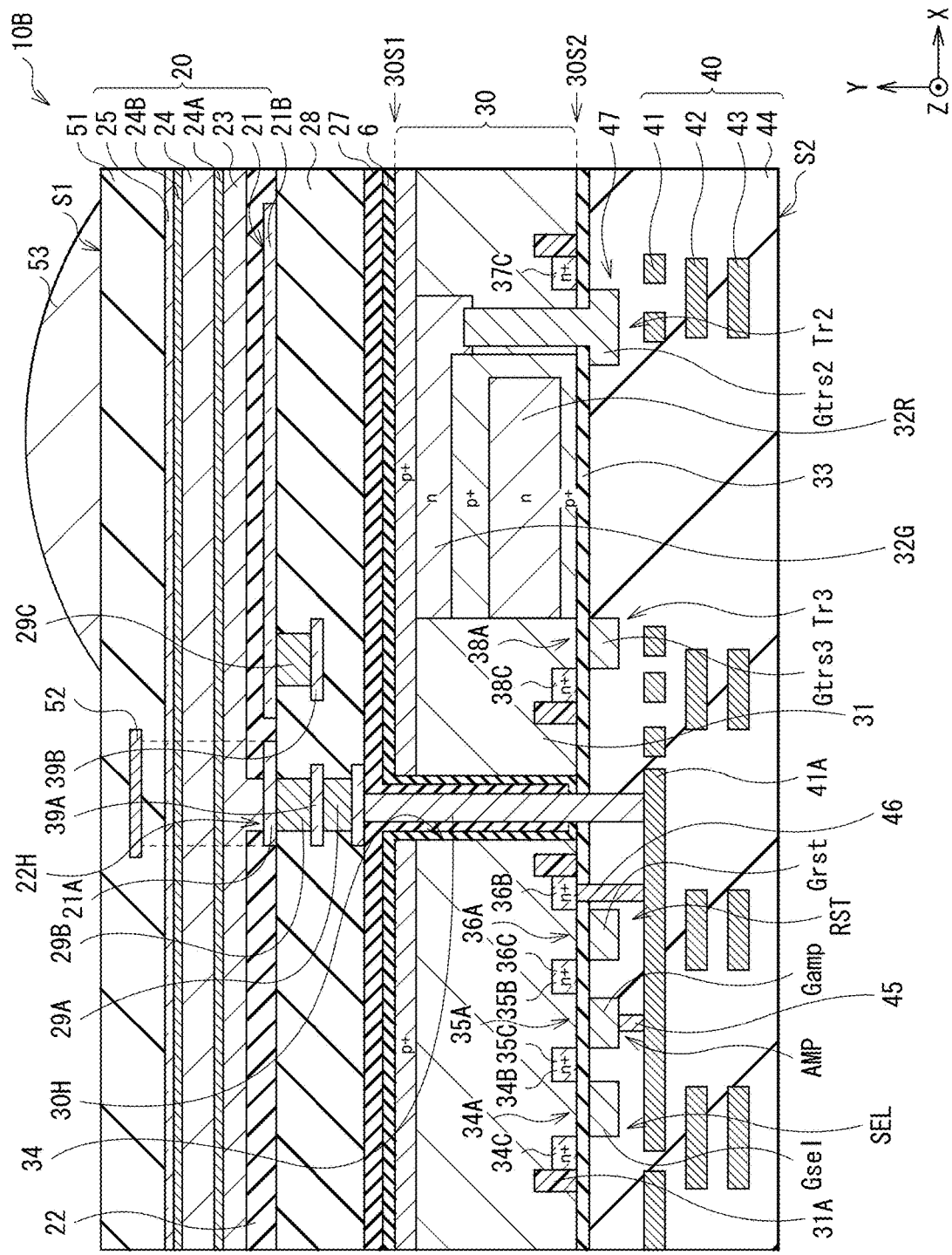

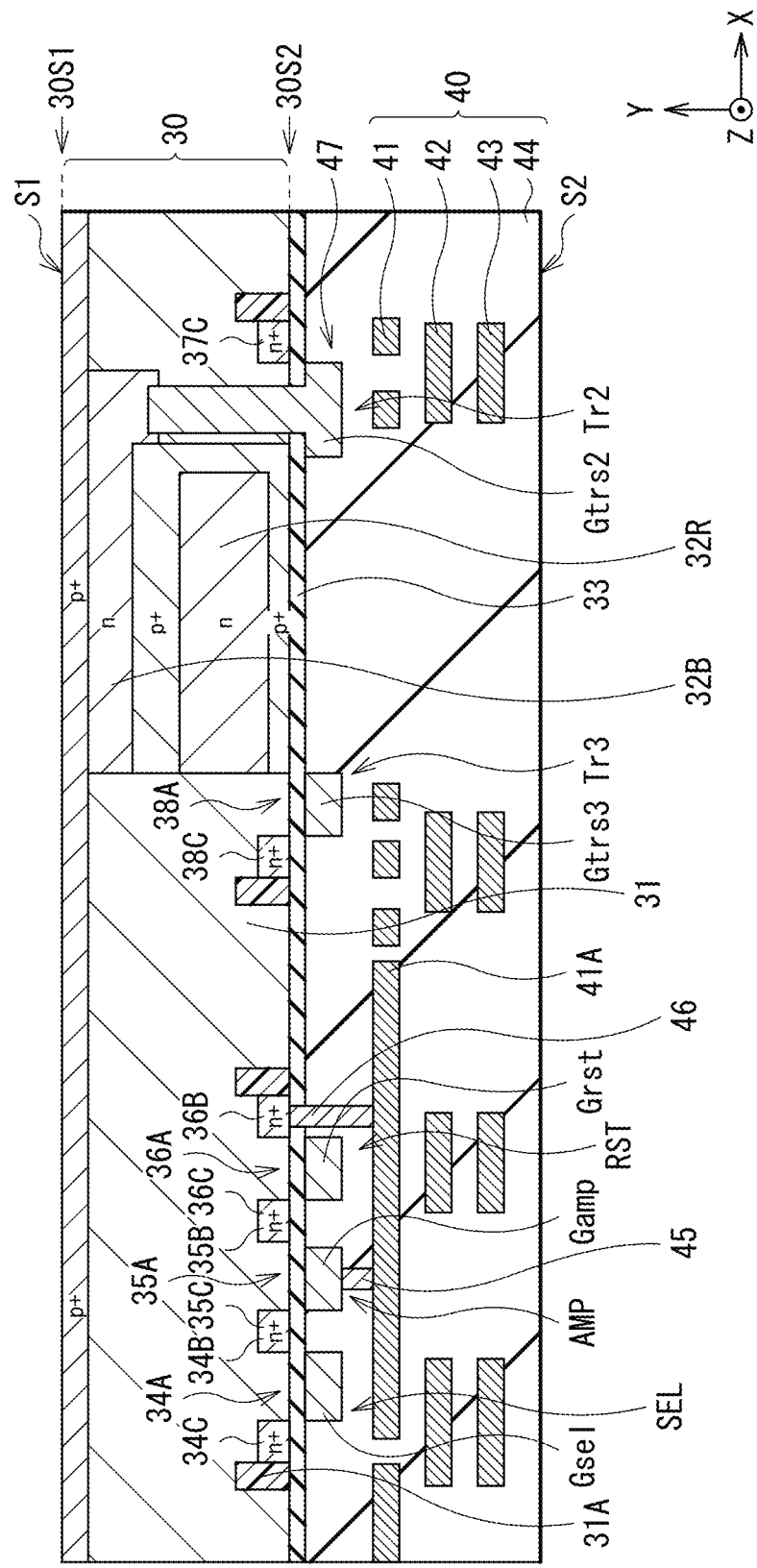

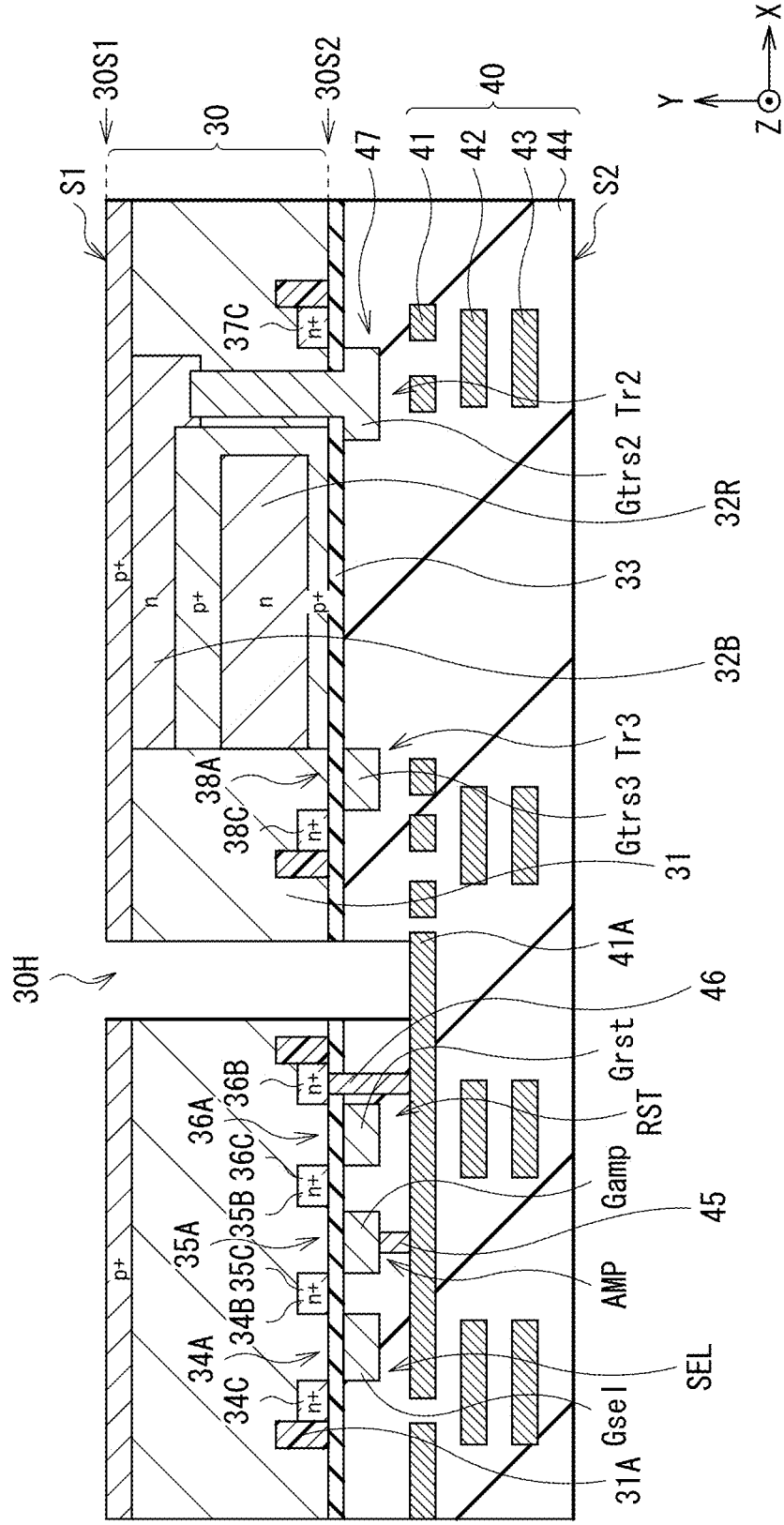

[FIG. 8]
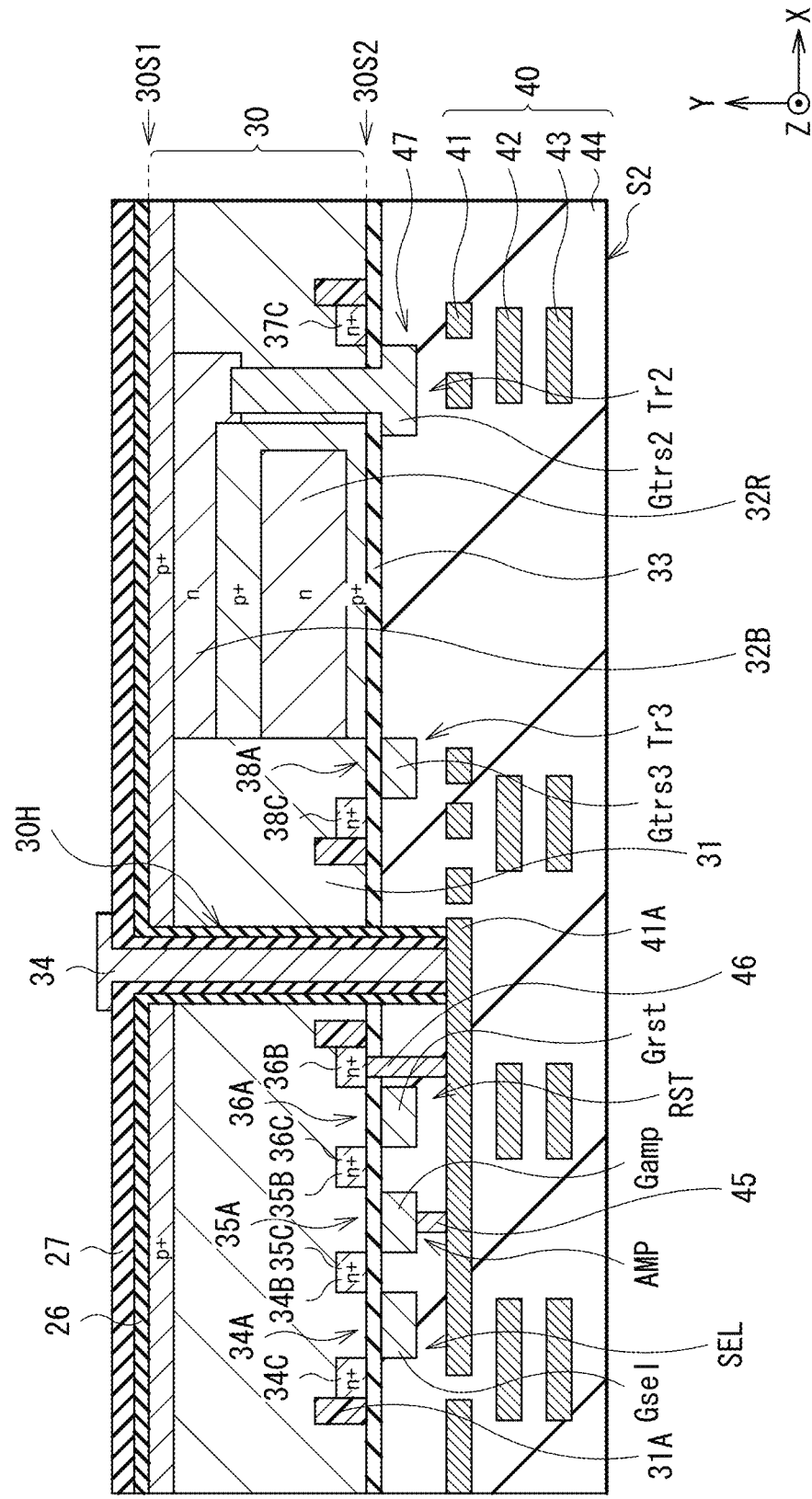

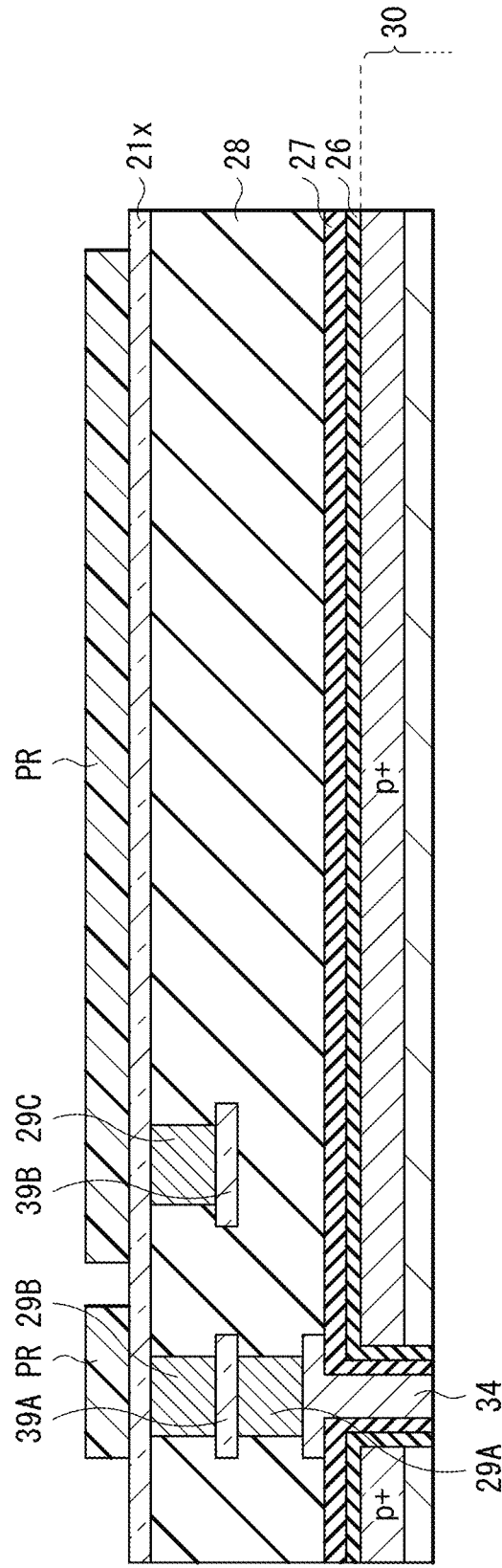

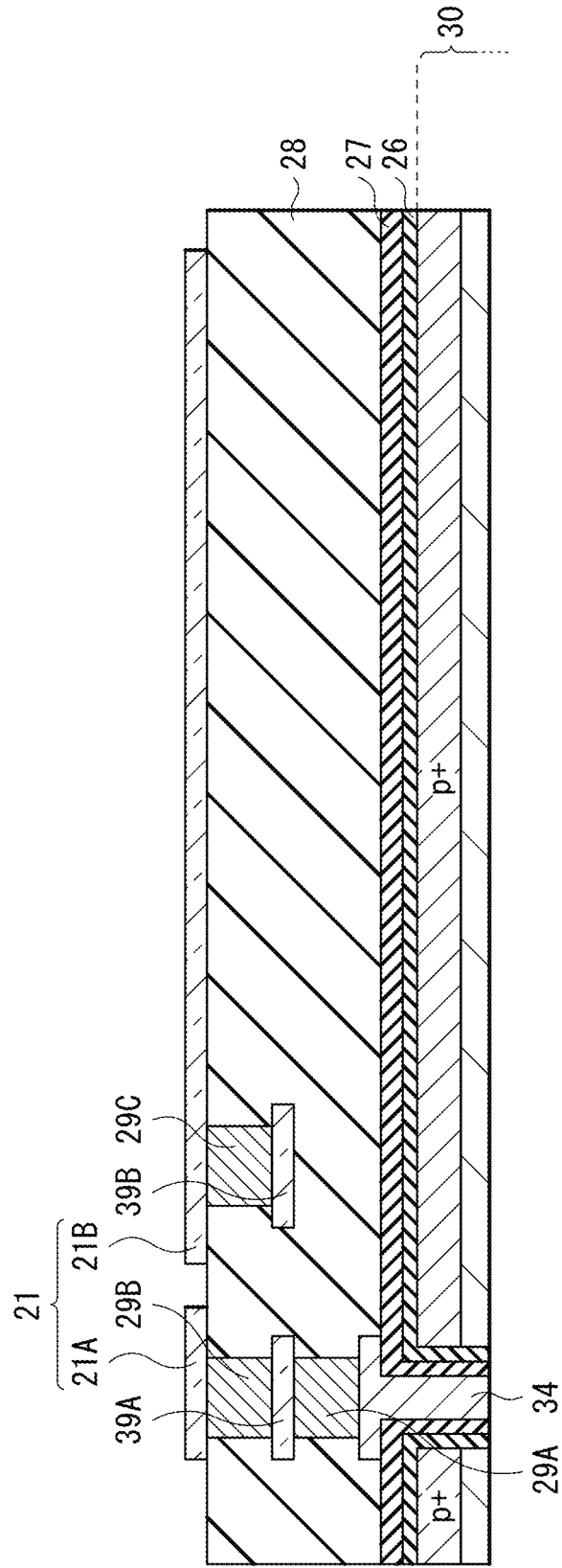
[FIG. 10]

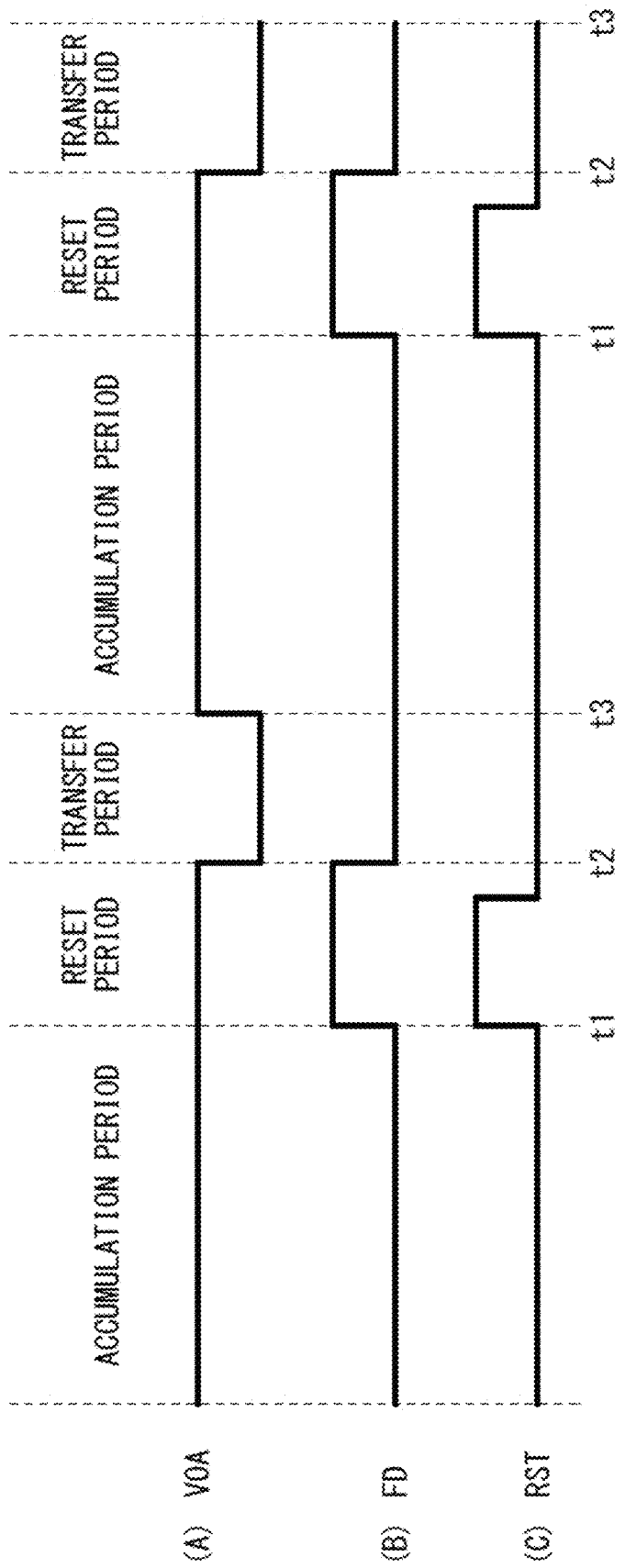

[FIG. 12]
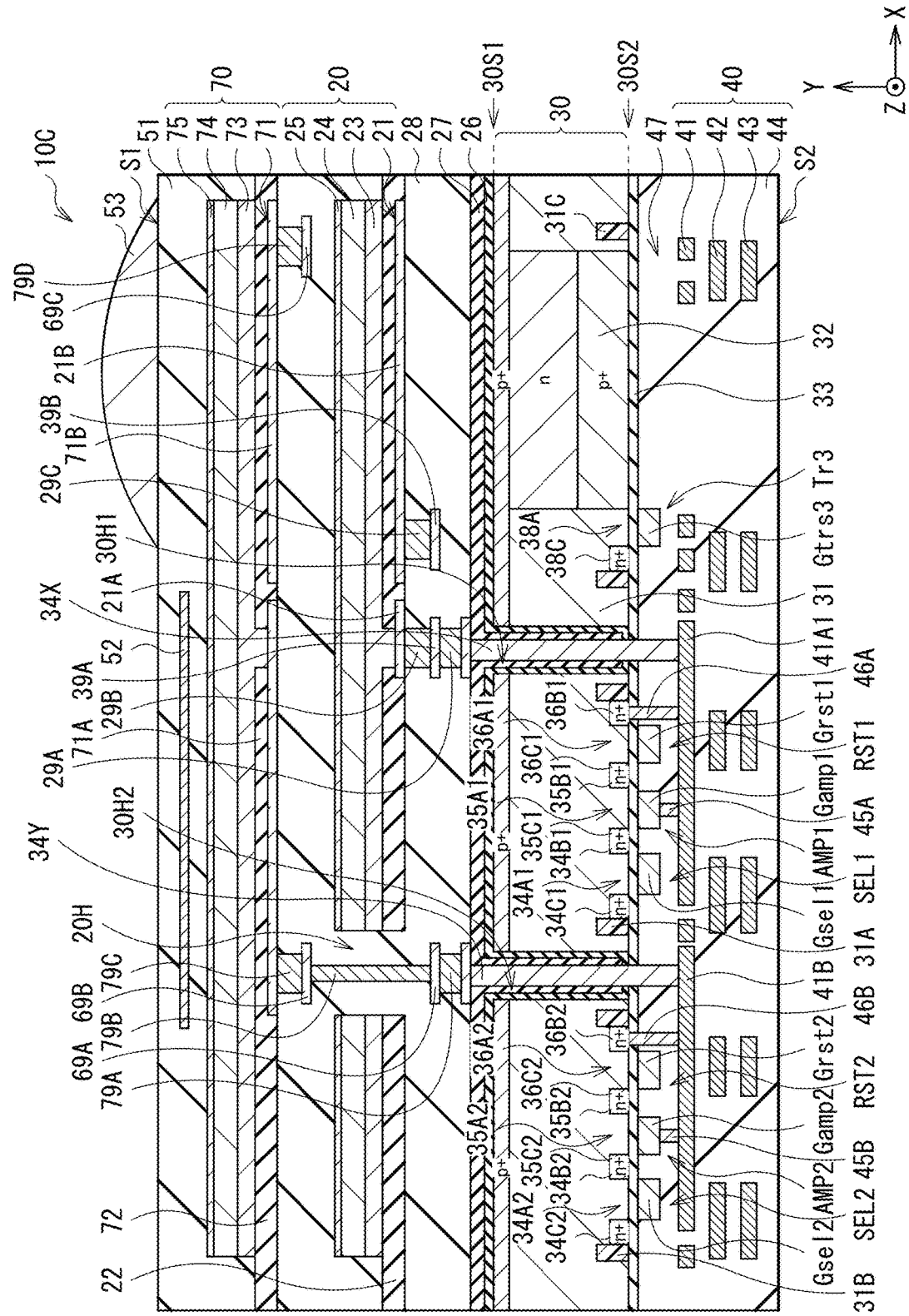

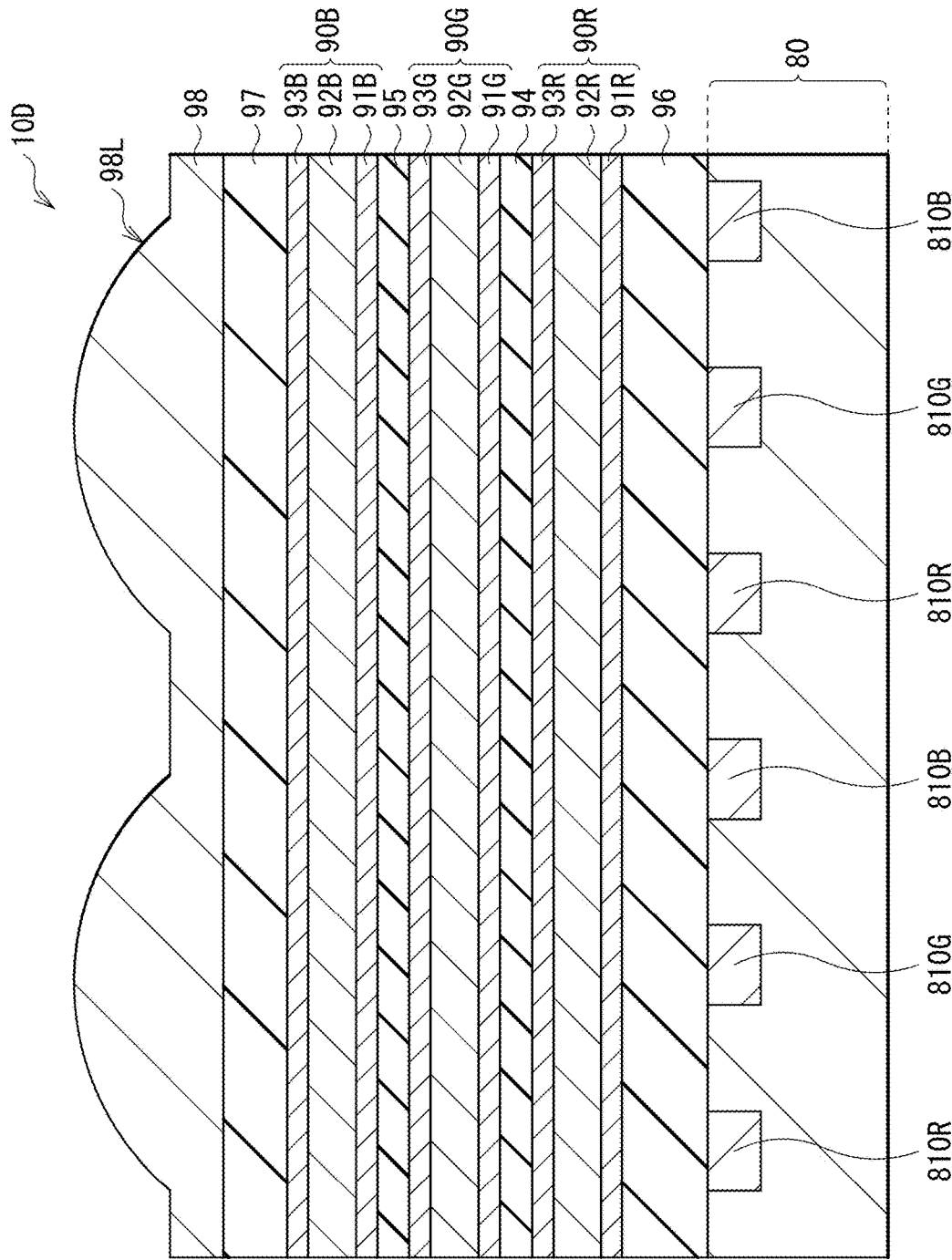
[FIG. 13]

[ FIG. 14 ]
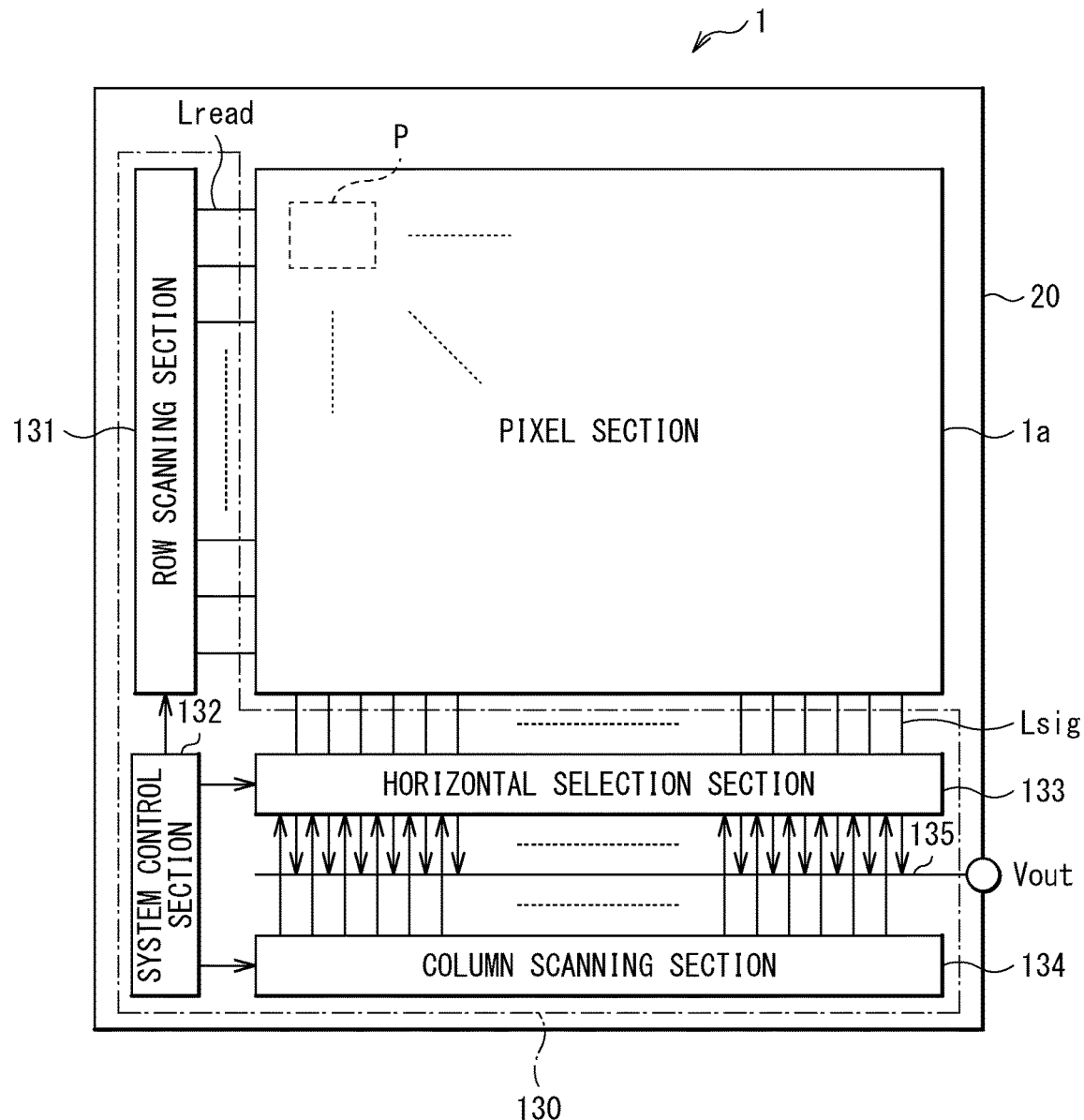

[ FIG. 15 ]
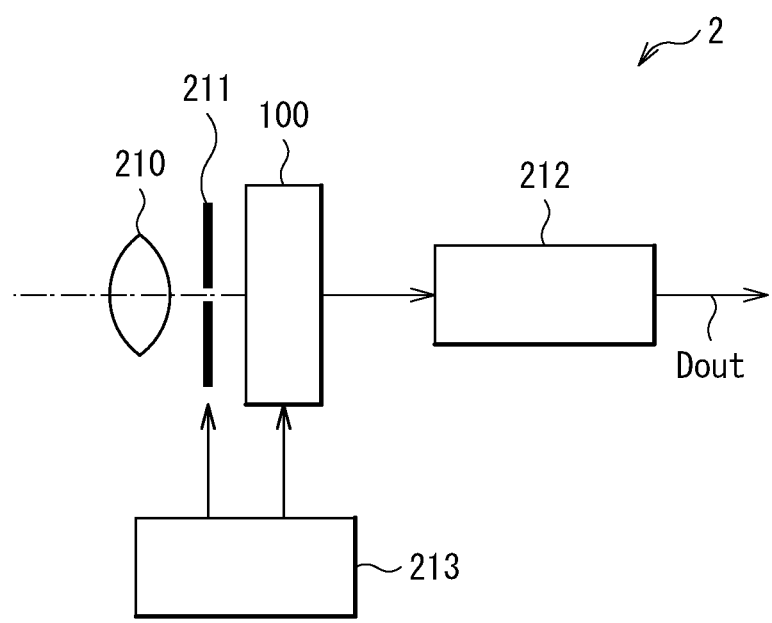

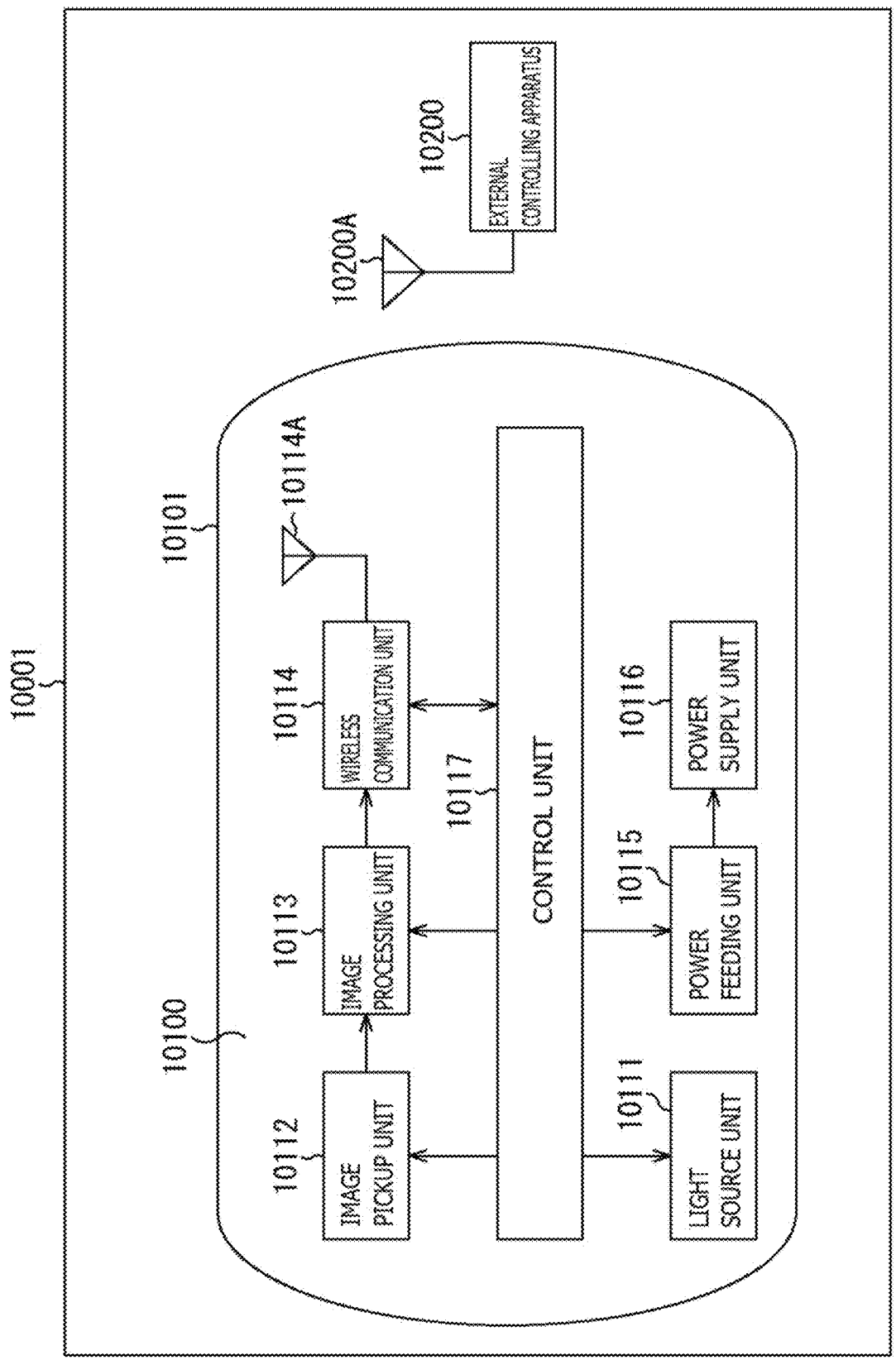
[FIG. 16]

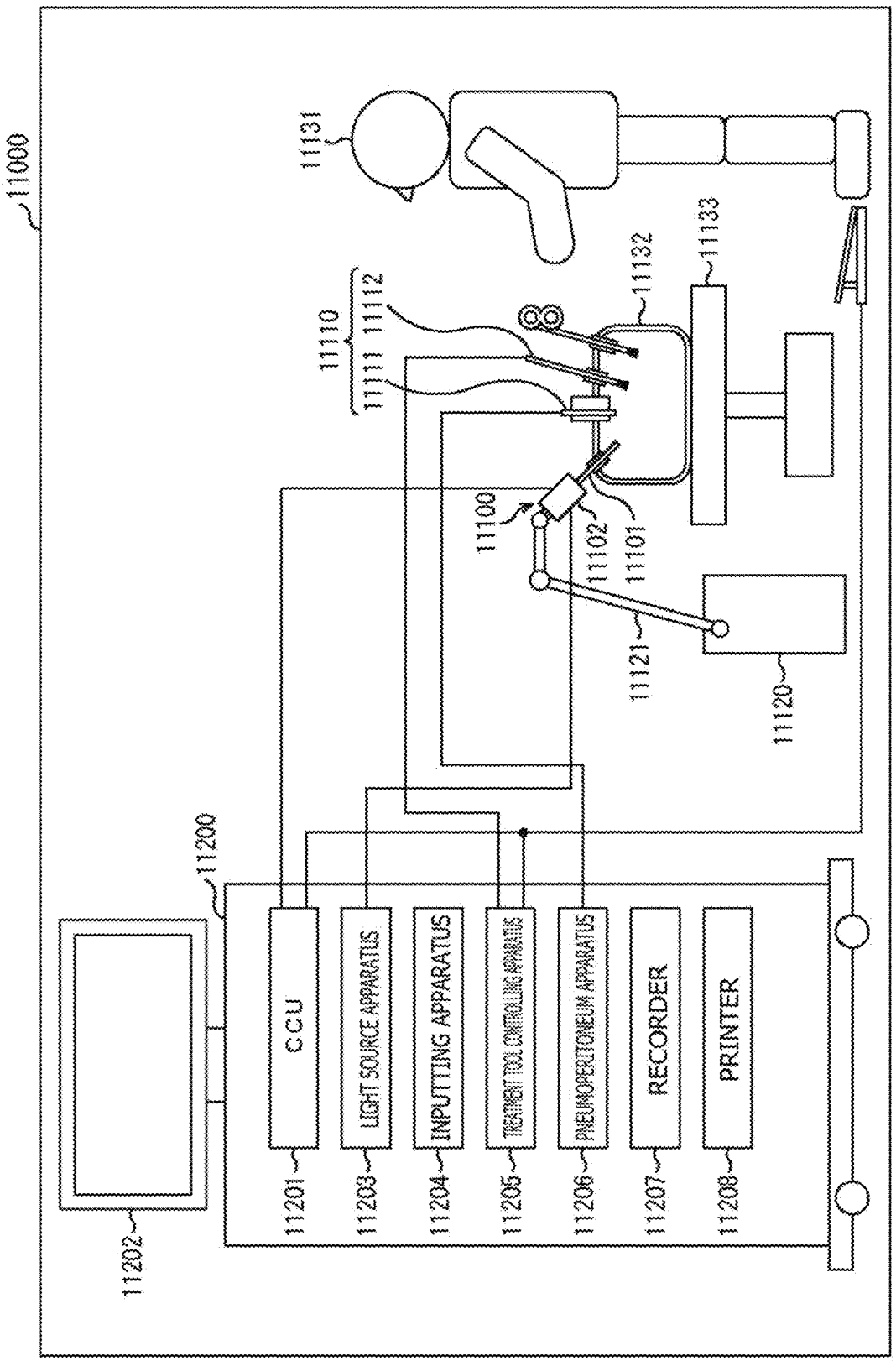

[ FIG. 18 ]
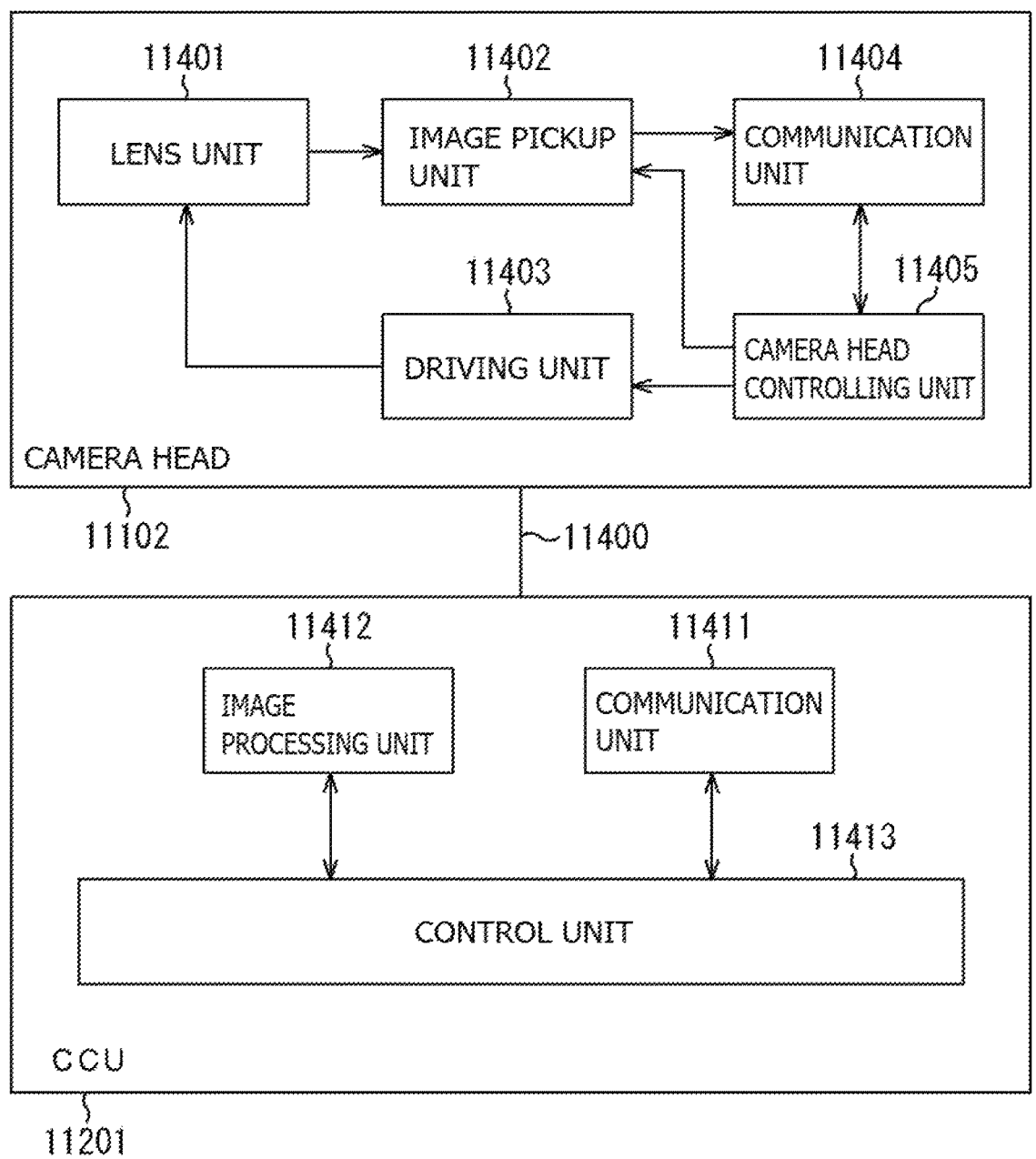

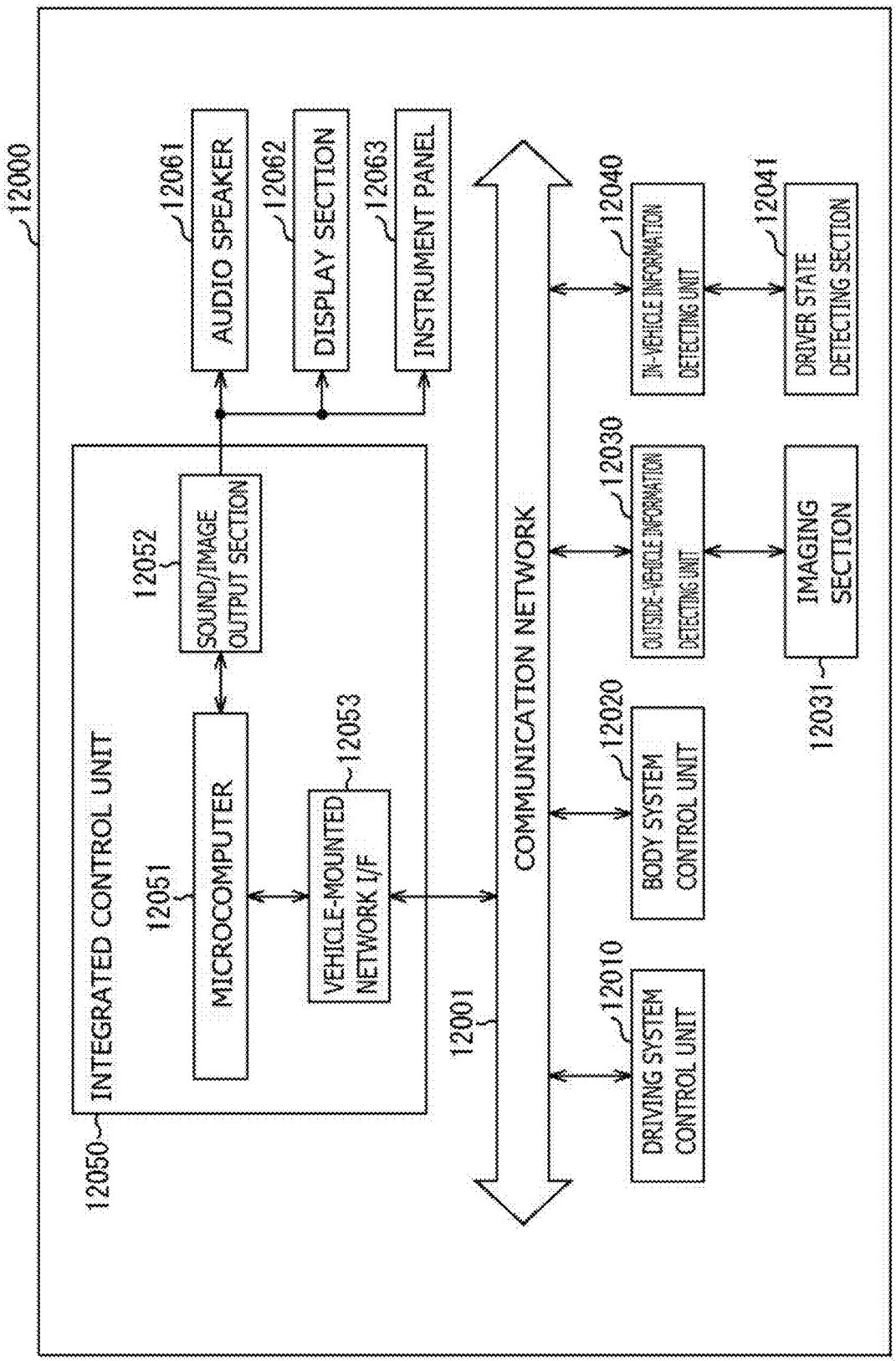

[ FIG. 20 ]
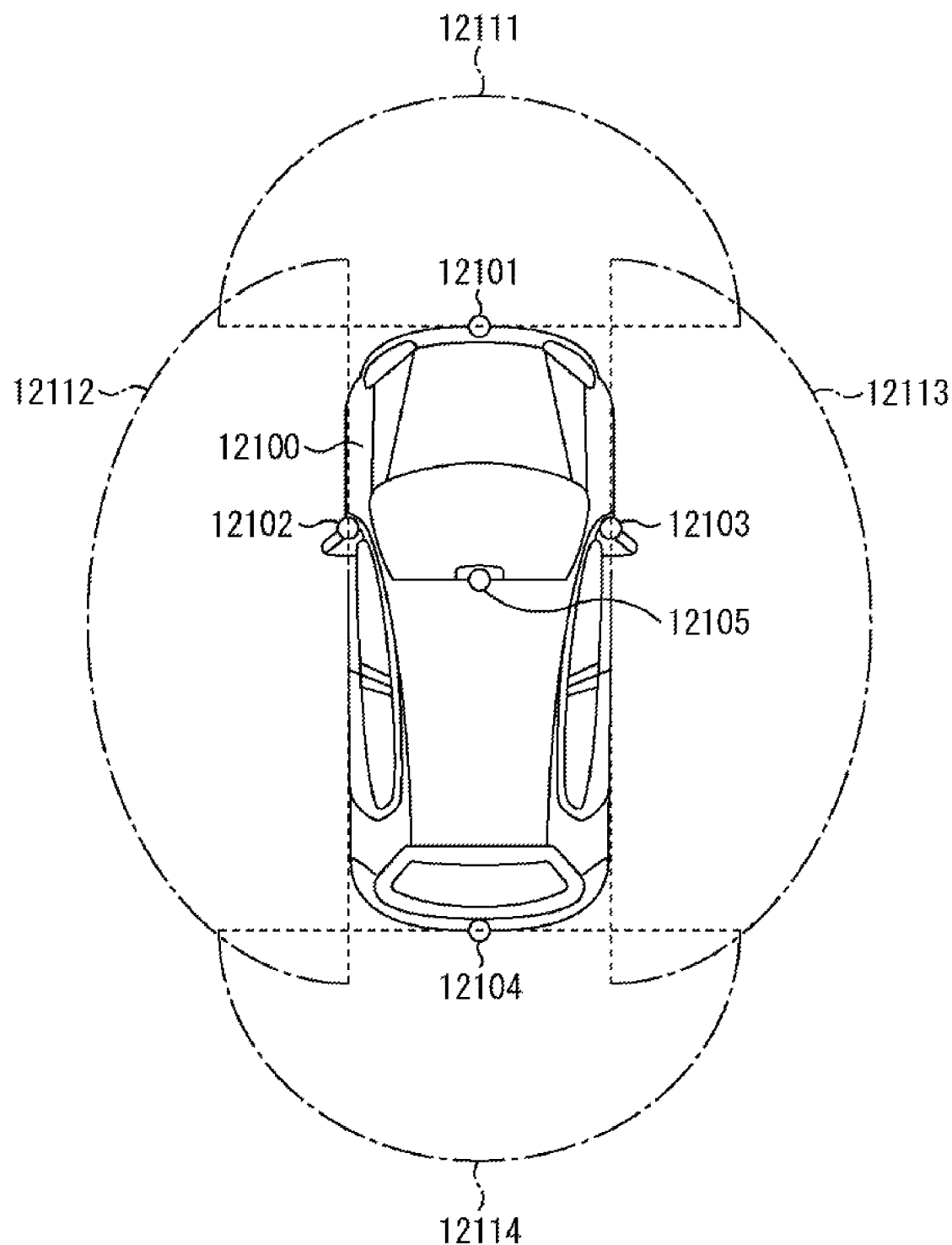

[ FIG. 21 ]
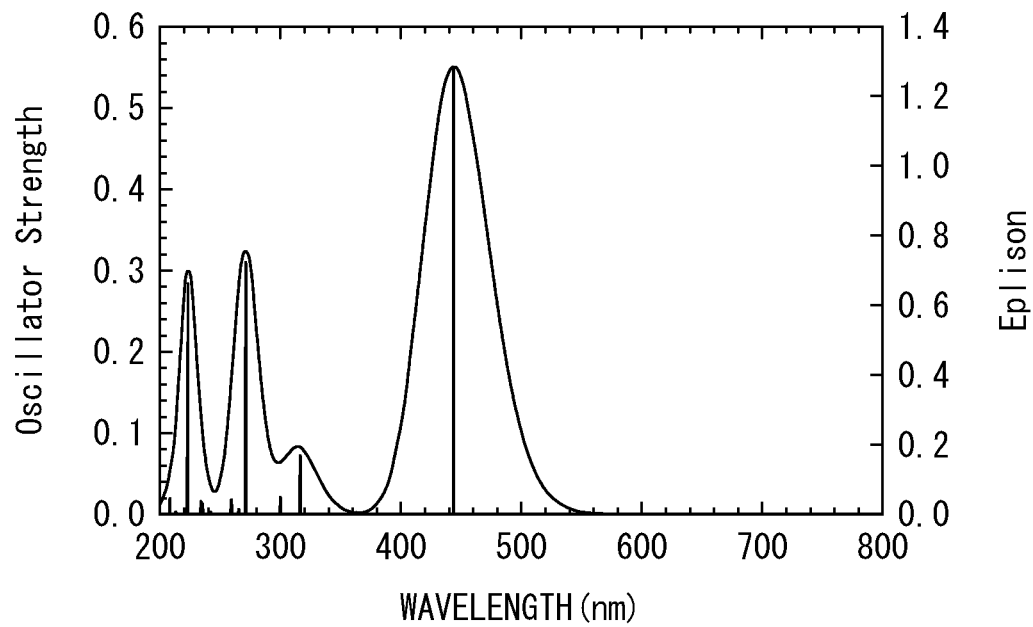
[ FIG. 22 ]
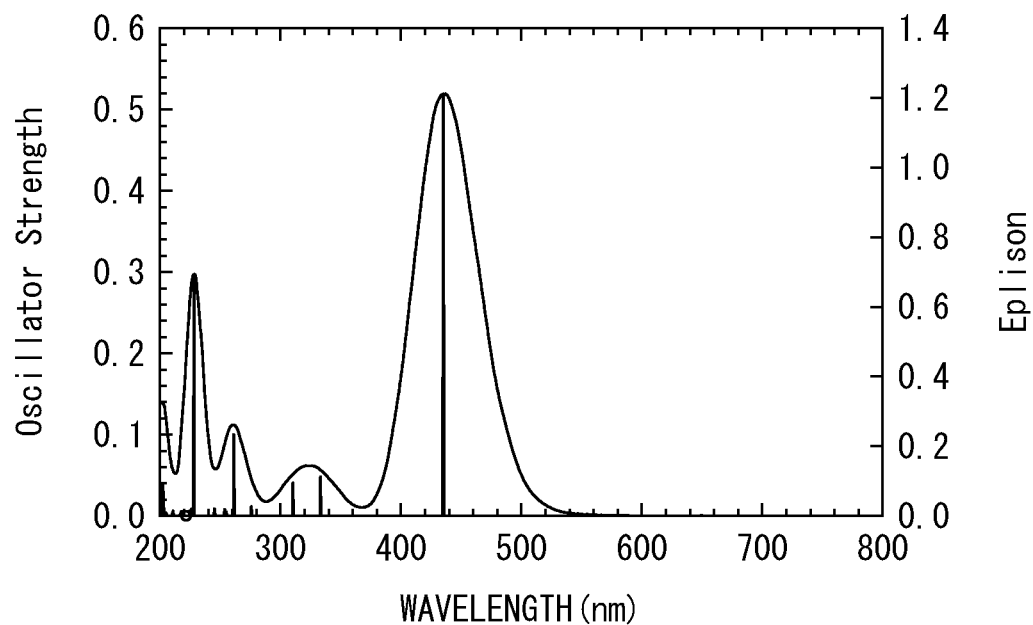

[ FIG. 23 ]
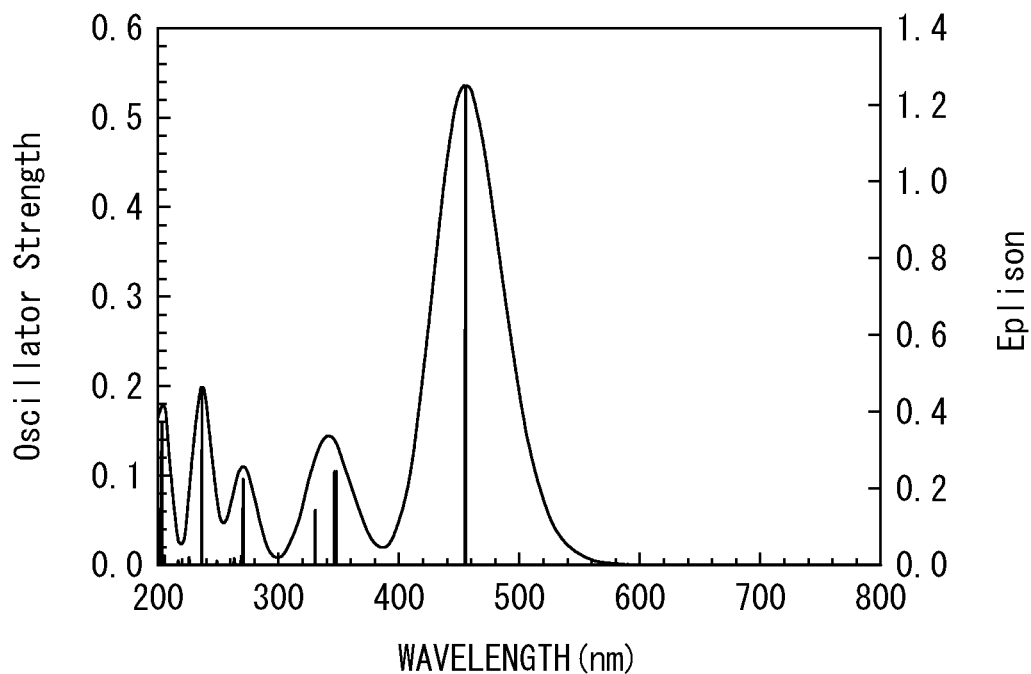
[ FIG. 24 ]
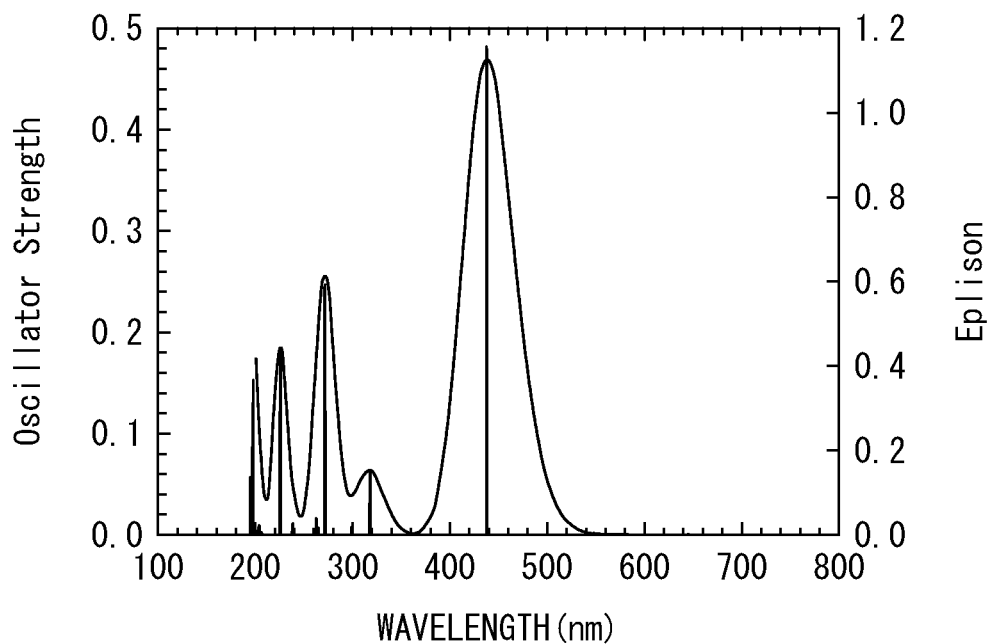

[ FIG. 25 ]
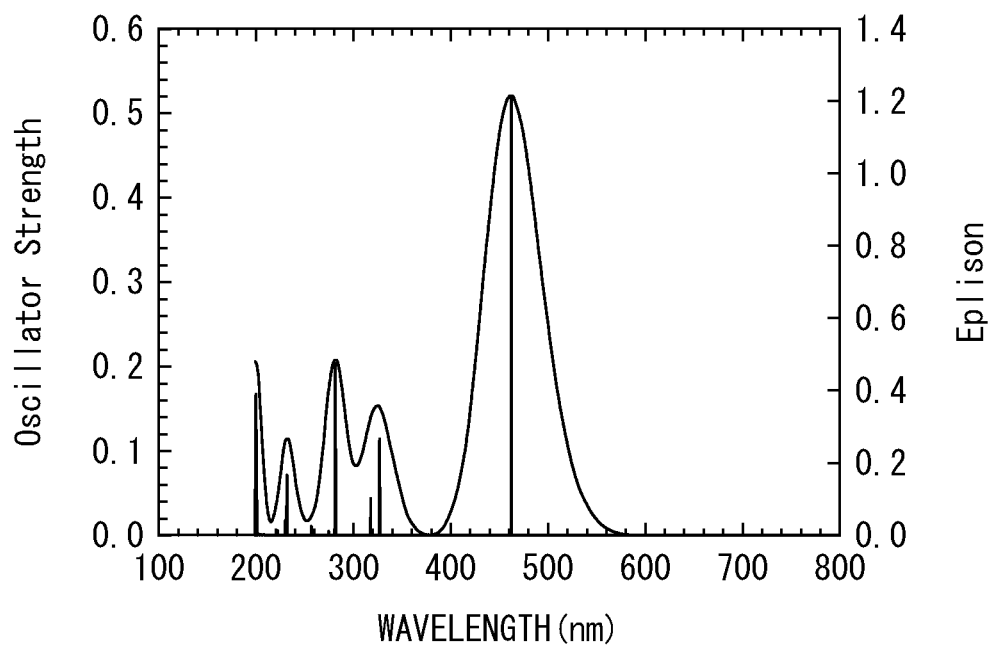
[ FIG. 26 ]
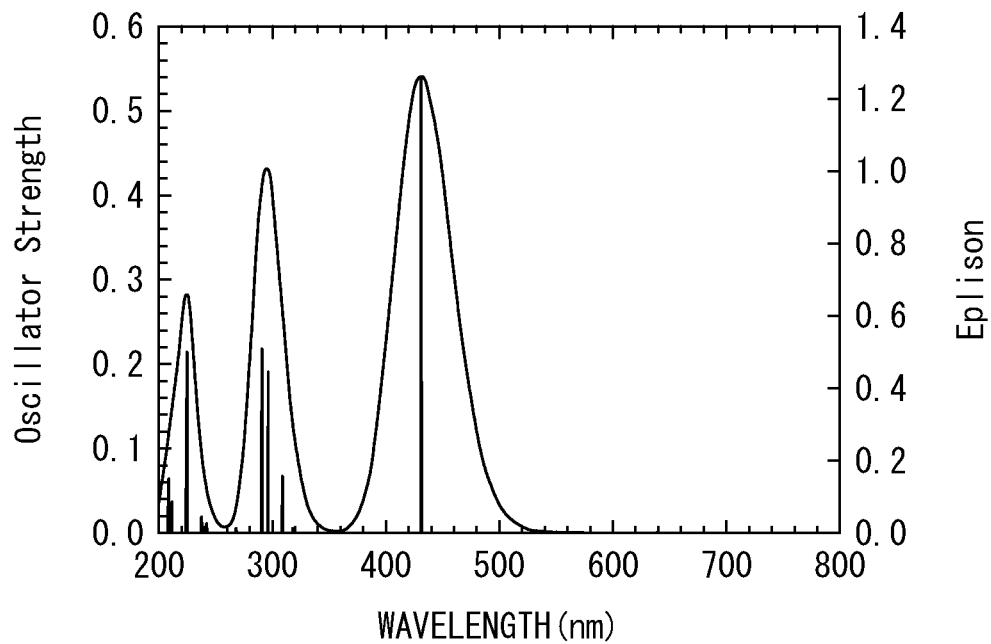

[ FIG. 27 ]
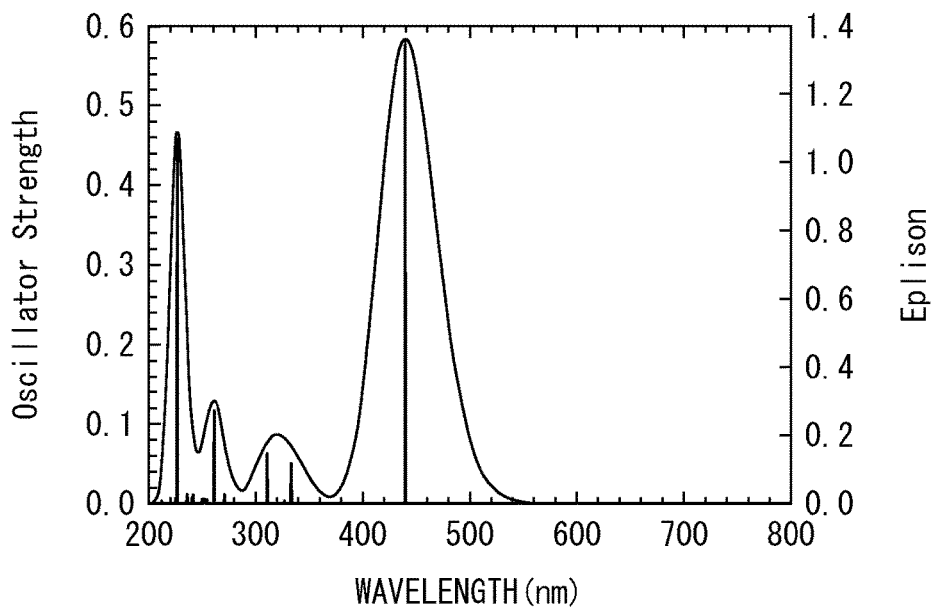
[ FIG. 28 ]
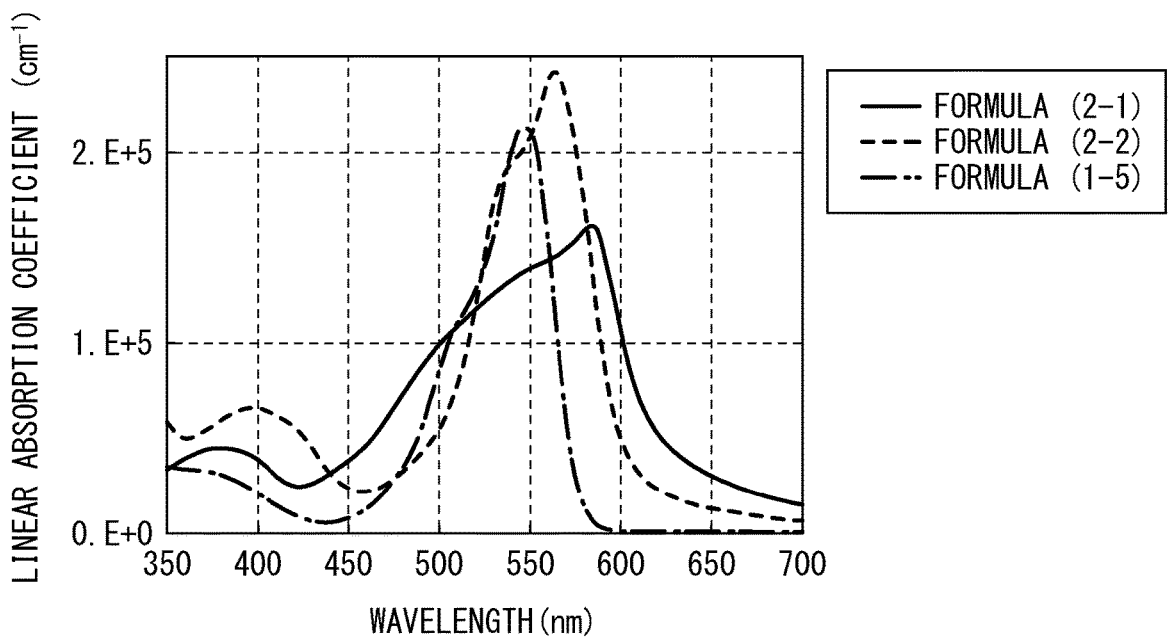

IMAGING ELEMENT AND IMAGING DEVICE

TECHNICAL FIELD

The present disclosure relates to an imaging element in which an organic material is used and an imaging device including this.

BACKGROUND ART

For example, PTL 1 discloses a photoelectric conversion element including an organic layer containing the compound represented by the following general formula (2). R1 and R4 of the compound represented by the general formula (2) are alkyl groups such as methyl groups.

[Chem. 1]

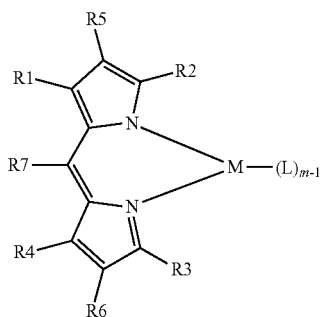

(2)

CITATION LIST

Patent Literature

PTL 1: International Publication No. WO 2015/119039

SUMMARY OF THE INVENTION

Incidentally, an imaging element in which an organic material is used is requested to have increased spectral characteristics.

It is desirable to provide an imaging element and an imaging device each of which makes it possible to increase spectral characteristics.

An imaging element according to an embodiment of the present disclosure includes: a first electrode; a second electrode that is disposed to be opposed to the first electrode; and an organic layer that is provided between the first electrode and the second electrode. The organic layer includes a compound represented by the following general formula (1):

[Chem. 2]

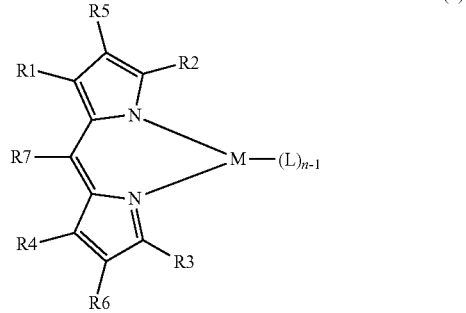

(1)

(where R1 and R4 each independently represent a hydrogen atom or a deuterium atom; R2 and R3 each independently represent an alkyl group, a cycloalkyl group, an alkoxy group, or an aryl ether group; R5 and R6 each independently represent a halogen atom, a hydrogen atom, or a alkyl group; R7 represents an aryl group, a heteroaryl group, or an alkenyl group; M represents boron or an m-valent metal atom and includes at least one of germanium, beryllium, magnesium, aluminum, chromium, iron, nickel, copper, zinc, or platinum; L represents a halogen atom, a hydrogen atom, an alkyl group, an aryl group, or a heteroaryl group; and n represents an integer greater than or equal to 1 and less than or equal to 6 and L's each independently represent a halogen atom, a hydrogen atom, an alkyl group, an aryl group, or a heteroaryl group in a case where n−1 is 2 or more.)

An imaging device according to an embodiment of the present disclosure includes pixels each including one or more organic photoelectric conversion sections and includes the imaging element according to the embodiment of the present disclosure described above as each of the organic photoelectric conversion sections.

In the imaging element according to the embodiment of the present disclosure and the imaging device according to the embodiment, the organic layer is formed by using the compound represented by the general formula (1) described above. This increases the selectivity for a wavelength detected by the organic layer.

BRIEF DESCRIPTION OF DRAWING

FIG. 1 is a cross-sectional schematic diagram illustrating an example of a configuration of an imaging element according to a first embodiment of the present disclosure.

FIG. 2 is a diagram illustrating an overall configuration of the imaging element illustrated in FIG. 1.

FIG. 3 is an equivalent circuit diagram of the imaging element illustrated in FIG. 1.

FIG. 4 is a schematic diagram illustrating disposition of a lower electrode and a transistor included in a control section of the imaging element illustrated in FIG. 1.

FIG. 5 is a cross-sectional schematic diagram illustrating another example of the configuration of the imaging element according to the first embodiment of the present disclosure.

FIG. 6 is a cross-sectional view for describing a method of manufacturing the imaging element illustrated in FIG. 1.

FIG. 7 is a cross-sectional view illustrating a step subsequent to FIG. 6.

FIG. 8 is a cross-sectional view illustrating a step subsequent to FIG. 7.

FIG. 9 is a cross-sectional view illustrating a step subsequent to FIG. 8.

FIG. 10 is a cross-sectional view illustrating a step subsequent to FIG. 9.

FIG. 11 is a timing chart illustrating an operation example of the imaging element illustrated in FIG. 1.

FIG. 12 is a cross-sectional schematic diagram illustrating an example of a configuration of an imaging element according to a second embodiment of the present disclosure.

FIG. 13 is a cross-sectional schematic diagram illustrating an example of a configuration of an imaging element according to a third embodiment of the present disclosure.

FIG. 14 is a block diagram illustrating a configuration of an imaging device in which the imaging element illustrated in FIG. 1 or the like is used for a pixel.

FIG. 15 is a functional block diagram illustrating an example of an electronic apparatus (a camera) in which the imaging device illustrated in FIG. 14 is used.

FIG. 16 is a block diagram depicting an example of a schematic configuration of an in-vivo information acquisition system.

FIG. 17 is a view depicting an example of a schematic configuration of an endoscopic surgery system.

FIG. 18 is a block diagram depicting an example of a functional configuration of a camera head and a camera control unit (CCU).

FIG. 19 is a block diagram depicting an example of a schematic configuration of a vehicle control system.

FIG. 20 is a diagram of assistance in explaining an example of installation positions of an outside-vehicle information detecting section and an imaging section.

FIG. 21 is a characteristic diagram illustrating an absorption spectrum obtained from a quantum scientific calculation of a compound (a BODIPY dye) represented by a formula (1-5).

FIG. 22 is a characteristic diagram illustrating an absorption spectrum obtained from a quantum scientific calculation of a compound (a BODIPY dye) represented by a formula (2-1).

FIG. 23 is a characteristic diagram illustrating an absorption spectrum obtained from a quantum scientific calculation of a compound (a BODIPY dye) represented by a formula (2-2).

FIG. 24 is a characteristic diagram illustrating an absorption spectrum obtained from a quantum scientific calculation of a compound (a BODIPY dye) represented by a formula (1-2).

FIG. 25 is a characteristic diagram illustrating an absorption spectrum obtained from a quantum scientific calculation of a compound (a BODIPY dye) represented by a formula (1-3).

FIG. 26 is a characteristic diagram illustrating an absorption spectrum obtained from a quantum scientific calculation of a compound (a BODIPY dye) represented by a formula (1-4).

FIG. 27 is a characteristic diagram illustrating an absorption spectrum obtained from a quantum scientific calculation of a compound (a BODIPY dye) represented by a formula (2-3).

FIG. 28 is a characteristic diagram illustrating the absorption spectra of the compounds (the BODIPY dyes) represented by the formula (1-5), the formula (2-1), and the formula (2-2).

MODES FOR CARRYING OUT THE INVENTION

The following describes an embodiment of the present disclosure in detail with reference to the drawings. The following description is a specific example of the present disclosure, but the present disclosure is not limited to the following modes. In addition, the present disclosure is not also limited to the disposition, dimensions, dimension ratios, and the like of the respective components illustrated in the respective diagrams. It is to be noted that description is given in the following order.

1. First Embodiment (An example of an imaging element including an organic photoelectric conversion section including an organic layer that includes a BODIPY compound including hydrogen atoms at a first position and a seventh position)
1-1. Configuration of Imaging Element
1-2. Method of Manufacturing Imaging Element
1-3. Workings and Effects
2. Second Embodiment (an example in which two organic photoelectric conversion sections are stacked on a semiconductor substrate)
3. Third Embodiment (an example in which three organic photoelectric conversion sections are stacked on a semiconductor substrate)
4. Application Examples
5. Practical Application Examples
6. Working Examples 1. First Embodiment FIG. 1 illustrates an example of a cross-sectional configuration of an imaging element (an imaging element 10A) according to a first embodiment of the present disclosure. FIG. 2 illustrates a planar configuration of the imaging element 10A illustrated in FIG. 1. FIG. 3 is an equivalent circuit diagram of the imaging element 10A illustrated in FIG. 1. FIG. 3 corresponds to a region 100 illustrated in FIG. 2. FIG. 4 schematically illustrates the disposition of a lower electrode 21 and a transistor included in a control section of the imaging element 10A illustrated in FIG. 1. The imaging element 10A is included, for example, in one pixel (a unit pixel P) of an imaging device (an imaging device 1; see FIG. 17) such as a CMOS (Complementary Metal Oxide Semiconductor) image sensor used for an electronic apparatus such as a digital still camera or a video camera. The imaging element 10A according to the present embodiment includes an organic photoelectric conversion section 20 in which the lower electrode 21, a photoelectric conversion layer 24, and an upper electrode 25 are stacked in this order. The photoelectric conversion layer 24 detects the band of any of an infrared region and a visible region. The photoelectric conversion layer 24 is formed by using the compound represented by a general formula (1) described below. This photoelectric conversion layer 24 corresponds to a specific example of an "organic layer" according to the present disclosure.

(1-1. Configuration of Imaging Element)

The imaging element 10A is, for example, a so-called vertical spectroscopic imaging element in which the one organic photoelectric conversion section 20 and two inorganic photoelectric conversion sections 32B and 32R are stacked in the vertical direction. The organic photoelectric conversion section 20 is provided on a first surface (the back surface; a surface 30S1) side of a semiconductor substrate 30. The inorganic photoelectric conversion sections 32B and 32R are formed to be buried in the semiconductor substrate 30 and stacked in the thickness direction of the semiconductor substrate 30. The organic photoelectric conversion section 20 includes the photoelectric conversion layer 24 between the lower electrode 21 and the upper electrode 25 as described above as an organic layer that is formed by using an organic material. The lower electrode 21 and the upper electrode 25 are disposed to be opposed to each other. This photoelectric conversion layer 24 includes a p-type semiconductor and an n-type semiconductor and has a bulk heterojunction structure in the layer. The bulk heterojunction structure is a p/n junction surface formed by mixing a p-type semiconductor and an n-type semiconductor.

The organic photoelectric conversion section 20 and the inorganic photoelectric conversion sections 32B and 32R perform photoelectric conversion by selectively detecting the respective wavelengths (the respective pieces of light) of wavelength bands different from each other. For example, the organic photoelectric conversion section 20 absorbs the wavelength of a green band and acquires a color signal of green (G). The inorganic photoelectric conversion sections 32B and 32R respectively absorbs the wavelength of a blue band to acquire a color signal of blue (B) and absorbs the wavelength of a red band to acquire a color signal of red (R) because of different absorption coefficients. This allows the imaging element 10A to acquire a plurality of types of color signals in one pixel without using any color filters.

It is to be noted that, in the present embodiment, a case is described where the electron of a pair (an electron-hole pair) of an electron and a hole generated by photoelectric conversion is read out as signal charge (a case where an n-type semiconductor region is used as a photoelectric conversion layer). In addition, in the drawings, "+(plus)" attached to "p" and "n" indicates high p-type or n-type impurity concentration.

A second surface (the front surface; 30S2) of the semiconductor substrate 30 is provided, for example, with floating diffusions (floating diffusion layers) FD1 (a region 36B in the semiconductor substrate 30), FD2 (a region 37C in the semiconductor substrate 30), FD3 (a region 38C in the semiconductor substrate 30), transfer transistors Tr2 and Tr3, an amplifier transistor (a modulation element) AMP, a reset transistor RST, a selection transistor SEL, and a multilayer wiring layer 40. The multilayer wiring layer 40 has, for example, a configuration in which wiring layers 41, 42, and 43 are stacked in an insulating layer 44.

It is to be noted that the first surface (the surface 30S1) side of the semiconductor substrate 30 is referred to as light incidence side S1 and the second surface (the surface 30S2) side is referred to as wiring layer side S2 in the drawings.

The organic photoelectric conversion section 20 includes the lower electrode 21, a semiconductor layer 23, the photoelectric conversion layer 24, and the upper electrode 25 that are stacked in this order from the first surface (the surface 30S1) side of the semiconductor substrate 30. In addition, there is provided an insulating layer 22 between the lower electrode 21 and the semiconductor layer 23. The lower electrodes 21 are separately formed, for example, for the respective imaging elements 10A. Although described in detail below, each of the lower electrodes 21 includes a readout electrode 21A and an accumulation electrode 21B that are separated from each other with the insulating layer 22 interposed in between. The readout electrode 21A of the lower electrode 21 is electrically coupled to the semiconductor layer 23 through an opening 22H provided in the insulating layer 22. FIG. 1 illustrates an example in which the semiconductor layer 23, the photoelectric conversion layer 24, and the upper electrode 25 are provided as continuous layers common to the plurality of imaging elements 10A, but the semiconductor layers 23, the photoelectric conversion layers 24, and the upper electrodes 25 may be separately formed for the respective imaging elements 10A. There are provided, for example, a dielectric film 26, an insulating film 27, and an interlayer insulating layer 28 between the first surface (the surface 30S1) of the semiconductor substrate 30 and the lower electrode 21. There is provided a protective layer 51 above the upper electrode 25. There is provided, for example, a light shielding film 52 at a position corresponding to the readout electrode 21A in the protective layer 51. This light shielding film 52 does not overlap with at least the accumulation electrode 21B, but it is sufficient if the light shielding film 52 is provided to cover the region of the readout electrode 21A in direct contact with at least the semiconductor layer 23. There are provided optical members such as a planarization layer (not illustrated) and an on-chip lens 53 above the protective layer 51.

There is provided a through electrode 34 between the first surface (the surface 30S1) and the second surface (the surface 30S2) of the semiconductor substrate 30. This through electrode 34 is electrically coupled to the readout electrode 21A of the organic photoelectric conversion section 20 and the organic photoelectric conversion section 20 is coupled to a gate Gamp of the amplifier transistor AMP and the one source/drain region 36B of the reset transistor RST (a reset transistor Tr1rst) through the through electrode 34. The one source/drain region 36B of the reset transistor RST (the reset transistor Tr1rst) also serves as the floating diffusion FD1. This allows the imaging element 10A to favorably transfer the electric charge generated in the organic photoelectric conversion section 20 on the first surface (a surface 30S21) side of the semiconductor substrate 30 to the second surface (the surface 30S2) side of the semiconductor substrate 30 and makes it possible to increase the characteristics.

The lower end of the through electrode 34 is coupled to a coupling section 41A in the wiring layer 41 and the coupling section 41A and the gate Gamp of the amplifier transistor AMP are coupled through a lower first contact 45. The coupling section 41A and the floating diffusion FD1 (the region 36B) are coupled, for example, through a lower second contact 46. The upper end of the through electrode 34 is coupled to the readout electrode 21A, for example, through an upper first contact 29A, a pad section 39A, and an upper second contact 29B.

The through electrode 34 is provided, for example, for each of the organic photoelectric conversion sections 20 in the respective imaging elements 10A. The through electrode 34 has a function of a connector between the organic photoelectric conversion section 20 and the gate Gamp of the amplifier transistor AMP and the floating diffusion FD1 and serves as a transmission path for the electric charge generated in the organic photoelectric conversion section 20.

A reset gate Grst of the reset transistor RST is disposed next to the floating diffusion FD1 (the one source/drain region 36B of the reset transistor RST). This allows the reset transistor RST to reset the electric charge accumulated in the floating diffusion FD1.

In the imaging element 10A according to the present embodiment, light entering the organic photoelectric conversion section 20 from the upper electrode 25 side is absorbed by the photoelectric conversion layer 24. The excitons generated by this move to the interface between an electron donor and an electron acceptor included in the photoelectric conversion layer 24 and undergo exciton separation. In other words, the excitons are dissociated into electrons and holes. The electric charge (the electrons and the holes) generated here is carried to different electrodes by diffusion resulting from a difference in concentration between carriers or an internal electric field resulting from a difference in work function between an anode (e.g., the upper electrode 25) and a cathode (e.g., the lower electrode 21) and detected as a photocurrent. In addition, the application of a potential between the lower electrode 21 and the upper electrode 25 makes it possible to control the transport direction of electrons and holes.

The following describes configurations, materials, and the like of the respective sections.

The organic photoelectric conversion section 20 is an organic photoelectric converter that absorbs light corresponding to a wavelength band of a portion or the whole of a selective wavelength band (e.g., 400 nm or more and 700 nm or less) and generates electron-hole pairs.

As described above, the lower electrode 21 includes the readout electrode 21A and the accumulation electrode 21B that are separately formed. The readout electrode 21A is for transferring the electric charge generated in the photoelectric conversion layer 24 to the floating diffusion FD1. For example, the readout electrode 21A is coupled to the floating diffusion FD1 through the upper second contact 29B, the pad section 39A, the upper first contact 29A, the through electrode 34, the coupling section 41A, and the lower second contact 46. The accumulation electrode 21B is for accumulating, in the semiconductor layer 23 as signal charge, the electrons of the electric charge generated in the photoelectric conversion layer 24. The accumulation electrode 21B is provided in a region that is opposed to the light receiving surfaces of the inorganic photoelectric conversion sections 32B and 32R formed in the semiconductor substrate 30 and covers these light receiving surfaces. It is preferable that the accumulation electrode 21B be larger than the readout electrode 21A. This makes it possible to accumulate a large amount of electric charge. As illustrated in FIG. 4, a voltage application circuit 60 is coupled to the accumulation electrode 21B through a wiring line.

The lower electrode 21 includes an electrically conductive film having light transmissivity. Examples of a material included in the lower electrode 21 include an indium-tin oxide including indium tin oxide (ITO), $In_2O_3$ to which tin (Sn) is added as a dopant, crystalline ITO, and amorphous ITO. In addition to the materials described above, a tin oxide ($SnO_2$-based material to which a dopant is added or a zinc oxide-based material to which a dopant is added may be used as a material included in the lower electrode 21. Examples of the zinc oxide-based material include an aluminum zinc oxide (AZO) to which aluminum (Al) is added as a dopant, a gallium zinc oxide (GZO) to which gallium (Ga) is added, a boron zinc oxide to which boron (B) is added, and an indium zinc oxide (IZO) to which indium (In) is added. In addition, CuI, $InSbO_4$, ZnMgO, $CuInO_2$, $MgIN_2O_4$, CdO, $ZnSnO_3$, $TiO_2$, or the like may be used as a material included in the lower electrode 21. Further, a spinel oxide or an oxide having a $YbFe_2O_4$ structure may be used. It is to be noted that the lower electrode 21 formed by using any of the materials as described above generally has a high work function and functions as an anode electrode.

The semiconductor layer 23 is provided in a lower layer of the photoelectric conversion layer 24. Specifically, the semiconductor layer 23 is provided between the insulating layer 22 and the photoelectric conversion layer 24. The semiconductor layer 23 is for accumulating the signal charge generated in the photoelectric conversion layer 24. It is preferable that the semiconductor layer 23 be formed by using a material having higher electric charge mobility and having a wider band gap than those of the photoelectric conversion layer 24. For example, it is preferable that the band gap of a material included in the semiconductor layer 23 be 3.0 eV or more. Examples of such a material include an oxide semiconductor material such as IGZO, an organic semiconductor material, and the like. Examples of the organic semiconductor material include transition metal dichalcogenide, silicon carbide, diamond, graphene, a carbon nanotube, a fused polycyclic hydrocarbon compound, a fused heterocyclic compound, and the like. The semiconductor layer 23 has, for example, a thickness of 10 nm or more and 300 nm or less. The semiconductor layer 23 including the material described above is provided in a lower layer of the photoelectric conversion layer 24. This makes it possible to prevent electric charge recombination during electric charge accumulation and increase the transfer efficiency.

The photoelectric conversion layer 24 converts light energy to electric energy. The photoelectric conversion layer 24 according to the present embodiment absorbs, for example, light having a portion or all of wavelengths within a range of 400 nm or more and 700 nm or less. The photoelectric conversion layer 24 includes, for example, two or more types of organic materials that each function as a p-type semiconductor or an n-type semiconductor. The photoelectric conversion layer 24 has a junction surface (a p/n junction surface) between a p-type semiconductor and an n-type semiconductor in the layer. The p-type semiconductor relatively functions as an electron donor (a donor) and the n-type semiconductor relatively functions an electron acceptor (an acceptor). The photoelectric conversion layer 24 provides a field where the excitons generated upon light absorption are separated into electrons and holes. Specifically, the excitons are separated into electrons and holes at the interface (the p/n junction surface) between the electron donor and the electron acceptor.

The photoelectric conversion layer 24 further includes an organic material or a so-called dye material in addition to a p-type semiconductor and an n-type semiconductor. The organic material or the dye material photoelectrically converts light in a predetermined wavelength band and transmits light in another wavelength band. In a case where the photoelectric conversion layer 24 is formed by using three types of organic materials including a p-type semiconductor, an n-type semiconductor, and a dye material, the p-type semiconductor and the n-type semiconductor are preferably materials having light transmissivity in a visible region (e.g., 400 nm to 700 nm). The photoelectric conversion layer 24 has, for example, a thickness of 25 nm or more and 400 nm or less. Preferably, the photoelectric conversion layer 24 has a thickness of 50 nm or more and 350 nm or less. More preferably, the photoelectric conversion layer 24 has a thickness of 150 nm or more and 300 nm or less.

In the present embodiment, the photoelectric conversion layer 24 is formed, for example, to include the compound represented by the following general formula (1) as a dye material. This compound represented by the general formula (1) is a BODIPY dye that has, for example, electron acceptability and absorbs, for example, light of 450 nm or more and 650 nm or less.

[Chem. 3]

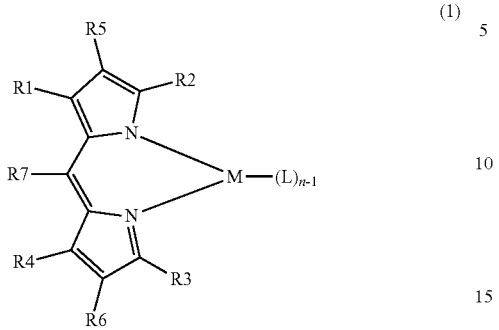

(1)

(where R1 and R4 each independently represent a hydrogen atom or a deuterium atom; R2 and R3 each independently represent an alkyl group, a cycloalkyl group, an alkoxy group, or an aryl ether group; R5 and R6 each independently represent a halogen atom, a hydrogen atom, or a alkyl group; R7 represents an aryl group, a heteroaryl group, or an alkenyl group; M represents boron or an m-valent metal atom and includes at least one of germanium, beryllium, magnesium, aluminum, chromium, iron, nickel, copper, zinc, or platinum; L represents a halogen atom, a hydrogen atom, an alkyl group, an aryl group, or a heteroaryl group; and n represents an integer greater than or equal to 1 and less than or equal to 6 and L's each independently represent a halogen atom, a hydrogen atom, an alkyl group, an aryl group, or a heteroaryl group in a case where n−1 is 2 or more.)

As a specific example of the compound represented by the general formula (1) described above, for example, the compounds represented by the following formulas (1-1) to (1-28) are included.

[Chem. 4]

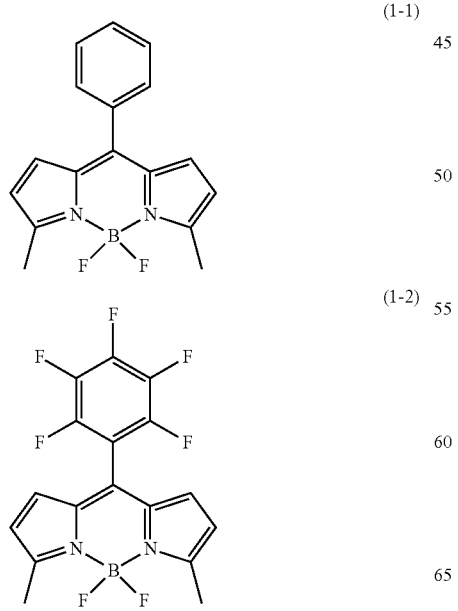

(1-1)

(1-2)

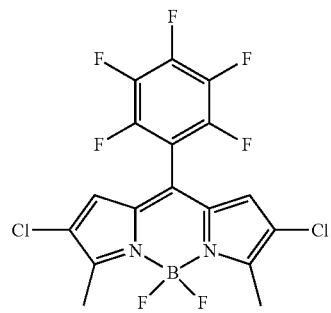

(1-3)

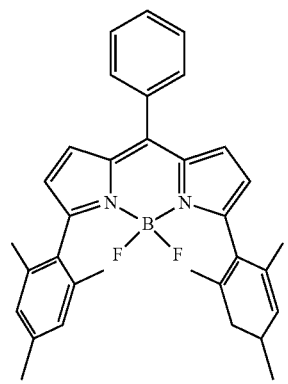

(1-4)

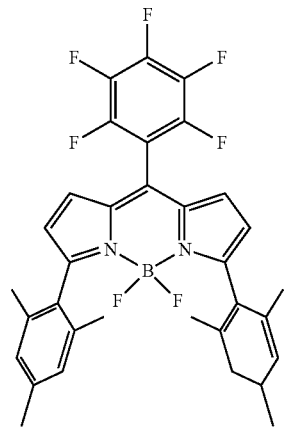

(1-5)

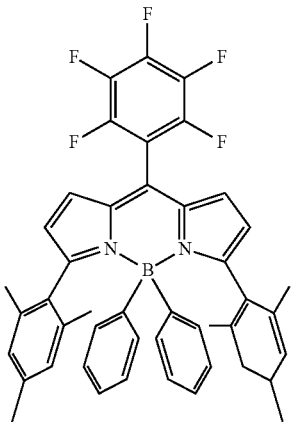

(1-6)

(1-7) 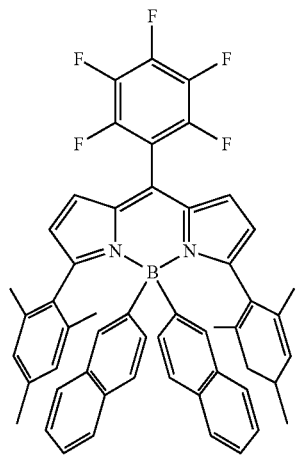
(1-8) 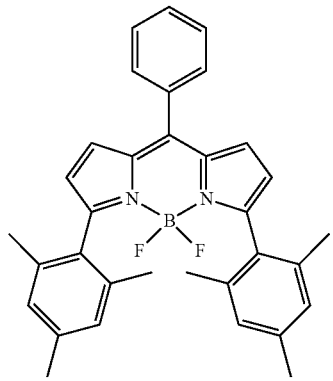
(1-9) 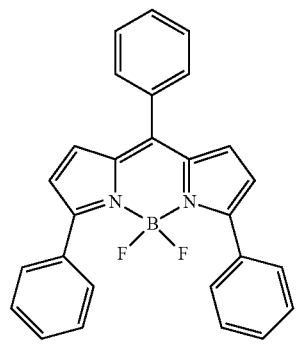
[Chem. 5]
(1-10) 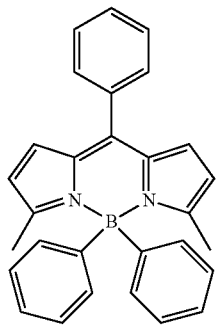
(1-11) 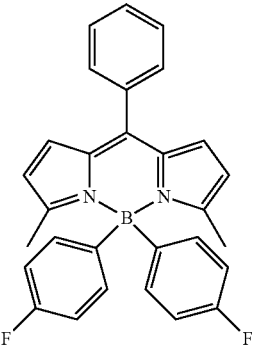
(1-12) 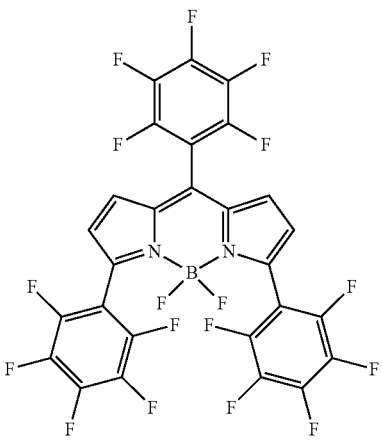
(1-13) 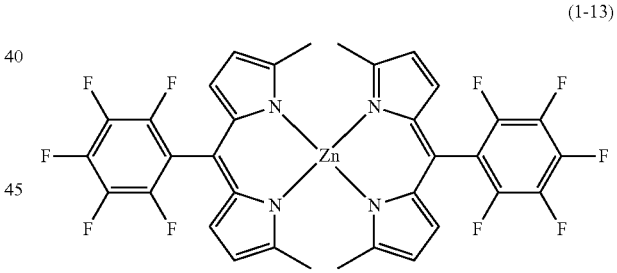
(1-14) 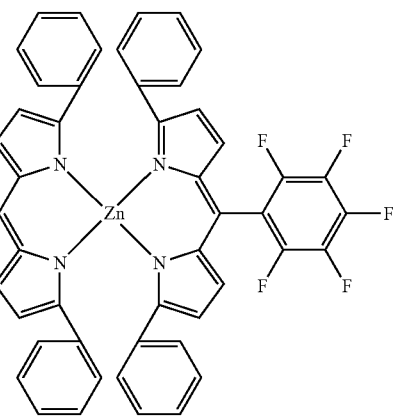

(1-15)
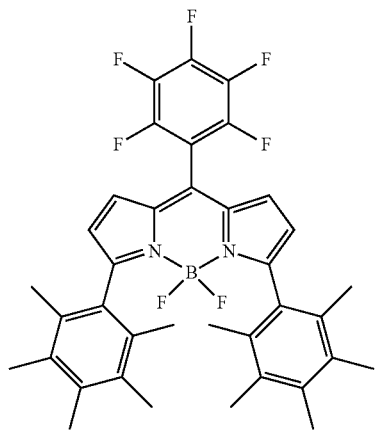
(1-16)
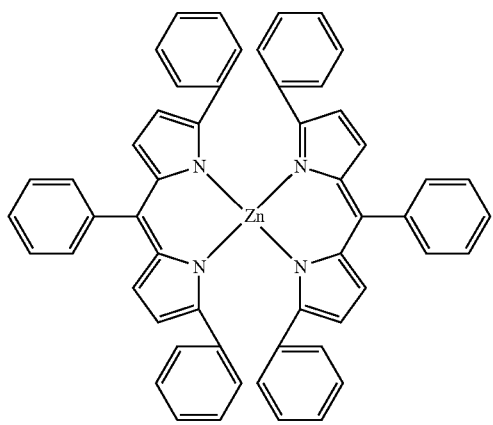
[Chem. 6]
(1-17)
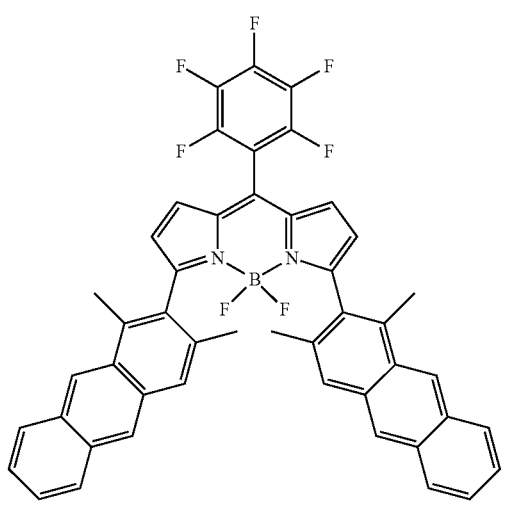
(1-18)
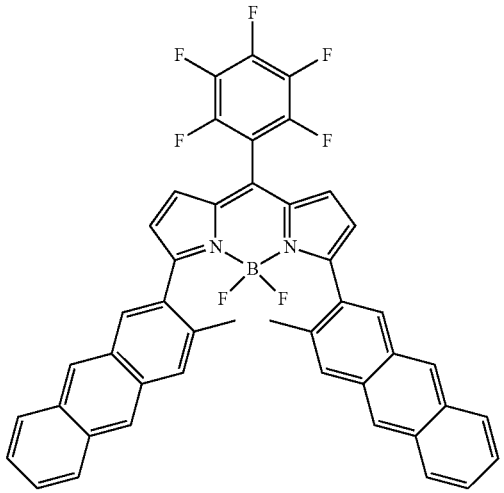
(1-19)
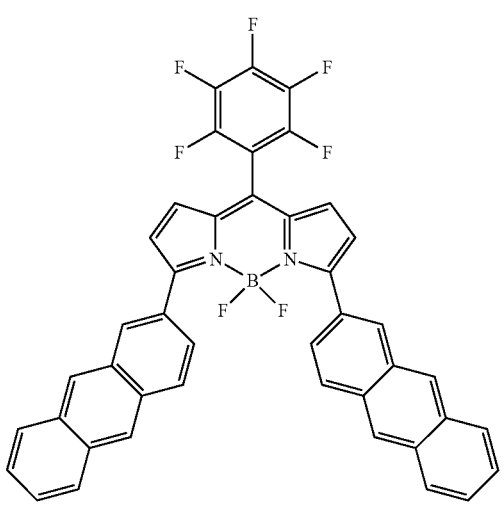
(1-20)
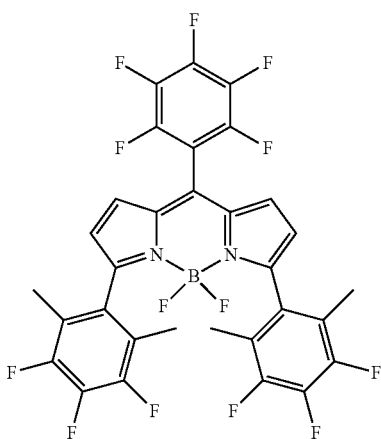

(1-21)
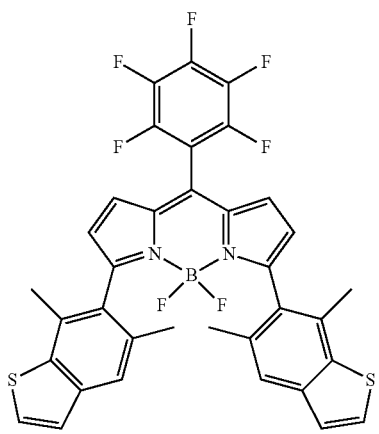

[Chem. 7]

(1-22)
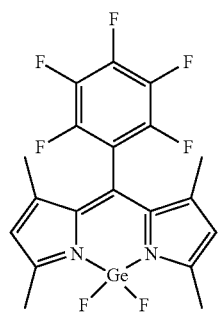

(1-23)
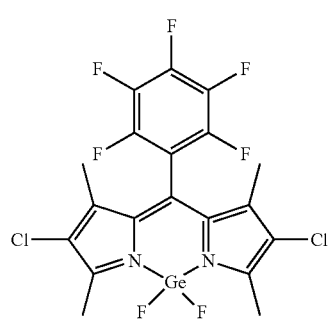

(1-24)
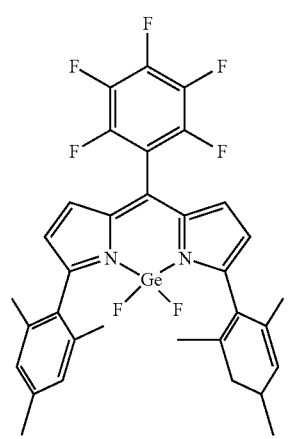

(1-25)
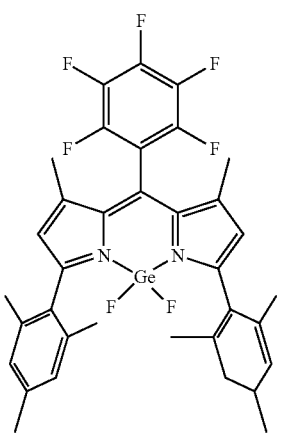

(1-26)
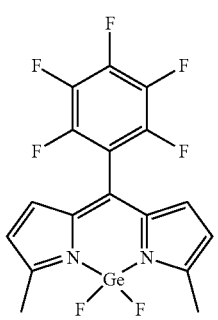

(1-27)
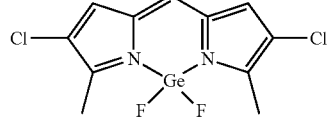

(1-28)
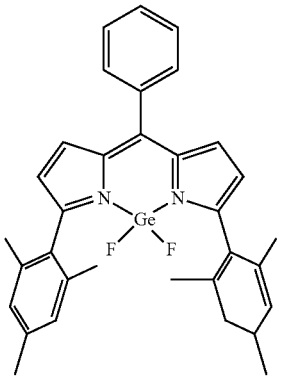

Examples of another organic material included in the photoelectric conversion layer 24 include fullerene or a fullerene derivative. Further, examples of another organic material included in the photoelectric conversion layer 24 include a thiophene derivative in which benzodithiophene (BDT) is a mother skeleton or a chrysene derivative having a chrysene skeleton.

The organic materials described above function as a p-type semiconductor or an n-type semiconductor depending on a combination thereof.

It is to be noted that the photoelectric conversion layer 24 may include an organic material other than the materials described above. As an organic material other than the materials described above, for example, any one of quinacridone, subphthalocyanine, pentacene, benzothienobenzothiophene, naphthalene, anthracene, phenanthrene, tetracene, pyrene, perylene, fluoranthene, and derivatives thereof is favorably used. Alternatively, a polymer such as phenylenevinylene, fluorene, carbazole, indole, pyrrole, picoline, thiophene, acetylene, or diacetylene or a derivative thereof may be used. Additionally, it is possible to preferably use a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthaquinone, an anthraquinone-based dye, a chain compound in which a fused polycyclic aromatic group such as anthracene and pyrene and an aromatic ring or a heterocyclic compound are condensed, a cyanine-like dye bonded by two nitrogen-containing hetero rings such as quinoline, benzothiazole, and benzoxazole that have a squarylium group and a croconic methine group as a bonded chain or by a squarylium group and a croconic methine group, or the like. It is to be noted that a dithiol metal complex-based dye, a metallophthalocyanine dye, a metalloporphyrine dye, or a ruthenium complex dye is preferable as the metal complex dye described above, but this is not limitative.

As with the lower electrode 21, the upper electrode 25 includes an electrically conductive film having light transmissivity. In the imaging device 1 in which the imaging element 10A is used as one pixel, the upper electrodes 25 may be separated for the respective pixels or formed as an electrode common to the respective pixels. The upper electrode 25 has, for example, a thickness of 10 nm to 200 nm.

There may be provided other layers between the semiconductor layer 23 and the photoelectric conversion layer 24 and between the photoelectric conversion layer 24 and the upper electrode 25 as organic layers in addition to the photoelectric conversion layer 24.

For example, as in an imaging element 10B illustrated in FIG. 5, the semiconductor layer 23, a hole block layer 24A, the photoelectric conversion layer 24, and an electron block layer 24B may be stacked in order from the lower electrode 21 side. The compound represented by the general formula (1) described above that has been mentioned as a material included, for example, in the photoelectric conversion layer 24 is usable for the hole block layer 24A and the electron block layer 24B.

Further, there may be provided an underlying layer and a hole transport layer between the lower electrode 21 and the photoelectric conversion layer 24 and there may be provided a work function adjustment layer, a buffer layer, or an electron transport layer between the photoelectric conversion layer 24 and the upper electrode 25.

The insulating layer 22 is for electrically separating the accumulation electrode 21B and the semiconductor layer 23. The insulating layer 22 is provided, for example, on the interlayer insulating layer 28 to cover the lower electrode 21. In addition, the insulating layer 22 is provided with the opening 22H above the readout electrode 21A of the lower electrode 21. The readout electrode 21A and the semiconductor layer 23 are electrically coupled through this opening 22H. The insulating layer 22 includes, for example, a single layer film including one of silicon oxide ($SiO_x$), silicon nitride ($SiN_x$), silicon oxynitride (SiON), and the like or a stacked film including two or more of them. The insulating layer 22 has, for example, a thickness of 20 nm to 500 nm.

The dielectric film 26 is for preventing the reflection of light caused by a refractive index difference between the semiconductor substrate 30 and the insulating film 27. It is preferable that a material of the dielectric film 26 be a material having a refractive index between the refractive index of the semiconductor substrate 30 and the refractive index of the insulating film 27. Further, it is preferable that a material allowing a film to be formed having, for example, negative fixed electric charge be used as a material of the dielectric film 26. Alternatively, it is preferable that a semiconductor material or an electrically conductive material having a wider band gap than that of the semiconductor substrate 30 be used as a material of the dielectric film 26. This makes it possible to suppress the generation of dark currents at the interface of the semiconductor substrate 30. Such a material includes hafnium oxide ($HfO_x$), aluminum oxide ($AlO_x$), zirconium oxide ($ZrO_x$), tantalum oxide ($TaO_x$), titanium oxide ($TiO_x$), lanthanum oxide ($LaO_x$), praseodymium oxide ($PrO_x$), cerium oxide ($CeO_x$), neodymium oxide ($NdO_x$), promethium oxide ($PmO_x$), samarium oxide ($SmO_x$), europium oxide ($EuO_x$), gadolinium oxide ($GdO_x$), terbium oxide ($TbO_x$), dysprosium oxide ($DyO_x$), holmium oxide ($HoO_x$), thulium oxide ($TmO_x$), ytterbium oxide ($YbO_x$), lutetium oxide ($LuO_x$), yttrium oxide ($YO_x$), hafnium nitride ($HfN_x$), aluminum nitride ($AlN_x$), hafnium oxynitride ($HfO_xN_y$), aluminum oxynitride ($AlO_xN_y$), and the like.

The insulating film 27 is provided on the dielectric film 26 that is formed on the first surface (the surface 30S1) of the semiconductor substrate 30 and a side surface of a through hole 30H. The insulating film 27 is for electrically insulating the through electrode 34 and the semiconductor substrate 30. Examples of a material of the insulating film 27 include silicon oxide ($SiO_x$), TEOS, silicon nitride ($SiN_x$), silicon oxynitride (SiON), and the like.

The interlayer insulating layer 28 includes, for example, a single layer film including one of silicon oxide ($SiO_x$), TEOS, silicon nitride ($SiN_x$), silicon oxynitride (SiON), and the like or a stacked film including two or more of them.

The protective layer 51 includes a material having light transmissivity. The protective layer 51 includes, for example, a single layer film including any of silicon oxide ($SiO_x$), silicon nitride ($SiN_x$), silicon oxynitride (SiON), and the like or a stacked film including two or more of them. The protective layer 51 has, for example, a thickness of 100 nm to 30000 nm.

The semiconductor substrate 30 includes, for example, an n-type silicon (Si) substrate and includes a p well 31 in a predetermined region (e.g., a pixel section 1a). The second surface (the surface 30S2) of the p well 31 is provided with the transfer transistors Tr2 and Tr3 described above, the amplifier transistor AMP, the reset transistor RST, a selection transistor SEL, and the like. In addition, a peripheral portion (a peripheral portion 1b) of the semiconductor substrate 30 is provided, for example, with a pixel readout circuit 110 and a pixel drive circuit 120 each including a logic circuit and the like as illustrated in FIG. 2.

The reset transistor RST (the reset transistor Tr1rst) is for resetting the electric charge transferred from the organic photoelectric conversion section 20 to the floating diffusion FD1 and includes, for example, a MOS transistor. Specifically, the reset transistor Tr1rst includes the reset gate Grst, a channel formation region 36A, and the source/drain regions 36B and 36C. The reset gate Grst is coupled to a reset line RST1. The one source/drain region 36B of the reset transistor Tr1rst also serves as the floating diffusion FD1. The other source/drain region 36C included in the reset transistor Tr1rst is coupled to a power supply line VDD.

The amplifier transistor AMP is a modulation element that modulates, into voltage, the amount of electric charge generated in the organic photoelectric conversion section 20 and includes, for example, a MOS transistor. Specifically, the amplifier transistor AMP includes the gate Gamp, a channel formation region 35A, and the source/drain regions 35B and 35C. The gate Gamp is coupled to the readout electrode 21A and the one source/drain region 36B (the floating diffusion FD1) of the reset transistor Tr1rst through the lower first contact 45, the coupling section 41A, the lower second contact 46, the through electrode 34, and the like. In addition, the one source/drain region 35B shares a region with the other source/drain region 36C included in the reset transistor Tr1rst and is coupled to the power supply line VDD.

The selection transistor SEL (the selection transistor TR1sel) includes a gate Gsel, a channel formation region 34A, and the source/drain regions 34B and 34C. The gate Gsel is coupled to a selection line SELL The one source/drain region 34B shares a region with the other source/drain region 35C included in the amplifier transistor AMP and the other source/drain region 34C is coupled to a signal line (a data output line) VSL1.

The inorganic photoelectric conversion sections 32B and 32R each have a pn junction in a predetermined region of the semiconductor substrate 30. The inorganic photoelectric conversion sections 32B and 32R each allow light to be dispersed in the vertical direction because the respective pieces of light having different wavelengths are absorbed in accordance with the light incidence depth in a silicon substrate. The inorganic photoelectric conversion section 32B selectively detects blue light to accumulate the signal charge corresponding to blue and is installed at depth that allows the blue light to be photoelectrically converted efficiently. The inorganic photoelectric conversion section 32R selectively detects red light to accumulate the signal charge corresponding to red and is installed at depth that allows the red light to be photoelectrically converted efficiently. It is to be noted that blue (B) is a color corresponding, for example, to a wavelength band of 430 nm to 480 nm and red (R) is a color corresponding, for example, to a wavelength band of 600 nm to 750 nm. It is sufficient if the inorganic photoelectric conversion sections 32B and 32R are able to detect pieces of light of a portion or all of the respective wavelength bands.

The inorganic photoelectric conversion section 32B includes, for example, a p+ region serving as a hole accumulation layer and an n region serving as an electron accumulation layer. The inorganic photoelectric conversion section 32R includes, for example, a p+ region serving as a hole accumulation layer and an n region serving as an electron accumulation layer (has a p-n-p stacked structure). The n region of the inorganic photoelectric conversion section 32B is coupled to the vertical transfer transistor Tr2. The p+ region of the inorganic photoelectric conversion section 32B is bent along the transfer transistor Tr2 and leads to the p+ region of the inorganic photoelectric conversion section 32R.

The transfer transistor Tr2 (a transfer transistor TR2trs) is for transferring, to the floating diffusion FD2, the signal charge corresponding to blue and generated and accumulated in the inorganic photoelectric conversion section 32B. The inorganic photoelectric conversion section 32B is formed at a deep position from the second surface (the surface 30S2) of the semiconductor substrate 30 and it is thus preferable that the transfer transistor TR2trs of the inorganic photoelectric conversion section 32B include a vertical transistor. The transfer transistor TR2trs is coupled to a transfer gate line TG2. The floating diffusion FD2 is provided in the region 37C near a gate Gtrs2 of the transfer transistor TR2trs. The electric charge accumulated in the inorganic photoelectric conversion section 32B is read out to the floating diffusion FD2 through a transfer channel formed along the gate Gtrs2.

The transfer transistor Tr3 (a transfer transistor TR3trs) is for transferring, to the floating diffusion FD3, the signal charge corresponding to red and generated and accumulated in the inorganic photoelectric conversion section 32R. The transfer transistor Tr3 (the transfer transistor TR3trs) includes, for example, a MOS transistor. The transfer transistor TR3trs is coupled to a transfer gate line TG3. The floating diffusion FD3 is provided in the region 38C near a gate Gtrs3 of the transfer transistor TR3trs. The electric charge accumulated in the inorganic photoelectric conversion section 32R is read out to the floating diffusion FD3 through a transfer channel formed along the gate Gtrs3.

There are further provided a reset transistor TR2rst, an amplifier transistor TR2amp, and a selection transistor TR2sel on the second surface (the surface 30S2) side of the semiconductor substrate 30. The reset transistor TR2rst, the amplifier transistor TR2amp, and the selection transistor TR2sel are included in the control section of the inorganic photoelectric conversion section 32B. Further, there are provided a reset transistor TR3rst, an amplifier transistor TR3amp, and a selection transistor TR3sel. The reset transistor TR3rst, the amplifier transistor TR3amp, and the selection transistor TR3sel are included in the control section of the inorganic photoelectric conversion section 32R.

The reset transistor TR2rst includes a gate, a channel formation region, and a source/drain region. The gate of the reset transistor TR2rst is coupled to a reset line RST2 and the one source/drain region of the reset transistor TR2rst is coupled to the power supply line VDD. The other source/drain region of the reset transistor TR2rst also serves as the floating diffusion FD2.

The amplifier transistor TR2amp includes a gate, a channel formation region, and a source/drain region. The gate is coupled to the other source/drain region (the floating diffusion FD2) of the reset transistor TR2rst. The one source/drain region included in the amplifier transistor TR2amp shares a region with the one source/drain region included in the reset transistor Tr2rst and is coupled to the power supply line VDD.

The selection transistor TR2sel includes a gate, a channel formation region, and a source/drain region. The gate is coupled to a selection line SEL2. The one source/drain region included in the selection transistor TR2sel shares a region with the other source/drain region included in the amplifier transistor TR2amp. The other source/drain region included in the selection transistor TR2sel is coupled to a signal line (a data output line) VSL2.

The reset transistor TR3rst includes a gate, a channel formation region, and a source/drain region. The gate of the reset transistor TR3rst is coupled to a reset line RST3 and the one source/drain region included in the reset transistor TR3rst is coupled to the power supply line VDD. The other source/drain region included in the reset transistor TR3rst also serves as the floating diffusion FD3.

The amplifier transistor TR3amp includes a gate, a channel formation region, and a source/drain region. The gate is coupled to the other source/drain region (the floating diffusion FD3) included in the reset transistor TR3rst. The one source/drain region included in the amplifier transistor TR3amp shares a region with the one source/drain region included in the reset transistor Tr3rst and is coupled to the power supply line VDD.

The selection transistor TR3sel includes a gate, a channel formation region, and a source/drain region. The gate is coupled to a selection line SEL3. The one source/drain region included in the selection transistor TR3sel shares a region with the other source/drain region included in the amplifier transistor TR3amp. The other source/drain region included in the selection transistor TR3sel is coupled to a signal line (a data output line) VSL3.

The reset lines RST1, RST2, and RST3, the selection lines SEL1, SEL2, and SEL3, and the transfer gate lines TG2 and TG3 are each coupled to a vertical drive circuit included in a drive circuit. The signal lines (the data output lines) VSL1, VSL2, and VSL3 are coupled to a column signal processing circuit included in the drive circuit.

The lower first contact 45, the lower second contact 46, the upper first contact 29A, the upper second contact 29B, and an upper third contact 29C each include, for example, a doped silicon material such as PDAS (Phosphorus Doped Amorphous Silicon) or a metal material such as aluminum (Al), tungsten (W), titanium (Ti), cobalt (Co), hafnium (Hf), or tantalum (Ta).

(1-2. Method of Manufacturing Imaging Element)

It is possible to manufacture the imaging element 10A according to the present embodiment, for example, as follows.

FIGS. 6 to 10 illustrate a method of manufacturing the imaging element 10A in the order of steps. First, as illustrated in FIG. 6, for example, the p well 31 is formed as a well of a first electrical conduction type in the semiconductor substrate 30. The inorganic photoelectric conversion sections 32B and 32R of a second electrical conduction type (e.g., an n type) are formed in this p well 31. A p+ region is formed near the first surface (the surface 30S1) of the semiconductor substrate 30.

As also illustrated in FIG. 6, for example, n+ regions that serve as the floating diffusions FD1 to FD3 are formed on the second surface (the surface 30S2) of the semiconductor substrate 30 and a gate insulating layer 33 and a gate wiring layer 47 are then formed. The gate wiring layer 47 includes the respective gates of the transfer transistor Tr2, the transfer transistor Tr3, the selection transistor SEL, the amplifier transistor AMP, and the reset transistor RST. This forms the transfer transistor Tr2, the transfer transistor Tr3, the selection transistor SEL, the amplifier transistor AMP, and the reset transistor RST. Further, the multilayer wiring layer 40 is formed on the second surface (the surface 30S2) of the semiconductor substrate 30. The multilayer wiring layer 40 includes the wiring layers 41 to 43 and the insulating layer 44. The wiring layers 41 to 43 include the lower first contact 45, the lower second contact 46, and the coupling section 41A.

As the base of the semiconductor substrate 30, for example, an SOI (Silicon on Insulator) substrate is used in which the semiconductor substrate 30, a buried oxide film (not illustrated), and a holding substrate (not illustrated) are stacked. Although not illustrated in FIG. 6, the buried oxide film and the holding substrate are joined to the first surface (the surface 30S1) of the semiconductor substrate 30. After ion implantation, annealing treatment is performed.

Next, a support substrate (not illustrated), another semiconductor base, or the like is joined to the second surface (the surface 30S2) side (the multilayer wiring layer 40 side) of the semiconductor substrate 30 and flipped vertically. Subsequently, the semiconductor substrate 30 is separated from the buried oxide film and the holding substrate of the SOI substrate to expose the first surface (the surface 30S1) of the semiconductor substrate 30. It is possible to perform the steps described above with technology used in a normal CMOS process such as ion implantation and CVD (Chemical Vapor Deposition).

Next, as illustrated in FIG. 7, the semiconductor substrate 30 is processed from the first surface (the surface 30S1) side, for example, by dry etching to form, for example, the annular through hole 30H. As illustrated in FIG. 7, the depth of the through hole 30H extends from the first surface (the surface 30S1) to the second surface (the surface 30S2) of the semiconductor substrate 30 and reaches, for example, the coupling section 41A.

Subsequently, as illustrated in FIG. 8, the dielectric film 26 is formed on the first surface (the surface 30S1) of the semiconductor substrate 30 and the side surface of the through hole 30H by using, for example, an atomic layer deposition (Atomic Layer Deposition; ALD) method. This forms the continuous dielectric film 26 on the first surface (the surface 30S1) of the semiconductor substrate 30 and the side surface and the bottom surface of the through hole 30H. Next, the insulating film 27 is formed on the first surface (the surface 30S1) of the semiconductor substrate 30 and in the through hole 30H. After that, the insulating film 27 and the dielectric film 26 formed on the bottom surface of the through hole 30H are removed, for example, by dry etching to expose the coupling section 41A. It is to be noted that the insulating film 27 on the first surface (the surface 30S1) is also decreased in thickness in this case. Subsequently, an electrically conductive film is formed on the insulating film 27 and in the through hole 30H. After that, a photoresist PR is formed at a predetermined position on the electrically conductive film. Next, the through electrode 34 that includes a protruding section on the first surface (the surface 30S1) of the semiconductor substrate 30 is formed by etching and removing the photoresist PR.

Next, as illustrated in FIG. 9, an insulating film included in the interlayer insulating layer 28 is formed on the insulating film 27 and the through electrode 34. Subsequently, the upper first contact 29A, the pad sections 39A and 39B, the upper second contact 29B, and the upper third contact 29C are formed on the through electrode 34 and the like and the front surface of the interlayer insulating layer 28 is then planarized by using a CMP (Chemical Mechanical Polishing) method. Next, an electrically conductive film 21x is formed on the interlayer insulating layer 28. After that, the photoresist PR is formed at a predetermined position of the electrically conductive film 21x.

Subsequently, as illustrated in FIG. 10, the readout electrode 21A and the accumulation electrode 21B are formed by etching and removing the photoresist PR.

After that, the insulating layer 22 is formed on the interlayer insulating layer 28, the readout electrode 21A, and the accumulation electrode 21B and the opening 22H is then provided on the readout electrode 21A. Next, the semiconductor layer 23, the photoelectric conversion layer 24, and the upper electrode 25 are formed in order on the insulating layer 22. Finally, the protective layer 51, the light shielding film 52, and the on-chip lens 53 are provided on the upper electrode 25. As described above, the imaging element 10A illustrated in FIG. 1 is completed.

It is to be noted that, in a case where the semiconductor layer 23 and another organic layer are formed by using organic materials, it is preferable that the semiconductor layer 23 and the other organic layer be formed continuously (in an in-situ vacuum process) in a vacuum step. In addition, the method of forming the photoelectric conversion layer 24 is not necessarily limited to a technique that uses a vacuum evaporation method. Another method, for example, spin coating technology, printing technology, or the like may be used. Further, a method of forming transparent electrodes (the lower electrode 21 and the upper electrode 25) includes, depending on materials included in the transparent electrodes, a physical vapor deposition method (a PVD method) such as a vacuum evaporation method, a reactive evaporation method, a variety of sputtering methods, an electron beam evaporation method, and an ion plating method, a pyrosol method, a method of pyrolyzing an organic metal compound, a spraying method, a dip method, a variety of chemical vapor deposition methods (CVD methods) including a MOCVD method, an electroless plating method, and an electroplating method.

In a case where light enters the organic photoelectric conversion section 20 through the on-chip lens 53 in the imaging element 10A, the light passes through the organic photoelectric conversion section 20 and the inorganic photoelectric conversion sections 32B and 32R in this order. While the light passes through the organic photoelectric conversion section 20 and the inorganic photoelectric conversion sections 32B and 32R, the light is photoelectrically converted for each of green light, blue light, and red light. The following describes operations of acquiring signals of the respective colors.

(Acquisition of Blue Color Signal by Organic Photoelectric Conversion Section 20)

First, the green light of the pieces of light having entered the imaging element 10A is selectively detected (absorbed) and photoelectrically converted by the organic photoelectric conversion section 20.

The organic photoelectric conversion section 20 is coupled to the gate Gamp of the amplifier transistor AMP and the floating diffusion FD1 through the through electrode 34. The electrons of the electron-hole pairs generated in the organic photoelectric conversion section 20 are thus extracted from the lower electrode 21 side, transferred to the second surface (the surface 30S2) side of the semiconductor substrate 30 through the through electrode 34, and accumulated in the floating diffusion FD1. At the same time as this, the amplifier transistor AMP modulates the amount of electric charge generated in the organic photoelectric conversion section 20 to voltage.

In addition, the reset gate Grst of the reset transistor RST is disposed next to the floating diffusion FD1. This causes the reset transistor RST to reset the electric charge accumulated in the floating diffusion FD1.

Here, the organic photoelectric conversion section 20 is coupled to not only the amplifier transistor AMP, but also the floating diffusion FD1 through the through electrode 34, allowing the reset transistor RST to easily reset the electric charge accumulated in the floating diffusion FD1.

In contrast, in a case where the through electrode 34 and the floating diffusion FD1 are not coupled, it is difficult to reset the electric charge accumulated in the floating diffusion FD1. Large voltage has to be applied to pull out the electric charge to the upper electrode 25 side. The photoelectric conversion layer 24 may be thus damaged. In addition, a structure that allows for resetting in a short period of time leads to increased dark-time noise and results in a trade-off. This structure is thus difficult.

FIG. 11 illustrates an operation example of the imaging element 10A. (A) illustrates the potential at the accumulation electrode 21B, (B) illustrates the potential at the floating diffusion FD1 (the readout electrode 21A), and (C) illustrates the potential at the gate (Gsel) of the reset transistor TR1rst. In the imaging element 10A, voltage is individually applied to the readout electrode 21A and the accumulation electrode 21B.

In the imaging element 10A, a drive circuit applies a potential V1 to the readout electrode 21A and applies a potential V2 to the accumulation electrode 21B in an accumulation period. Here, it is assumed that the potentials V1 and V2 satisfy V2>V1. This causes the electric charge (the signal charge; electrons) generated by photoelectric conversion to be drawn to the accumulation electrode 21B and accumulated in the region of the semiconductor layer 23 opposed to the accumulation electrode 21B (the accumulation period). Incidentally, the potential of the region of the semiconductor layer 23 opposed to the accumulation electrode 21B has a value that is more negative with the passage of time of photoelectric conversion. It is to be noted that holes are sent from the upper electrode 25 to the drive circuit.

In the imaging element 10A, a reset operation is performed in the second portion of the accumulation period. Specifically, at a timing t1, a scanning section changes the voltage of a reset signal RST from the low level to the high level. This turns on the reset transistor TR1rst in the unit pixel P. As a result, the voltage of the floating diffusion FD1 is set at power supply voltage and the voltage of the floating diffusion FD1 is reset (a reset period).

After the reset operation is completed, the electric charge is read out. Specifically, the drive circuit applies a potential V3 to the readout electrode 21A and applies a potential V4 to the accumulation electrode 21B at a timing t2. Here, it is assumed that the potentials V3 and V4 satisfy V3<V4. This causes the electric charge accumulated in the region corresponding to the accumulation electrode 21B to be read out from the readout electrode 21A to the floating diffusion FD1. In other words, the electric charge accumulated in the semiconductor layer 23 is read out to the control section (a transfer period).

After the readout operation is completed, the drive circuit applies the potential V1 to the readout electrode 21A and applies the potential V2 to the accumulation electrode 21B again. This causes the electric charge generated by photoelectric conversion to be drawn to the accumulation electrode 21B and accumulated in the region of the photoelectric conversion layer 24 opposed to the accumulation electrode 21B (the accumulation period).

(Acquisition of Blue Color Signal and Red Color Signal by Inorganic Photoelectric Conversion Sections 32B and 32R)

Subsequently, the blue light and the red light of the pieces of light having passed through the organic photoelectric conversion section 20 are respectively absorbed and photoelectrically converted in order by the inorganic photoelectric conversion section 32B and the inorganic photoelectric conversion section 32R. In the inorganic photoelectric conversion section 32B, the electrons corresponding to the incident blue light are accumulated in an n region of the inorganic photoelectric conversion section 32B and the accumulated electrons are transferred to the floating diffusion FD2 by the transfer transistor Tr2. Similarly, in the inorganic photoelectric conversion section 32R, the electrons corresponding to the incident red light are accumulated in an n region of the inorganic photoelectric conversion section 32R and the accumulated electrons are transferred to the floating diffusion FD3 by the transfer transistor Tr3.

(1-3. Workings and Effects)

In the imaging element 10A according to the present embodiment, an organic layer (e.g., the photoelectric conversion layer 24) included in the organic photoelectric conversion section 20 is formed by using the compound represented by the general formula (1) described above that includes hydrogen atoms at the first position (R1) and the seventh position (R4). This makes it possible to obtain an imaging element having high selectivity with respect to a desired wavelength band (e.g., a green band). The following describes this.

In recent years, image sensors have pixels miniaturized and have been requested to have higher sensitivity. For this, a photoelectric conversion element has been developed that includes an organic layer containing the compound represented by the general formula (2) which includes alkyl groups such as methyl groups at R1 and R4 as described above.

Although described in detail below, the photoelectric conversion element including an organic layer containing the compound represented by the general formula (2) described above has, however, insufficient selectivity (color selectivity) with respect to a desired wavelength band (e.g., a green band). The photoelectric conversion element is requested to have higher color selectivity.

In contrast, for example, the photoelectric conversion layer 24 is formed by using the compound represented by the general formula (1) including hydrogen atoms at R1 and R4 in the imaging element 10A according to the present embodiment. Although described in detail in working examples described below, the compound represented by the general formula (1) has a greater difference for $\lambda 1-\lambda 2$ than that of the compound represented by the general formula (2) described above. $\lambda 1$ represents the excitation wavelength for transition from a ground state S0 to the oscillation state of a first excited state S1 (S0→S1). $\lambda 2$ represents the excitation wavelength for transition from the ground state S0 to the oscillation state of a second excited state (S0→S2). This causes the imaging element 10A to have high selectivity with respect to a desired wavelength band (e.g., a green band).

As described above, it is possible in the present embodiment to provide the imaging element 10A that has high color selectivity and excellent spectral characteristics and the imaging device 1 including this.

Next, second and third embodiments of the present disclosure are described. The following assigns the same signs to components similar to those of the first embodiment described above and omits descriptions thereof as appropriate.

2. Second Embodiment

FIG. 12 illustrates a cross-sectional configuration of an imaging element (an imaging element 10C) according to a second embodiment of the present disclosure. The imaging element 10C is included, for example, in one pixel (the unit pixel P) of an imaging device (the imaging device 1) such as a CMOS image sensor used for an electronic apparatus such as a digital still camera or a video camera. The imaging element 10C according to the present embodiment includes the two organic photoelectric conversion sections 20 and 70 and one inorganic photoelectric conversion section 32 that are stacked in the vertical direction.

The organic photoelectric conversion sections 20 and 70 and the inorganic photoelectric conversion section 32 each perform photoelectric conversion by selectively detecting light in a wavelength band. Specifically, for example, the organic photoelectric conversion section 20 acquires a color signal of green (G) as in the first embodiment described above. The organic photoelectric conversion section 70 acquires, for example, a color signal of blue (B). The inorganic photoelectric conversion section 32 acquires, for example, a color signal of red (R). This allows the imaging element 10C to acquire a plurality of types of color signals in one pixel without using any color filters.

The organic photoelectric conversion section 70 is stacked, for example, above the organic photoelectric conversion section 20. As with the organic photoelectric conversion section 20, the organic photoelectric conversion section 70 has a configuration in which a lower electrode 71, a semiconductor layer 73, a photoelectric conversion layer 74, and an upper electrode 75 are stacked in this order from the first surface (the surface 30S1) side of the semiconductor substrate 30. In addition, there is provided an insulating layer 72 between the lower electrode 71 and the semiconductor layer 73. The lower electrodes 71 are separately formed, for example, for the respective imaging elements 10C. Although described in detail below, each of the lower electrodes 71 includes a readout electrode 71A and an accumulation electrode 71B that are separated from each other with the insulating layer 72 interposed in between. The readout electrode 71A of the lower electrode 71 is electrically coupled to the photoelectric conversion layer 74 through an opening 72H provided in the insulating layer 72. FIG. 12 illustrates an example in which the semiconductor layers 73, the photoelectric conversion layers 74, and the upper electrodes 75 are separately formed for the respective imaging elements 10C. For example, the semiconductor layers 73, the photoelectric conversion layers 74, and the upper electrodes 75 may be, however, formed as continuous layers common to the plurality of imaging elements 10C.

The photoelectric conversion layer 74 converts light energy to electric energy. As with the photoelectric conversion layer 24, the photoelectric conversion layer 74 includes two or more types of organic materials that each function as a p-type semiconductor or an n-type semiconductor. The photoelectric conversion layer 74 further includes an organic material or a so-called dye material in addition to a p-type semiconductor and an n-type semiconductor. The organic material or the dye material photoelectrically converts light in a predetermined wavelength band and transmits light in another wavelength band. In a case where the photoelectric conversion layer 74 is formed by using three types of organic materials including a p-type semiconductor, an n-type semiconductor, and a dye material, the p-type semiconductor and the n-type semiconductor are preferably materials having light transmissivity in a visible region (e.g., 400 nm to 700 nm). The photoelectric conversion layer 74 has, for example, a thickness of 25 nm or more and 400 nm or less. Preferably, the photoelectric conversion layer 74 has a thickness of 50 nm or more and 350 nm or less. More preferably, the photoelectric conversion layer 74 has a thickness of 150 nm or more and 300 nm or less. Examples of the dye material used for the photoelectric conversion layer 74 include coumarin and a diazo compound, derivatives thereof, or the like.

There are provided two through electrodes 34X and 34Y between the first surface (the surface 30S1) and the second surface (the surface 30S2) of the semiconductor substrate 30.

As in the first embodiment described above, the through electrode 34X is electrically coupled to the readout electrode 21A of the organic photoelectric conversion section 20 and the organic photoelectric conversion section 20 is coupled to the gate Gamp of the amplifier transistor AMP and one source/drain region 36B1 of the reset transistor RST (the reset transistor Tr1rst) through the through electrode 34X. The one source/drain region 36B1 of the reset transistor RST (the reset transistor Tr1rst) also serves as the floating diffusion FD1. The upper end of the through electrode 34X is coupled to the readout electrode 21A, for example, through the upper first contact 29A, the pad section 39A, and the upper second contact 29B.

The through electrode 34Y is electrically coupled to the readout electrode 71A of the organic photoelectric conversion section 70 and the organic photoelectric conversion section 70 is coupled to the gate Gamp of the amplifier transistor AMP and one source/drain region 36B2 of the reset transistor RST (the reset transistor Tr2rst) through the through electrode 34Y. The one source/drain region 36B2 of the reset transistor RST (the reset transistor Tr2rst) also serves as the floating diffusion FD2. The upper end of the through electrode 34Y is coupled to the readout electrode 71A, for example, through an upper fourth contact 79A, a pad section 69A, an upper fifth contact 79B, a pad section 69B, and an upper sixth contact 79C. In addition, a pad 69C is coupled to the accumulation electrode 71B of the lower electrode 71 through an upper seventh contact 79D. The lower electrode 71 is included in the organic photoelectric conversion section 70.

As described above, the imaging element 10C according to the present embodiment has a configuration in which the two organic photoelectric conversion sections 20 and 70 and the one inorganic photoelectric conversion section 32 are stacked. As in the first embodiment described above, for example, the photoelectric conversion layer 24 included in the organic photoelectric conversion section 20 that acquires a color signal of green (G) is formed by using the compound represented by the general formula (1) described above. This makes it possible to obtain effects similar to those of the first embodiment described above.

3. Third Embodiment

FIG. 13 illustrates a cross-sectional configuration of an imaging element (an imaging element 10D) according to a third embodiment of the present disclosure. The imaging element 10D is included, for example, in one pixel (the unit pixel P) of the imaging device 1 such as a CMOS (Complementary Metal Oxide Semiconductor) image sensor used for an electronic apparatus such as a digital still camera or a video camera. The imaging element 10D according to the present embodiment has a configuration in which a red photoelectric conversion section 90R, a green photoelectric conversion section 90G, and a blue photoelectric conversion section 90B are stacked above a semiconductor substrate 80 in this order with an insulating layer 96 interposed in between. The red photoelectric conversion section 90R, the green photoelectric conversion section 90G, and the blue photoelectric conversion section 90B are each formed by using an organic material.

The red photoelectric conversion section 90R, the green photoelectric conversion section 90G, and the blue photoelectric conversion section 90B respectively include organic photoelectric conversion layers 92R, 92G, and 92B between pairs of electrodes. Specifically, the red photoelectric conversion section 90R, the green photoelectric conversion section 90G, and the blue photoelectric conversion section 90B respectively include the organic photoelectric conversion layers 92R, 92G, and 92B between a first electrode 91R and a second electrode 93R, between a first electrode 91G and a second electrode 93G, and between a first electrode 91B and a second electrode 93B.

There is provided an on-chip lens 98L above the blue photoelectric conversion section 90B with a protective layer 97 and an on-chip lens layer 98 interposed in between. There are provided a red electricity storage layer 810R, a green electricity storage layer 810G, and a blue electricity storage layer 810B in the semiconductor substrate 80. Light having entered the on-chip lens 98L is photoelectrically converted by the red photoelectric conversion section 90R, the green photoelectric conversion section 90G, and the blue photoelectric conversion section 90B and signal charge is transmitted from the red photoelectric conversion section 90R to the red electricity storage layer 810R, from the green photoelectric conversion section 90G to the green electricity storage layer 810G, and from the blue photoelectric conversion section 90B to the blue electricity storage layer 810B. Although the signal charge may be either electrons or holes generated by photoelectric conversion, the following gives description by exemplifying a case where electrons are read out as signal charge.

The semiconductor substrate 80 includes, for example, a p-type silicon substrate. The red electricity storage layer 810R, the green electricity storage layer 810G, and the blue electricity storage layer 810B provided in this semiconductor substrate 80 each include an n-type semiconductor region. The signal charge (the electrons) supplied from the red photoelectric conversion section 90R, the green photoelectric conversion section 90G, and the blue photoelectric conversion section 90B are accumulated in these n-type semiconductor regions. The n-type semiconductor regions of the red electricity storage layer 810R, the green electricity storage layer 810G, and the blue electricity storage layer 810B are formed, for example, by doping the semiconductor substrate 80 with n-type impurities such as phosphorus (P) or arsenic (As). It is to be noted that the semiconductor substrate 80 may be provided on a support substrate (not illustrated) including glass or the like.

The semiconductor substrate 80 is provided with pixel transistors. The respective pixel transistors are for reading out electrons from the red electricity storage layer 810R, the green electricity storage layer 810G, and the blue electricity storage layer 810B and transferring the electrons, for example, to vertical signal lines (e.g., vertical signal lines Lsig in FIG. 14 described below). Floating diffusions of these pixel transistors are provided in the semiconductor substrate 80. These floating diffusions are coupled to the red electricity storage layer 810R, the green electricity storage layer 810G, and the blue electricity storage layer 810B. Each of the floating diffusions includes an n-type semiconductor region.

The insulating layer 96 includes, for example, a single layer film including one of silicon oxide ($SiO_x$), silicon nitride ($SiN_x$), silicon oxynitride (SiON), hafnium oxide ($HfO_x$), and the like or a stacked film including two or more of them. In addition, the insulating layer 96 may be formed by using an organic insulating material. Although not illustrated, the insulating layer 96 is provided with plugs and electrodes. The respective plugs are for coupling the red electricity storage layer 810R and the red photoelectric conversion section 90R, the green electricity storage layer 810G and the green photoelectric conversion section 90G, and the blue electricity storage layer 810B and the blue photoelectric conversion section 90B.

The red photoelectric conversion section 90R includes the first electrode 91R, the organic photoelectric conversion layer 92R, and the second electrode 93R in this order from positions closer to the semiconductor substrate 80. The green photoelectric conversion section 90G includes the first electrode 91G, the organic photoelectric conversion layer 92G, and the second electrode 93G in this order from positions closer to the red photoelectric conversion section 90R. The blue photoelectric conversion section 90B includes the first electrode 91B, the organic photoelectric conversion layer 92B, and the second electrode 93B in this order from positions closer to the green photoelectric conversion section 90G. There is further provided an insulating layer 94 between the red photoelectric conversion section 90R and the green photoelectric conversion section 90G and there is further provided an insulating layer 95 between the green photoelectric conversion section 90G and the blue photoelectric conversion section 90B. The red photoelectric conversion section 90R, the green photoelectric conversion section 90G, and the blue photoelectric conversion section 90B respectively absorb selectively red (e.g., a wavelength of 600 nm or more and less than 700 nm) light, green (e.g., a wavelength of 500 nm or more and less than 600 nm) light, and blue (e.g., a wavelength of 400 or more and less than 500 nm) light to generate electron-hole pairs.

The first electrode 91R, the first electrode 91G, and the first electrode 91B respectively extract the signal charge generated in the organic photoelectric conversion layer 92R, the signal charge generated in the organic photoelectric conversion layer 92G, and the signal charge generated in the organic photoelectric conversion layer 92B. The first electrodes 91R, 91G, and 91B are provided, for example, for each pf the pixels.

Each of the first electrodes 91R, 91G, and 91B includes, for example, an electrically conductive material having light transmissivity. Specifically, each of the first electrodes 91R, 91G, and 91B includes ITO. Each of the first electrodes 91R, 91G, and 91B may include, for example, a tin oxide-based material or a zinc oxide-based material. The tin oxide-based material is obtained by doping tin oxide with a dopant. Examples of the zinc oxide-based material include an aluminum zinc oxide in which aluminum is added to zinc oxide as a dopant, a gallium zinc oxide in which gallium is added to zinc oxide as a dopant, an indium zinc oxide in which indium is added to zinc oxide as a dopant, and the like. In addition, it is also possible to use IGZO, CuI, InSbO$_4$, ZnMgO, CuInO$_2$, MgIn$_2$O$_4$, CdO, ZnSnO$_3$, and the like. Each of the first electrodes 91R, 91G, and 91B has, for example, a thickness of 50 nm to 500 nm.

For example, there may be provided electron transport layers between the first electrode 91R and the organic photoelectric conversion layer 92R, between the first electrode 91G and the organic photoelectric conversion layer 92G, and between the first electrode 91B and the organic photoelectric conversion layer 92B. The electron transport layers are for facilitating the electrons generated in the organic photoelectric conversion layers 92R, 92G, and 92B to be supplied to the first electrodes 91R, 91G, and 91B. Each of the electron transport layers includes, for example, titanium oxide, zinc oxide, or the like. Each of the electron transport layers may include a titanium oxide film and a zinc oxide film that are stacked. Each of the electron transport layers has, for example, a thickness of 0.1 nm to 1000 nm. It is preferable that each of the electron transport layers have a thickness of 0.5 nm to 300 nm.

Each of the organic photoelectric conversion layers 92R, 92G, and 92B absorbs light in a selective wavelength band for photoelectric conversion and transmits light in another wavelength band. Here, the light in the selective wavelength band is, for example, light in a wavelength band having a wavelength of 600 nm or more and less than 700 nm for the organic photoelectric conversion layer 92R. The light in the selective wavelength band is, for example, light in a wavelength band having a wavelength of 500 nm or more and less than 600 nm for the organic photoelectric conversion layer 92G. The light in the selective wavelength band is, for example, light in a wavelength band having a wavelength of 400 nm or more and less than 500 nm for the organic photoelectric conversion layer 92B. Each of the organic photoelectric conversion layers 92R, 92G, and 92B has, for example, a thickness of 25 nm or more and 400 nm or less. Preferably, each of the organic photoelectric conversion layers 92R, 92G, and 92B has a thickness of 50 nm or more and 350 nm or less. More preferably, each of the organic photoelectric conversion layers 92R, 92G, and 92B has a thickness of 150 nm or more and 300 nm or less.

Each of the organic photoelectric conversion layers 92R, 92G, and 92B converts light energy to electric energy. As with the photoelectric conversion layer 24, each of the organic photoelectric conversion layers 92R, 92G, and 92B includes two or more types of organic materials that each function as a p-type semiconductor or an n-type semiconductor. Each of the organic photoelectric conversion layers 92R, 92G, and 92B further includes an organic material or a so-called dye material in addition to a p-type semiconductor and an n-type semiconductor. The organic material or the dye material photoelectrically converts light in the predetermined wavelength band described above and transmits light in another wavelength band. Examples of such a material include rhodamine, merocyanine, and derivatives thereof for the organic photoelectric conversion layer 92R. For the organic photoelectric conversion layer 92G, the compound (the BODIPY dye) represented by the general formula (1) described above is mentioned. For the organic photoelectric conversion layer 92B, for example, coumarin, a diazo compound, and a cyanine dye, derivatives thereof, or the like are mentioned.

Examples of another organic material included in each of the organic photoelectric conversion layers 92R, 92G, and 92B include fullerene or a fullerene derivative. Each of the organic photoelectric conversion layers 92R, 92G, and 92B may further include an organic material other than the organic materials described above.

There may be provided other layers between the organic photoelectric conversion layer 92R and the second electrode 93R, between the organic photoelectric conversion layer 92G and the second electrode 93G, and between the organic photoelectric conversion layer 92B and the second electrode 93B as in the first embodiment described above.

The second electrode 93R, the second electrode 93G, and the second electrode 93B are for respectively extracting the holes generated in the organic photoelectric conversion layer 92R, the holes generated in the organic photoelectric conversion layer 92G, and the holes generated in the organic photoelectric conversion layer 92G. The holes extracted from the respective second electrodes 93R, 93G, and 93B are discharged, for example, to p-type semiconductor regions (not illustrated) in the semiconductor substrate 80 through the respective transmission paths (not illustrated).

Each of the second electrodes 93R, 93G, and 93B includes, for example, an electrically conductive material such as gold (Au), silver (Ag), copper (Cu), and aluminum (Al). As with the first electrodes 91R, 91G, and 91B, each of the second electrodes 93R, 93G, and 93B may include a transparent electrically conductive material. In the imaging element 10D, the holes extracted from these second electrodes 93R, 93G, and 93B are discharged. For example, in a case where the plurality of imaging elements 10D is disposed in the imaging device 1 described below, the second electrodes 93R, 93G, and 93B may be thus provided to be common to the respective imaging elements 10D (the unit pixels P). Each of the second electrodes 93R, 93G, and 93B has, for example, a thickness of 0.5 nm or more to 100 nm or less.

The insulating layer 94 is for insulating the second electrode 93R and the first electrode 91G. The insulating layer 95 is for insulating the second electrode 93G and the first electrode 91B. Each of the insulating layers 94 and 95 includes, for example, a metal oxide, a metal sulfide, or an organic substance. Examples of the metal oxide include silicon oxide ($SiO_x$), aluminum oxide ($AlO_x$), zirconium oxide ($ZrO_x$), titanium oxide ($TiO_x$), zinc oxide ($ZnO_x$), tungsten oxide ($WO_x$), magnesium oxide ($MgO_x$), niobium oxide ($NbO_x$), tin oxide ($SnO_x$), gallium oxide ($GaO_x$), and the like. Examples of the metal sulfide include zinc sulfide (ZnS), magnesium sulfide (MgS), and the like. It is preferable that the band gap of a material included in each of the insulating layers 94 and 95 be 3.0 eV or more. Each of the insulating layers 94 and 95 has, for example, a thickness of 2 nm or more and 100 nm or less.

As described above, it is possible to obtain effects similar to those of the first embodiment described above by forming, for example, the organic photoelectric conversion layer 92G by using the compound represented by the general formula (1) described above.

4. Application Examples

Application Example 1

FIG. 14 illustrates an overall configuration of an imaging device (the imaging device 1) in which the imaging element 10A (or any of the imaging elements 10B to 10D) described in the first to third embodiments described above is used for each of the pixels. This imaging device 1 is a CMOS image sensor. The imaging device 1 includes the pixel section 1a as an imaging area and a peripheral circuit portion 130 in a peripheral region of this pixel section 1a on the semiconductor substrate 30. The peripheral circuit portion 130 includes, for example, a row scanning section 131, a horizontal selection section 133, a column scanning section 134, and a system control section 132.

The pixel section 1a includes, for example, the plurality of unit pixels P (each corresponding to the imaging element 10) that is two-dimensionally disposed in a matrix. These unit pixels P are provided with pixel drive lines Lread (specifically, row selection lines and reset control lines). Each of the pixel rows is provided, for example, with the pixel drive line Lread. Each of the pixel columns is provided with the vertical signal line Lsig. The pixel drive lines Lread are for transmitting drive signals for reading out signals from pixels. One end of each of the pixel drive lines Lread is coupled to the output end of the row scanning section 131 corresponding to each row.

The row scanning section 131 is a pixel drive section that includes a shift register, an address decoder, and the like and drives each of the unit pixels P of the pixel section 1a, for example, row by row. Signals outputted from the respective unit pixels P in the pixel rows selectively scanned by the row scanning section 131 are supplied to the horizontal selection section 133 through the respective vertical signal lines Lsig. The horizontal selection section 133 includes an amplifier, a horizontal selection switch, and the like provided for each of the vertical signal lines Lsig.

The column scanning section 134 includes a shift register, an address decoder, and the like and drives the respective horizontal selection switches of the horizontal selection section 133 in order while scanning the horizontal selection switches. The selective scanning by this column scanning section 134 causes signals of the respective pixels transmitted through each of the vertical signal lines Lsig to be outputted to a horizontal signal line 135 in order and causes the signals to be transmitted to the outside of the semiconductor substrate 30 through the horizontal signal line 135.

The circuit portion including the row scanning section 131, the horizontal selection section 133, the column scanning section 134, and the horizontal signal line 135 may be formed directly on the semiconductor substrate 30 or may be provided on external control IC. In addition, the circuit portion thereof may be formed on another substrate coupled by a cable or the like.

The system control section 132 receives a clock supplied from the outside of the semiconductor substrate 30, data for an instruction about an operation mode, and the like and outputs data such as internal information of the imaging device 1. The system control section 132 further includes a timing generator that generates a variety of timing signals and controls the driving of the peripheral circuit such as the row scanning section 131, the horizontal selection section 133, and the column scanning section 134 on the basis of the variety of timing signals generated by the timing generator.

Application Example 2

The imaging device 1 described above is applicable, for example, to any type of electronic apparatus with an imaging function including a camera system such as a digital still camera and a video camera, a mobile phone having an imaging function, and the like. FIG. 15 illustrates a schematic configuration of an electronic apparatus 2 (a camera) as an example thereof. This electronic apparatus 2 is, for example, a video camera that is able to shoot a still image or a moving image. The electronic apparatus 2 includes the imaging device 1, an optical system (an optical lens) 210, a shutter device 211, a drive section 213 that drives the imaging device 1 and the shutter device 211, and a signal processing section 212.

The optical system 210 guides image light (incident light) from a subject to the pixel section 1a of the imaging device 1. This optical system 210 may include a plurality of optical lenses. The shutter device 211 controls a period of time in which the imaging device 1 is irradiated with light and a period of time in which light is blocked. The drive section 213 controls a transfer operation of the imaging device 1 and a shutter operation of the shutter device 211. The signal processing section 212 performs various kinds of signal processing on signals outputted from the imaging device 1. An image signal Dout subjected to the signal processing is stored in a storage medium such as a memory or outputted to a monitor or the like.

5. Practical Application Examples

Further, the imaging device 1 described above is also applicable to the following electronic apparatuses (a capsule type endoscope 10100 and a mobile body such as a vehicle).

(Example of Practical Application to In-Vivo Information Acquisition System)

Further, the technology (the present technology) according to the present disclosure is applicable to a variety of products. For example, the technology according to the present disclosure may be applied to an endoscopic surgery system.

FIG. 16 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 16, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The example of the in-vivo information acquisition system to which the technology according to the present disclosure may be applied has been described above. The technology according to the present disclosure may be applied, for example, to the image pickup unit 10112 among the components described above. This increases the detection accuracy.

(Example of Practical Application to Endoscopic Surgery System)

The technology (the present technology) according to the present disclosure is applicable to a variety of products. For example, the technology according to the present disclosure may be applied to an endoscopic surgery system.

FIG. 17 is a view depicting an example of a schematic configuration of an endoscopic surgery system to which the technology according to an embodiment of the present disclosure (present technology) can be applied.

In FIG. 17, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 18 is a block diagram depicting an example of a functional configuration of the camera head 11102 and the CCU 11201 depicted in FIG. 17.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The example of the endoscopic surgery system to which the technology according to the present disclosure may be applied has been described above. The technology according to the present disclosure may be applied to the image pickup unit 11402 among the components described above. The application of the technology according to the present disclosure to the image pickup unit 11402 increases the detection accuracy.

It is to be noted that the endoscopic surgery system has been described here as an example, but the technology according to the present disclosure may be additionally applied, for example, to a microscopic surgery system or the like.

(Example of Practical Application to Mobile Body)

The technology according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (a tractor).

FIG. 19 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 19, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 19, an audio speaker 12061, a display section 12062, and an instrument panel 12063 are illustrated as the output device. The display section 12062 may, for example, include at least one of an on-board display and a head-up display.

FIG. 20 is a diagram depicting an example of the installation position of the imaging section 12031.

In FIG. 20, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 20 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

6. Working Examples

Next, working examples of the present disclosure are described in detail. In an experiment 1, a quantum chemical calculation of a BODIPY dye was made. In an experiment 2, the spectral characteristics of a BODIPY dye were evaluated. In an experiment 3, a photoelectric conversion element containing a BODIPY dye was fabricated and the electric characteristics thereof were evaluated.

Experiment 1

As the compound (the BODIPY dye) represented by the general formula (1) described above, quantum chemical calculations of the compounds represented by a formula (1-2) to a formula (1-5) were made. In addition, as a comparative example, quantum chemical calculations of the compounds represented by the following formula (2-1) to the formula (2-3) were made. First, the structure optimization for the ground state S0 was performed by using a quantum chemical calculation program (Gaussian). Subsequently, the resultant structure in the ground state S0 was used to make a TD-DFT (Time-Dependent Density Function Theory) calculation. The structure optimization calculation for the ground state S0 was made by using B3LYP/6-31G and the TD-DFT was made by using M062X/6-31+G. The transition state was defined as X. The excitation wavelength λ1 and oscillator strength f1 for transition from the ground state S0 to the oscillation state of the first excited state S1 (S0→S1) and the excitation wavelength λ2 and oscillator strength f2 thereof for transition of the ground state S0 to the oscillation state of the second excited state S2 (S0→S2) were obtained. The second excited state S2 was set as an excited state in which the oscillator strength f2 was 0.01 or more and the excitation wavelength λ2 was the closest to an excitation wavelength r1.

Table 1 tabulates the excitation wavelength λ1 and the oscillator strength f1 of each of the compounds represented by the formula (1-2) to the formula (1-5) and the formula (2-1) to the formula (2-3) for S0→S1, the excitation wavelength λ2 and the oscillator strength f2 thereof for S0→S2, and the difference (λ1−λ2) between the excitation wavelength λ1 and the excitation wavelength λ2. FIG. 21 is a characteristic diagram illustrating the absorption spectrum of the compound represented by the formula (1-5) that is obtained from a quantum scientific calculation. FIG. 22 is a characteristic diagram illustrating the absorption spectrum of the compound represented by the formula (2-1) that is obtained from a quantum scientific calculation. FIG. 23 is a characteristic diagram illustrating the absorption spectrum of the compound represented by the formula (2-2) that is obtained from a quantum scientific calculation. FIG. 24 is a characteristic diagram illustrating the absorption spectrum of the compound represented by the formula (1-2) that is obtained from a quantum scientific calculation. FIG. 25 is a characteristic diagram illustrating the absorption spectrum of the compound represented by a formula (1-3) that is obtained from a quantum scientific calculation. FIG. 26 is a characteristic diagram illustrating the absorption spectrum of the compound represented by a formula (1-4) that is obtained from a quantum scientific calculation. FIG. 27 is a characteristic diagram illustrating the absorption spectrum of the compound represented by the formula (2-3) that is obtained from a quantum scientific calculation. The vertical axis indicates oscillator strength (Oscillator Strength) and the horizontal axis indicates wavelength (nm).

[Chem. 8]

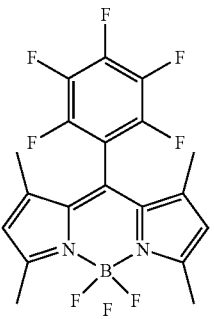

(2-1)

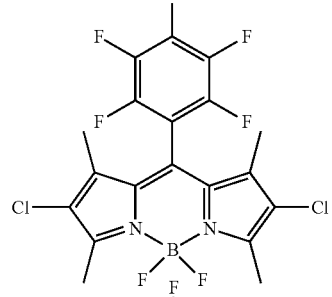

(2-2)

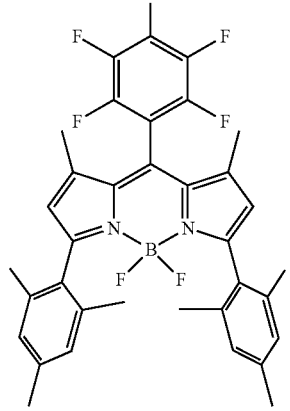

(2-3)

TABLE 1

|  | S0 → S1 | | S0 → S2 | | |
|---|---|---|---|---|---|
|  | excitation wavelength λ1 (nm) | oscillator strength f1 | excitation wavelength λ2 (nm) | oscillator strength f2 | λ1 − λ2 (nm) |
| formula (1-2) | 437 | 0.480 | 317 | 0.063 | 120 |
| formula (1-3) | 462 | 0.520 | 327 | 0.116 | 135 |
| formula (1-4) | 430 | 0.540 | 317 | 0.004 | 113 |
| formula (1-5) | 444 | 0.548 | 317 | 0.072 | 127 |
| formula (2-1) | 435 | 0.517 | 332 | 0.046 | 103 |
| formula (2-2) | 452 | 0.450 | 360 | 0.061 | 92 |
| formula (2-3) | 440 | 0.581 | 334 | 0.050 | 106 |

Table 1 indicates that the compounds represented by the formula (1-2) to the formula (1-5) and the formula (2-1) to the formula (2-3) each exhibits a great oscillator strength f1 of 0.45 to 0.59 in transition from the ground state S0 to the first excited state S1 (S0→S1). The absorption band of the excitation wavelength λ1 determines the wavelength of which of blue, green, and red bands is absorbed by the compounds represented by the formula (1-2) to the formula (1-5) and the formula (2-1) to the formula (2-3).

It is to be noted that the excitation wavelength λ1 of each of the compounds represented by the formula (1-2) to the formula (1-5) and the formula (2-1) to the formula (2-3) ranges from 430 to 462 nm. This corresponds to the wavelength of blue and it seems thus that each of the compounds is a dye that absorbs blue light. However, in a case where a result of the experiment 2 described below is taken into consideration, it seems reasonable that each of the compounds represented by the formula (1-2) to the formula (1-5) and the formula (2-1) to the formula (2-3) is a dye that absorbs green light.

For example, the excitation wavelength $\lambda 1$ of the compound represented by the formula (1-5) is 444 nm, but the maximum absorption wavelength of a thin film of the compound represented by the formula (1-5) that was obtained from the experiment 2 was 548 nm. As can be seen from this result, the excitation wavelength $\lambda 1$ obtained from a quantum chemical calculation and the value of the maximum absorption wavelength of a thin film that was actually fabricated seem to have an offset of about 100 nm. In a case where this offset of about 100 nm is taken into consideration, the maximum absorption wavelength of a thin film of each of the compounds represented by the formula (1-2) to the formula (1-5) and the formula (2-1) to the formula (2-3) ranges from 534 to 566 nm. Each of these compounds therefore seems to be a dye that absorbs green light in fact.

Table 1 and FIG. 21 indicate that the excitation wavelength $\lambda 1$ for transition from the ground state S0 to the oscillation state of the first excited state S1 (S0→S1) is the main absorption band of each of the compounds represented by the formula (1-2) to the formula (1-5) and the formula (2-1) to the formula (2-3) and this absorption band is an absorption band that absorbs green light on a thin film which was actually fabricated as described above. The excitation wavelength $\lambda 2$ for transition from the ground state S0 to the oscillation state of the second excited state S2 (S0→S2) was observed in the compounds represented by the formula (2-1) to the formula (2-3) on a short wavelength side of 92 to 106 nm as compared with transition from the ground state S0 to the first excited state S1 (S0→S1). This indicates that the excitation wavelength $\lambda 2$ for transition from the ground state S0 to the oscillation state of the second excited state S2 (S0→S2) seems to have absorption in a blue wavelength band. It thus seems that the excitation wavelength $\lambda 2$ for transition from the ground state S0 to the oscillation state of the second excited state S2 (S0→S2) causes color selectivity to decrease.

In contrast, the excitation wavelength $\lambda 2$ for transition from the ground state S0 to the oscillation state of the second excited state S2 (S0→S2) was observed in the compounds represented by the formula (1-2) to the formula (1-5) each including hydrogen atoms at the first position and the seventh position on a short wavelength side of 113 to 127 nm as compared with the excitation wavelength $\lambda 1$ for transition from the ground state S0 to the oscillation state of the first excited state S1 (S0→S1). In this way, a compound whose excitation wavelength $\lambda 2$ for transition from the ground state S0 to the oscillation state of the second excited state S2 (S0→S2) is considerably shorter than the excitation wavelength $\lambda 1$ for transition from the ground state S0 to the oscillation state of the first excited state S1 (S0→S1) allows the absorption wavelength from the ground state S0 to the second excited state S2 (S0→S2) to be closer to a short wavelength side than that of a blue band even in a case where the maximum absorption wavelength of a thin film is carried by a green wavelength band. In other words, as in the compounds represented by the formula (1-2) to the formula (1-5), the compound represented by the general formula (1) including hydrogen atoms at the first position and the seventh position clearly has a greater difference ($\lambda 1 - \lambda 2$) between the excitation wavelength $\lambda 1$ and the excitation wavelength $\lambda 2$ and makes it possible to decrease the absorption of a blue band. A comparison between FIGS. 21 to 27 indicates that the compounds represented by the formula (1-2) to the formula (1-5) have less absorption of a blue region than the compounds represented by the formula (2-1) to the formula (2-3).

Experiment 2

The spectral characteristics of the compounds represented by the formula (1-5), the formula (2-1), and the formula (2-2) were evaluated by using the following method. First, the compounds represented by the formula (1-5), the formula (2-1), and the formula (2-2) were each evaporated on a glass substrate by using an organic evaporation machine in a resistive heating method under a vacuum condition of $1 \times 10^{-5}$ Pa or less while rotating a substrate holder. The glass substrate was cleaned by UV/ozone treatment. Evaporation was performed with an evaporation speed of 0.1 nm/second to offer a film thickness of 50 nm. This was used as a sample for the spectral characteristics of a single film of a BODIPY dye.

The spectral characteristics were obtained from the absorptivity (%) of light absorbed each single film by measuring the transmittance and the reflectance of a wavelength band of 350 to 700 nm for each of the wavelengths with an ultraviolet and visible spectrophotometer. A linear absorption coefficient (cm$^{-1}$) for the wavelength of each single film was evaluated on the basis of the Lambert-Beer law by using this absorptivity of light and the film thickness of the single film as parameters.

FIG. 28 illustrates the absorption spectra of the compounds represented by the formula (1-5), the formula (2-1), and the formula (2-2). Table 2 tabulates the maximum absorption wavelengths (nm), the maximum linear absorption coefficients (cm$^{-1}$), and the linear absorption coefficients (cm$^{-1}$) of the compounds represented by the formula (1-5), the formula (2-1), and the formula (2-2) on wavelengths of 400 nm, 420 nm, 440 nm, 450 nm, 460 nm, 600 nm, and 650 nm and the ratios between the linear absorption coefficients and the maximum linear absorption coefficients on these wavelengths.

TABLE 2

|  | maximum absorption wavelength (nm) | maximum linear absorption coefficient (cm$^{-1}$) | linear absorption coefficients (cm$^{-1}$) on respective wavelengths | | | | | | |
|---|---|---|---|---|---|---|---|---|---|
|  |  |  | 400 nm | 420 nm | 440 nm | 450 nm | 460 nm | 600 nm | 650 nm |
| formula (1-5) | 548 | 216040 | 21189 (0.028) | 9748 (0.045) | 6007 (0.027) | 8010 (0.037) | 12954 (0.060) | 844 (0.0039) | 335 (0.0015) |
| formula (2-1) | 584 | 161398 | 38626 (0.24) | 24933 (0.15) | 31534 (0.20) | 38171 (0.24) | 46838 (0.29) | 107453 (0.67) | 32099 (0.19) |
| formula (2-2) | 567 | 242348 | 65505 (0.27) | 56002 (0.23) | 31322 (0.13) | 24023 (0.10) | 22423 (0.092) | 51808 (0.21) | 153537 (0.06) |

FIG. 28 and Table 2 indicate that the compounds represented by the formula (1-5), the formula (2-1), and the formula (2-2) are materials that have high maximum linear absorption coefficients of $1\times10^4$ cm-1 or more and are suitable to efficiently absorb visible light. In particular, it is clear that the compounds represented by the formula (1-5) and the formula (2-2) are materials that have high maximum linear absorption coefficients of $2\times10^4$ cm-1 or more and are suitable to considerably efficiently absorb visible light. Further, it was found that the compound represented by the formula (1-5) had low linear absorption coefficients on wavelengths of 350 to 460 nm and 600 to 650 nm and was able to selectively absorb the wavelength of a predetermined band.

In addition, the compound represented by the formula (1-5) had a maximum absorption wavelength of 548 nm, the compound represented by the formula (2-1) had a maximum absorption wavelength of 584 nm, and the compound represented by the formula (2-2) had a maximum absorption wavelength of 564 nm. This indicates that these compounds absorb green light.

Further, any of the compounds represented by the formula (1-5), the formula (2-1), and the formula (2-2) had a linear absorption coefficient that is a half or less of the maximum linear absorption coefficients on wavelengths of 400 nm, 420 nm, 440 nm, 450 nm, and 460 nm each of which is a visible light wavelength on a short wavelength side as compared with a green wavelength band. Among them, the linear absorption coefficient of the compound represented by the formula (1-5) was ten percent or less. In addition, any of the compounds represented by the formula (1-5), the formula (2-1), and the formula (2-2) had a linear absorption coefficient that is a half or less of the maximum linear absorption coefficients on wavelengths of 600 nm and 650 nm each of which is a visible light wavelength on a long wavelength side as compared with a green wavelength band. Among them, the linear absorption coefficient of the compound represented by the formula (1-5) was one percent or less. This indicates that the compound represented by the formula (1-5) selectively absorbs the wavelength of a predetermined band more than the compounds represented by the formula (2-1) and the formula (2-2).

It is possible to explain from a result obtained from the experiment 1 why the linear absorption coefficient of the compound represented by the formula (1-5) for a blue band is lower than those of the compounds represented by the formula (2-1) and the formula (2-2). In other words, this seems to be because the compound represented by the general formula (1) including hydrogen atoms at the first position and the seventh position has a great difference (S1-S2) between the first excited state S1 and the second excited state S2 and has less absorption of a blue band.

The linear absorption coefficient of the compound represented by the formula (1-5) for a red band is lower than those of the compounds represented by the formula (2-1) and the formula (2-2) apparently because of lower cohesiveness.

Experiment 3

Experimental Example 1

First, a glass substrate provided with an ITO electrode (a lower electrode) having a film thickness of 50 nm was cleaned by UV/ozone treatment. Subsequently, the glass substrate was moved to a vacuum evaporation machine. An organic layer was formed on the glass substrate by using a resistive heating method in a reduced pressure condition of $1\times10^{-5}$ Pa or less while a substrate holder is rotated. First, a film of the compound represented by the following formula (4) was formed at an evaporation speed of 1 Å/sec to have a thickness of 5 nm. Subsequently, a $C_{60}$ fullerene (formula (5)), the compound represented by the formula (1-5), and BP-rBDT (formula (6)) were co-evaporated to form a photoelectric conversion layer. These were evaporated at speeds of 0.025 nm/second (formula (5)), 0.050 nm/second (formula (1-5)), and 0.050 nm/second (formula (6)) to form a layer having a total thickness of 230 nm. This offered a photoelectric conversion layer having a composition ratio of 20 vol % (formula (5)):40 vol % (formula (1-5)):40 vol % (formula (6)). Next, a layer of the compound represented by the following formula (7) was formed as a hole blocking layer at an evaporation speed of 0.3 Å/sec to have a thickness of 5 nm. Subsequently, an AlSiCu film was formed on the hole blocking layer in an evaporation method to have a film thickness of 100 nm and this was used as an upper electrode. As described above, a photoelectric conversion element was fabricated including a photoelectric conversion region of 1 mm×1 mm.

[Chem. 9]

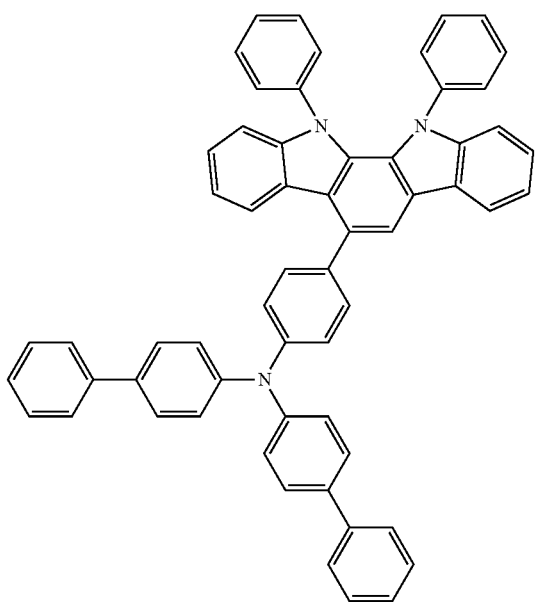

(4)

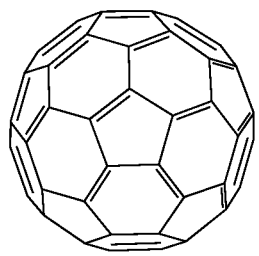

(5)

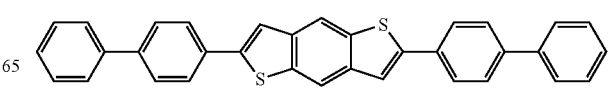

(6)

-continued (7)

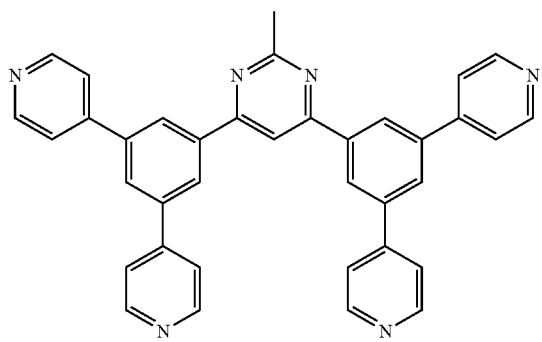

Experimental Example 2

Except for the use of the compound represented by the formula (2-1) described above in place of the compound represented by the formula (1-5) used in the experimental example 1, a method similar to that of the experimental example 1 was used to fabricate a photoelectric conversion element (experimental example 2).

Experimental Example 3

Except for the use of the compound represented by the formula (2-2) described above in place of the compound represented by the formula (1-5) used in the experimental example 1, a method similar to that of the experimental example 1 was used to fabricate a photoelectric conversion element (experimental example 3).

The external quantum efficiency (EQE) and the dark current characteristics of each of the photoelectric conversion elements fabricated in the experimental examples 1 to 3 were evaluated by using the following method.

The EQE and the dark current characteristics were evaluated by using a semiconductor parameter analyzer. Specifically, a current value (a bright current value) obtained in a case where the photoelectric conversion element was irradiated with a light amount of 1.62 µW/cm$^2$ from a light source through a filter and a bias voltage of −2.6 V was applied between electrodes and a current value (a dark current value) obtained in a case where the photoelectric conversion element was irradiated with a light amount of 0 µW/cm$^2$ were each measured. The EQE and the dark current characteristics were calculated from these values. As the wavelength of the light with which the element was irradiated, the wavelength corresponding to the maximum absorption wavelength of each organic photoelectric conversion layer in the visible range was selected. As the irradiation wavelength of light, 530 nm, 560 nm, and 560 nm were selected in the order of the experimental example 1, the experimental example 2, and the experimental example 3.

TABLE 3

| | configuration of photoelectric | electric characteristics | |
| --- | --- | --- | --- |
| | conversion layer | EQE | dark current |
| experimental example 1 | C$_{60}$/formula (1-5)/BP-rBDT | 1.8 | 0.1 |
| experimental example 2 | C$_{60}$/formula (2-1)/BP-rBDT | 1.0 | 1.0 |
| experimental example 3 | C$_{60}$/formula (2-2)/BP-rBDT | 1.6 | 0.4 |

Table 3 tabulates the configurations, the EQE, and the dark current characteristics of the photoelectric conversion layers in the experimental example 1 to the experimental example 3. It is to be noted that the EQE described in Table 3 is a relative value in a case where the experimental example 2 is used as a reference (1.0).

Table 3 indicates that the experimental example 1 in which the compound represented by the formula (1-5) was used has higher EQE and more excellent dark current characteristics than those of the experimental example 2 and the experimental example 3. This indicates that the use of the compound represented by the general formula (1) including hydrogen atoms at the first position and the seventh position makes it possible to obtain favorable EQE and dark current characteristics. In addition, a result of the experiment 2 obviously indicates that the photoelectric conversion layer used in the experimental example 1 is able to selectively absorb the wavelength of a predetermined band. As described above, it was found that a photoelectric conversion layer including the compound represented by the general formula (1) including hydrogen atoms at the first position and the seventh position made it possible to fabricate an imaging element that had more favorable electric characteristics and more excellent color selectivity than those of a general imaging element.

Although the description has been given with reference to the first to third embodiments, the working examples, and the application examples, the contents of the present disclosure are not limited to the embodiment or the like described above. A variety of modifications are possible. In addition, the number of these organic photoelectric conversion sections and inorganic photoelectric conversion sections or the proportion between them are not also limited. Color signals of a plurality of colors may be obtained with an organic photoelectric conversion section alone.

Further, in the embodiments or the like described above, the examples have been described in which a plurality of electrodes included in the lower electrode 21 includes the two electrodes of the readout electrode 21A and the accumulation electrode 21B. There may be, however, provided additionally three or four or more electrodes including a transfer electrode, a discharge electrode, or the like.

It is to be noted that the effects described herein are merely examples, but are not limitative. In addition, there may be other effects.

It is to be noted that the present technology may also have configurations as follows. According to the present technology having the following configurations, an organic layer is formed by using the compound represented by the general formula (1) described above. This makes it possible to increase the selectivity for a wavelength detected by the organic layer and increase the spectral characteristics.

[1]
An Imaging Element Including:
A First Electrode;
a second electrode that is disposed to be opposed to the first electrode; and
an organic layer that is provided between the first electrode and the second electrode, the organic layer including a compound represented by the following general formula (1):

[Chem. 1]

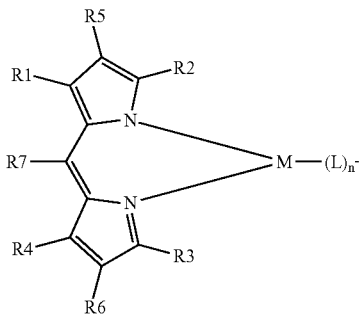

(1)

(where R1 and R4 each independently represent a hydrogen atom or a deuterium atom; R2 and R3 each independently represent an alkyl group, a cycloalkyl group, an alkoxy group, or an aryl ether group; R5 and R6 each independently represent a halogen atom, a hydrogen atom, or a alkyl group; R7 represents an aryl group, a heteroaryl group, or an alkenyl group; M represents boron or an m-valent metal atom and includes at least one of germanium, beryllium, magnesium, aluminum, chromium, iron, nickel, copper, zinc, or platinum; L represents a halogen atom, a hydrogen atom, an alkyl group, an aryl group, or a heteroaryl group; and n represents an integer greater than or equal to 1 and less than or equal to 6 and L's each independently represent a halogen atom, a hydrogen atom, an alkyl group, an aryl group, or a heteroaryl group in a case where n−1 is 2 or more.)

[2]
The imaging element according to [1], in which the organic layer detects a wavelength of a band of any of an infrared region and a visible region.

[3]
The imaging element according to [1] or [2], in which the organic layer detects a wavelength of any band of a red band, a green band, and a blue band.

[4]
The imaging element according to any one of [1] to [3], in which the organic layer detects a wavelength of a green band.

[5]
The imaging element according to any one of [1] to [4], in which the organic layer includes a photoelectric conversion layer, and the photoelectric conversion layer includes the compound represented by the general formula (1).

[6]
The imaging element according to [5], in which the photoelectric conversion layer includes two or more types of organic semiconductor materials.

[7]
The imaging element according to any one of [1] to [6], in which the compound represented by the general formula (1) includes an organic semiconductor material having electron acceptability.

[8]
The imaging element according to any one of [1] to [7], in which M of the compound represented by the general formula (1) represents boron and L represents a fluorine atom or a fluorine-containing aryl group.

[9]
The imaging element according to any one of [1] to [8], in which R7 of the compound represented by the general formula (1) represents an aryl group or a heteroaryl group.

[10]
The imaging element according to any one of [1] to [8], in which R7 of the compound represented by the general formula (1) represents a heteroaryl group and includes a fluorine atom.

[11]
The imaging element according to any one of [1] to [10], in which
the organic layer includes a plurality of layers, and
at least one layer of the plurality of layers includes the compound represented by the general formula (1).

[12]
An Imaging Device Including
pixels each including one or more organic photoelectric conversion sections, in which
the organic photoelectric conversion sections each include
a first electrode,
a second electrode that is disposed to be opposed to the first electrode, and
an organic layer that is provided between the first electrode and the second electrode, the organic layer including a compound represented by the following general formula (1):

[Chem. 2]

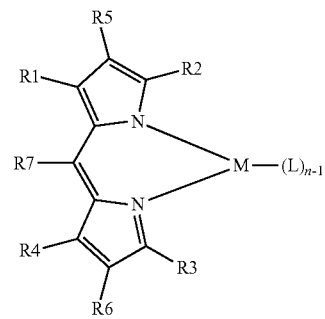

(1)

(where R1 and R4 each independently represent a hydrogen atom or a deuterium atom; R2 and R3 each independently represent an alkyl group, a cycloalkyl group, an alkoxy group, or an aryl ether group; R5 and R6 each independently represent a halogen atom, a hydrogen atom, or a alkyl group; R7 represents an aryl group, a heteroaryl group, or an alkenyl group; M represents boron or an m-valent metal atom and includes at least one of germanium, beryllium, magnesium, aluminum, chromium, iron, nickel, copper, zinc, or platinum; L represents a halogen atom, a hydrogen atom, an alkyl group, an aryl group, or a heteroaryl group; and n represents an integer greater than or equal to 1 and less than or equal to 6 and L's each independently represent a halogen atom, a hydrogen atom, an alkyl group, an aryl group, or a heteroaryl group in a case where n−1 is 2 or more.)

[13]

The imaging device according to [12], in which the one or more organic photoelectric conversion sections and one or more inorganic photoelectric conversion sections are stacked in each of the pixels, the one or more inorganic photoelectric conversion sections each performing photoelectric conversion in a wavelength band different from wavelength bands of the organic photoelectric conversion sections.

[14]

The imaging device according to [13], in which the organic photoelectric conversion section including an organic layer including the compound represented by the general formula (1) is provided at a position closer to incident light than the other organic photoelectric conversion section and the inorganic photoelectric conversion sections.

[15]

The imaging device according to [13] or [14], in which the one or more inorganic photoelectric conversion sections are formed to be buried in a semiconductor substrate, and the one or more organic photoelectric conversion sections are formed on a first surface side of the semiconductor substrate.

[16]

The imaging device according to [15], in which a multilayer wiring layer is formed on a second surface side of the semiconductor substrate.

[17]

The imaging device according to any one of [13] to [16], in which each of the organic photoelectric conversion sections performs photoelectric conversion in a green band, and an inorganic photoelectric conversion section that performs photoelectric conversion in a blue band and an inorganic photoelectric conversion section that performs photoelectric conversion in a red band are stacked in the semiconductor substrate.

[18]

The imaging device according to any one of [12] to [17], in which a plurality of the organic photoelectric conversion sections is stacked in each of the pixels, the plurality of the organic photoelectric conversion sections performing photoelectric conversion in respective wavelength ranges different from each other.

This application claims the priority on the basis of Japanese Patent Application No. 2019-139917 filed with Japan Patent Office on Jul. 30, 2019, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging element comprising:
   a first electrode;
   a second electrode that is disposed to be opposed to the first electrode; and
   an organic layer that is provided between the first electrode and the second electrode, the organic layer including a compound represented by a general formula (1) as follows:

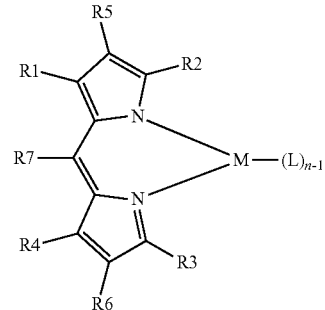

(1)

where R1 and R4 each independently represent a hydrogen atom or a deuterium atom; R2 and R3 each independently represent an alkyl group or an aryl group; R5 and R6 each independently represent a halogen atom, a hydrogen atom, or a alkyl group; R7 represents a fluorinated aryl group; M represents boron or an m-valent metal atom and includes at least one of germanium, beryllium, magnesium, aluminum, chromium, iron, nickel, copper, zinc, or platinum; L represents a halogen atom, a hydrogen atom, an alkyl group, an aryl group, or a heteroaryl group; and n represents an integer greater than or equal to 1 and less than or equal to 6 and each L independently represents a halogen atom, a hydrogen atom, an alkyl group, an aryl group, or a heteroaryl group in a case where n−1 is 2 or more.

2. The imaging element according to claim 1, wherein the organic layer detects a wavelength of a band of any of an infrared region and a visible region.

3. The imaging element according to claim 1, wherein the organic layer detects a wavelength of any band of a red band, a green band, and a blue band.

4. The imaging element according to claim 1, wherein the organic layer detects a wavelength of a green band.

5. The imaging element according to claim 1, wherein
   the organic layer includes a photoelectric conversion layer, and
   the photoelectric conversion layer includes the compound represented by the general formula (1).

6. The imaging element according to claim 5, wherein the photoelectric conversion layer includes two or more types of organic semiconductor materials.

7. The imaging element according to claim 1, wherein the compound represented by the general formula (1) includes an organic semiconductor material having electron acceptability.

8. The imaging element according to claim 1, wherein M of the compound represented by the general formula (1) represents boron and L represents a fluorine atom or a fluorine-containing aryl group.

9. The imaging element according to claim 1, wherein the organic layer includes a plurality of layers, and
   at least one layer of the plurality of layers includes the compound represented by the general formula (1).

10. The imaging element according to claim 1, wherein the compound represented by the general formula (1) is one of formulas (1-2), (1-3), (1-5) (1-6), (1-7), (1-12), (1-13), (1-14), (1-15), (1-17), (1-18), (1-19), (1-20), (1-21), (1-22), (1-23), (1-24), (1- 25), (1-26), and (1-27) as follows:

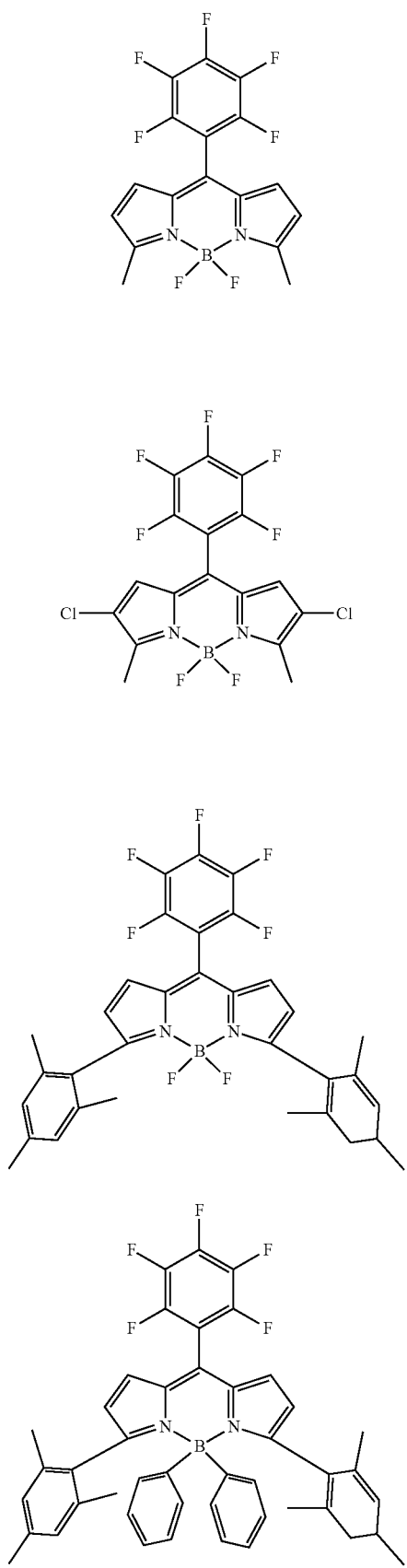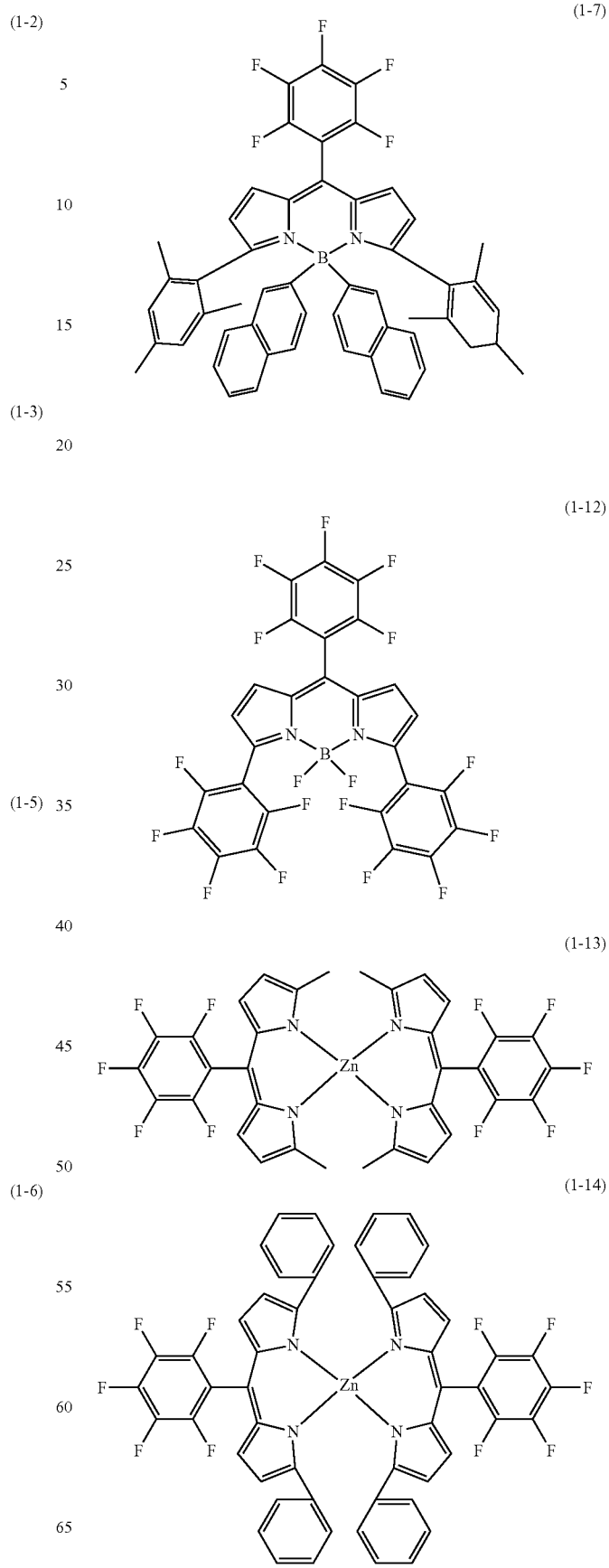

(1-15)
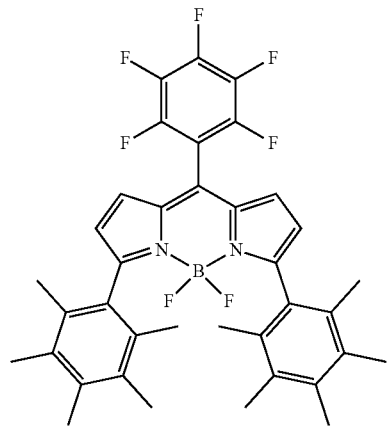
(1-17)
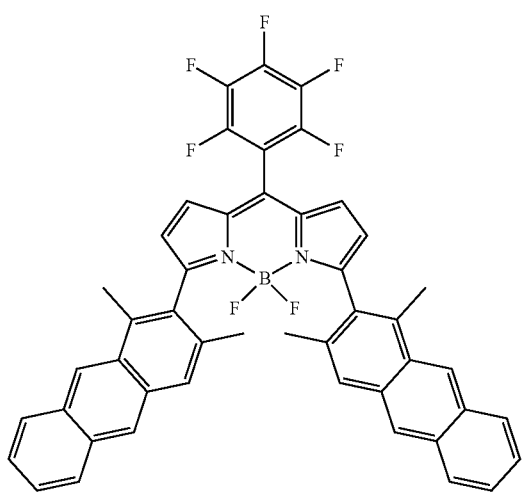
(1-18)
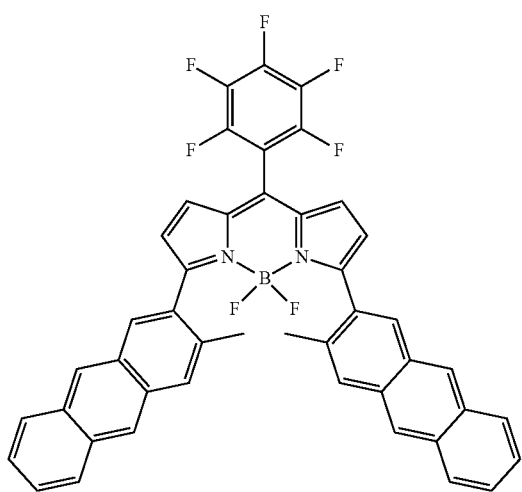
(1-19)
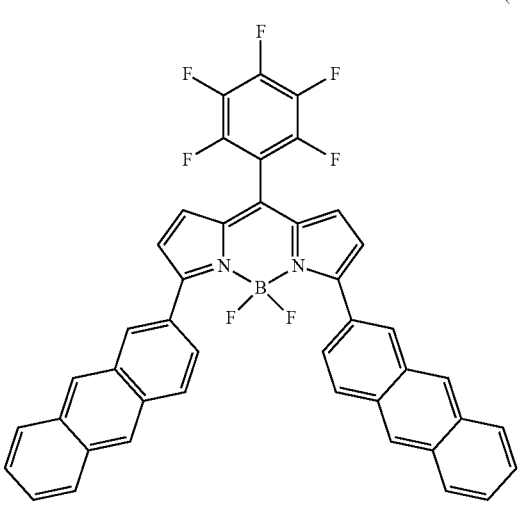
(1-20)
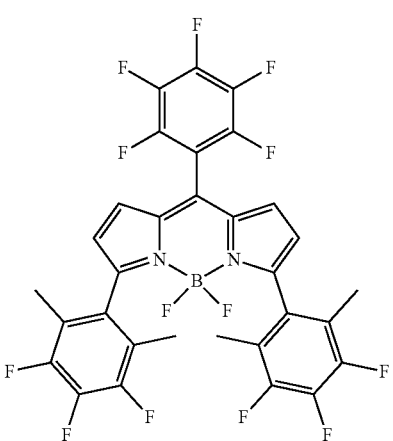
(1-21)
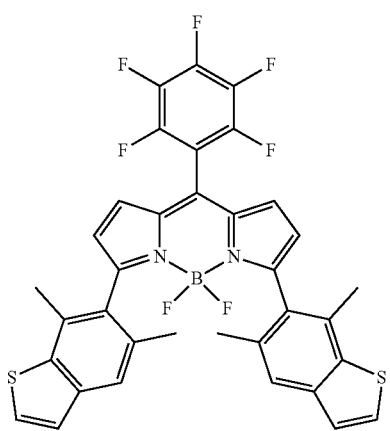

(1-22)

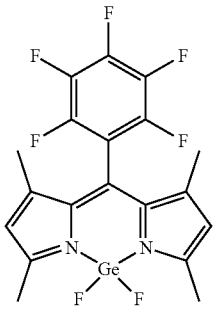

(1-23)

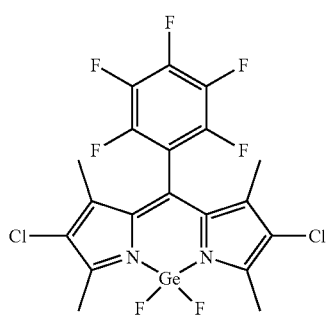

(1-24)

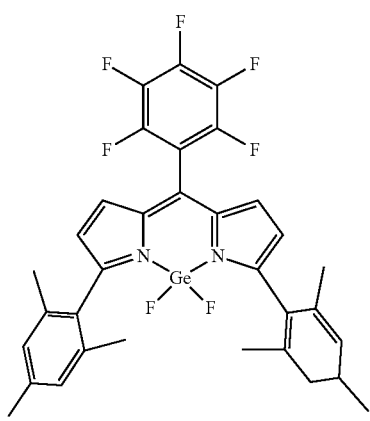

(1-25)

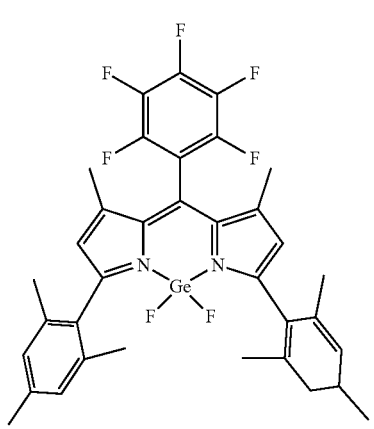

(1-26)

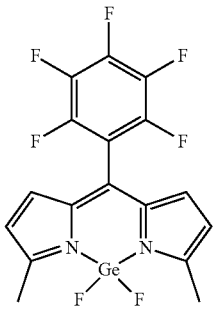

(1-27)

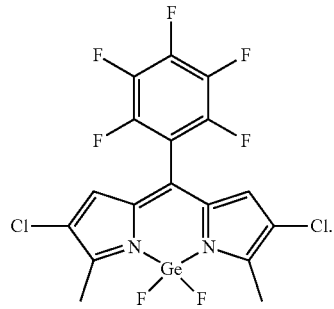

11. An imaging device comprising
pixels each including one or more organic photoelectric conversion sections, wherein
the organic photoelectric conversion sections each include an imaging element according to claim 1.

12. The imaging device according to claim 11, wherein the one or more organic photoelectric conversion sections and one or more inorganic photoelectric conversion sections are stacked in each of the pixels, the one or more inorganic photoelectric
conversion sections each performing photoelectric conversion in a wavelength band different from wavelength bands of the organic photoelectric conversion sections.

13. The imaging device according to claim 12, wherein a first organic photoelectric conversion section is provided at a position closer to incident light than another organic photoelectric conversion section and the inorganic photoelectric conversion sections.

14. The imaging device according to claim 12, wherein
the one or more inorganic photoelectric conversion sections are formed to be buried in a semiconductor substrate, and
the one or more organic photoelectric conversion sections are formed on a first surface side of the semiconductor substrate.

15. The imaging device according to claim 14, wherein a multilayer wiring layer is formed on a second surface side of the semiconductor substrate.

16. The imaging device according to claim 14, wherein
each of the organic photoelectric conversion sections performs photoelectric conversion in a green band, and
a first inorganic photoelectric conversion section that performs photoelectric conversion in a blue band and a second inorganic photoelectric conversion section that performs photoelectric conversion in a red band are stacked in the semiconductor substrate.

17. The imaging device according to claim 11, wherein a plurality of the organic photoelectric conversion sections are stacked in each of the pixels, the plurality of the organic photoelectric conversion sections performing photoelectric conversion in respective wavelength ranges different from each other.

\* \* \* \* \*